(12) United States Patent
Bok et al.

(10) Patent No.: US 11,849,612 B2
(45) Date of Patent: Dec. 19, 2023

(54) DISPLAY PANEL, DISPLAY DEVICE INCLUDING SAME, AND METHOD FOR MANUFACTURING DISPLAY DEVICE

(71) Applicant: Samsung Display Co., LTD., Yongin-si (KR)

(72) Inventors: Seung Lyong Bok, Hwaseong-si (KR); Sun Mi Yu, Seoul (KR); Seung Hwan Cho, Yongin-si (KR); Jong Hyun Choi, Seoul (KR); Young Seok Seo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 205 days.

(21) Appl. No.: 17/416,331

(22) PCT Filed: Nov. 15, 2019

(86) PCT No.: PCT/KR2019/015692
§ 371 (c)(1),
(2) Date: Jun. 18, 2021

(87) PCT Pub. No.: WO2020/130368
PCT Pub. Date: Jun. 25, 2020

(65) Prior Publication Data
US 2022/0069055 A1 Mar. 3, 2022

(30) Foreign Application Priority Data
Dec. 20, 2018 (KR) .................. 10-2018-0166280

(51) Int. Cl.
*H10K 59/131* (2023.01)
*H10K 50/80* (2023.01)
(Continued)

(52) U.S. Cl.
CPC ............ *H10K 59/131* (2023.02); *H10K 50/80* (2023.02); *H10K 59/121* (2023.02); *H10K 59/40* (2023.02); *H10K 71/00* (2023.02); *H10K 59/1201* (2023.02)

(58) Field of Classification Search
CPC .... H10K 59/131; H10K 50/80; H10K 59/121; H10K 59/40; H10K 71/00;
(Continued)

(56) References Cited

U.S. PATENT DOCUMENTS 9,430,180 B2  8/2016  Hirakata et al.
9,647,043 B2  5/2017  Hirataka et al.
(Continued)

FOREIGN PATENT DOCUMENTS

JP  2018005222  1/2018
KR  1020160082252  7/2016

OTHER PUBLICATIONS

Extended European Search Report—European Application No. 19901352.5 dated Aug. 10, 2022, citing references listed within.
(Continued)

*Primary Examiner* — Kyoung Lee
(74) *Attorney, Agent, or Firm* — CANTOR COLBURN LLP

(57) ABSTRACT

A display panel includes a first flat surface, a first side surface extending from a first side of the first flat surface, a second side surface extending from a second side of the first flat surface, a first extension surface extending from a first side of the first side surface, and a second extension surface extending from a first side of the second side surface. A first side of the first extension surface faces a third side of the first flat surface, and a first side of the second extension surface faces a fourth side of the first flat surface.

34 Claims, 65 Drawing Sheets

(51) Int. Cl.
  *H10K 59/40*   (2023.01)
  *H10K 59/121*  (2023.01)
  *H10K 71/00*   (2023.01)
  *H10K 59/12*       (2023.01)

(58) Field of Classification Search
  CPC .. H10K 59/1201; H10K 50/844; H10K 50/87; H10K 2102/311; H10K 59/87; H10K 59/00; H10K 50/00; H10K 2102/302; G06F 1/1637; G06F 2203/04102; G06F 1/1652; G06F 2203/04103; G06F 3/0412; G06F 3/041; G09F 9/302; G09F 9/335; G09F 9/30
  See application file for complete search history.

(56) References Cited

U.S. PATENT DOCUMENTS

| | | |
|---|---|---|
| 10,394,069 B2 | 8/2019 | Yamazaki et al. |
| 10,725,502 B2 | 7/2020 | Hirataka et al. |
| 11,003,009 B2 | 5/2021 | Yamazaki et al. |
| 11,281,420 B2 | 3/2022 | Hirataka et al. |
| 2017/0357113 A1* | 12/2017 | Yamazaki ............ G02B 5/3016 |
| 2018/0322826 A1 | 11/2018 | Lee et al. |
| 2021/0278713 A1 | 9/2021 | Yamazaki et al. |
| 2022/0197583 A1 | 6/2022 | Hirataka et al. |

OTHER PUBLICATIONS

International Search Report-PCT/KR2019/015692 dated Feb. 25, 2020.
Written Opinion—PCT/KR2019/015692 dated Feb. 25, 2020.

\* cited by examiner

FIG. 35
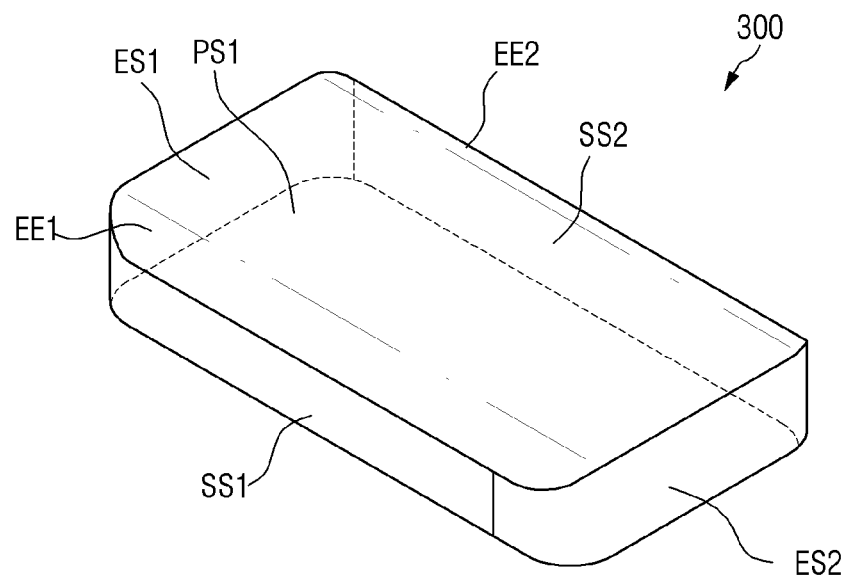
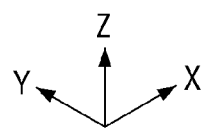

DISPLAY PANEL, DISPLAY DEVICE INCLUDING SAME, AND METHOD FOR MANUFACTURING DISPLAY DEVICE

This application is a national stage application of International Application No. PCT/KR2019/015692, filed on Nov. 15, 2019, which claims priority under 35 U.S.C. § 119 to Korean Application No. 10-2018-0166280, filed on Dec. 20, 2018, the content of which in their entirety is herein incorporated by reference.

1. Field

Embodiments of the invention relate to a display panel, a display device including the same, and a method for manufacturing the display device.

2. Description of the Related Art

Electronic devices such as smartphones, tablet personal computers ("PCs"), digital cameras, notebook computers, navigation systems and smart televisions that provide a s to users include a display device for displaying images.

As the display device, an organic light emitting display device, a micro light emitting diode ("LED") display device, a quantum dot light emitting display device, a liquid crystal display device, a plasma display device, a field emission display device, an electrophoretic display device, an electrowetting display device, or the like is used. Among them, the organic light emitting display device has advantages of a ide vie angle, an excellent contrast ratio, and a fast response speed. In addition, since the organic light emitting display device may be implemented as a flexible display device that may be bent or curved, a use of the organic light emitting display device in electronic devices is gradually increasing.

SUMMARY

Features of the invention provide a display panel which may display an image not only on a front surface but also on four side surfaces.

Features of the invention also provide a display device which may display an image not only on a front surface but also on four side surfaces.

Features of the invention also provide a method for manufacturing a display device which may display an image not only on a front surface but also on four side surfaces.

However, features of the invention are not restricted to the one set forth herein. The above and other features of the invention will become more apparent to one of ordinary skill in the art to which the invention pertains by referencing the detailed description of the invention given below.

An embodiment of the invention provides a display panel including a first flat surface, a first side surface extending from a first side of the first flat surface, a second side surface extending from a second side of the first flat surface, a first extension surface extending from a first side of the first side surface, and a second extension surface extending from a first side of the second side surface. A first side of the first extension surface faces a third side of the first flat surface, and a first side of the second extension surface faces a fourth side of the first flat surface.

In an embodiment, the first extension surface may include a second side parallel to the first side of the first extension surface and a third side connecting the first side and the second side of the first extension surface, and the second extension surface may include a second side parallel to the first side of the second extension surface and a third side connecting the first side and the second side of the second extension surface.

In an embodiment, the third side of the first extension surface may face a second side of the second side surface parallel to the first side of the second side surface, and the third side of the second extension surface may face a second side of the first side surface parallel to the first side of the first side surface.

In an embodiment, a length of the third side of the first extension surface may be smaller than a length of the first side of the first side surface.

In an embodiment, a gap may be defined between the first side of the first extension surface and the third side of the first flat surface.

In an embodiment, a length of the third side of the second extension surface may be smaller than a length of the first side of the second side surface.

In an embodiment, a gap may be defined between the first side of the second extension surface and the fourth side of the first flat surface.

In an embodiment, the first flat surface may include a first corner disposed between the first side and the third side of the first flat surface and a second corner disposed between the second side and the fourth side of the first flat surface.

In an embodiment, a compound curvature portion may be provided between the first side and the third side of the first flat surface.

In an embodiment, the compound curvature portion may include a first curvature portion in contact with the third side of the first flat surface and having a first curvature, and a second curvature portion disposed between the first side of the first flat surface and the first curvature portion and having a second curvature.

In an embodiment, the display panel may further include a first edge surface disposed between the first flat surface and the first side surface, and a second edge surface disposed between the first flat surface and the second side surface.

In an embodiment, a length of the third side of the first extension surface may be identical to that of the first side of the first side surface, and a length of the third side of the second extension surface may be identical to that of the first side of the second side surface.

In an embodiment, a hole may be defined in any one of the first flat surface, the first side surface, the second side surface, the first extension surface, and the second extension surface.

In an embodiment, the first side surface may include a second side parallel to the first side of the first side surface and a third side parallel to the first side of the first flat surface, and the display panel further includes display pads disposed adjacent to the third side of the first side surface.

In an embodiment, the display panel may further include data lines and a scan control line connected to the display pads, and a scan driver connected to the scan control line and disposed adjacent to the fourth side of the first flat surface and the second side of the first side surface.

In an embodiment, the data lines may include first data lines disposed on the first flat surface, the first side surface, and the second side surface, second data lines disposed on the first side surface and the first extension surface, and third data lines disposed on the first flat surface, the first side surface, the second side surface, and the second extension surface.

In an embodiment, the display panel may further include a plurality of scan lines connected to the scan driver, and the plurality of scan lines may include first scan lines disposed on the first flat surface, second scan lines disposed on the first side surface and the first extension surface, and third scan lines disposed on the second side surface and the second extension surface.

In an embodiment, the display panel may include pixels disposed on the first flat surface, the first side surface, the second side surface, the first extension surface, and the second extension surface.

In an embodiment, a number of pixels per inch of the first flat surface may be greater than a number of pixels per inch of the first extension surface and a number of pixels per inch of the second extension surface.

In an embodiment, a number of pixels per inch of the first flat surface may be equal to a number of pixels per inch of the first side surface and a number of pixels per inch of the second side surface.

In an embodiment, the display panel further may include a third extension surface extending from the second side of the first side surface parallel to the first side of the first side surface and including a first side corresponding to the second side of the first side surface, and a fourth extension surface extending from the second side of the second side surface parallel to the first side of the second side surface and including a first side corresponding to the second side of the second side surface.

In an embodiment, the third extension surface may further include a second side parallel to the first side of the third extension surface and a third side connecting the first side and the second side of the first extension surface, and the fourth extension surface may further include a second side parallel to the first side of the fourth extension surface and a third side connecting the first side and the second side of the fourth extension surface.

In an embodiment, the third side of the third extension surface may face the third side of the second extension surface, and the third side of the fourth extension surface may face the third side of the first extension surface.

In an embodiment, a length of the third side of the third extension surface may be the same as the length of the third side of the second extension surface, and a length of the third side of the fourth extension surface may be the same as the length of the third side of the first extension surface.

In an embodiment, a sum of a length of the first side of the second extension surface and a length of the first side of the third extension surface may be the same as a length of the fourth side of the first flat surface.

In an embodiment, a sum of a length of the first side of the first extension surface and a length of the first side of the fourth extension surface may be the same as a length of the third side of the first flat surface.

An embodiment of the invention provides a display device including a display panel including a first flat surface, a first side surface extending from a first side of the first flat surface, a second side surface extending from a second side of the first flat surface, a first extension surface extending from a first side of the first side surface, and a second extension surface extending from a first side of the second side surface, and a guide member disposed under the first flat surface, the first side surface, the second side surface, the first extension surface, and the second extension surface of the display panel. A first side of the first extension surface faces a third side of the first flat surface, and a first side of the second extension surface faces a fourth side of the first flat surface.

In an embodiment, the display device may further include a cover window disposed on the first flat surface, the first side surface, the second side surface, the first extension surface, and the second extension surface of the display panel.

In an embodiment, the first extension surface may include a second side parallel to the first side of the first extension surface and a third side connecting the first side and the second side of the first extension surface, and the third side of the first extension surface may face a second side of the second side surface parallel to the first side of the second side surface.

In an embodiment, the cover window may include a light blocking layer overlapping an area in which the third side of the first extension surface faces the first side of the second side surface.

In an embodiment, the display device may further include a touch sensing device disposed on the first flat surface, the first side surface, the second side surface, the first extension surface, and the second extension surface of the display panel.

An embodiment of the invention provides a display panel including a first flat surface, a first side surface extending from a first side of the first flat surface, a second side surface extending from a second side of the first flat surface, a third side surface extending from a third side of the first flat surface, a fourth side surface extending from a fourth side of the first flat surface, and a first corner surface extending from a first side of the third side surface. A first side of the first corner surface faces a first corner between the first side and the third side of the first flat surface.

In an embodiment, the first corner surface may include a second side parallel to the first side of the first corner surface and a third side connecting the first side and the second side of the first corner surface, and the third side of the first corner surface faces a first side of the first side surface.

An embodiment of the invention provides a method for manufacturing a display device, and the method includes placing a first flat surface of a display panel on a first flat surface of a guide member, placing a first side surface of the display panel on a first side surface of the guide member by bending the first side surface of the display panel from a first side of the first flat surface of the display panel, placing a second side surface of the display panel on a second side surface of the guide member by bending the second side surface of the display panel from a second side of the first flat surface, placing a display circuit board under the first side surface of the display panel and the first side surface of the guide member by bending the display circuit board, placing a first extension part of the display panel on a third side surface of the guide member by bending the first extension part of the display panel from a first side of the first side surface, and placing a second extension part of the display panel on a fourth side surface of the guide member by bending the second extension part of the display panel from a first side of the second side surface.

In a display panel, a display device including the same, and a method for manufacturing the display device in an embodiment, the display panel may include a first flat surface, a first side surface, a second side surface, a first extension surface, and a second extension surface. Therefore, the display panel has pixels disposed not only on the first flat surface but also on the first side surface, the second side surface, the first extension surface, and the second extension surface. Accordingly, an image may be displayed not only the first flat surface, but also on the first side surface, the second side surface, the first extension surface, and the second extension surface. That is, the display panel may display an image on its upper (or front) and side surfaces.

In a display panel, a display device including the same, and a method for manufacturing the display device in an embodiment, a hole may be defined in any one surface or a plurality of surfaces among a first flat surface, a first side surface, a second side surface, a first extension surface and a second extension surface of the display panel, and a charging terminal or an earphone terminal of the display device may be exposed through the hole, or a speaker hole of the display device may be used as at least one hole.

In a display panel, a display device including the same, and a method for manufacturing the display device in an embodiment, a length of a third side of a first extension part may be smaller than a length of a first side of a first side surface. Therefore, stress applied to the first side of the first side surface by a bending force of the first extension surface may be reduced. In addition, the first extension surface and a second extension surface nay be more easily bent in a first direction.

In a display panel and a display device including the same in an embodiment, a compound curvature portion may be formed or provided between a first side and a third side of a first flat surface. Stress applied to a first contact point between the first side and the third side of the first flat surface by a bending force of a first extension surface may be reduced. In addition, the first extension surface and a second extension surface may be more easily bent in a first direction.

In a display panel, a display device including the same, and a method for manufacturing the display device in an embodiment, an angle at which a first extension surface is bent from a first side of a first side surface may be reduced by a first edge surface between a first flat surface and the first side surface. Therefore, stress applied to the first side of the first side surface by a bending force of the first extension surface may be reduced.

In a display panel, a display device including the same, and a method for manufacturing the display device in an embodiment, the display panel may include a first flat surface, a second flat surface, a first side surface, a second side surface, a first extension surface, and a second extension surface. Therefore, the display panel has pixels disposed not only on the first flat surface but also on the second flat surface, the first side surface, the second side surface, the first extension surface, and the second extension surface. Accordingly, an image may be displayed not only the first flat surface, but also on the second flat surface, the first side surface, the second side surface, the first extension surface, and the second extension surface. That is, the display panel may display an image on all surfaces.

In a display panel, a display device including the same, and a method for manufacturing the display device in an embodiment, a first side surface, a second side surface, a first extension surface, and a second extension surface of the display panel may be easily bent using a guide member.

However, the effects of the invention are not limited to the aforementioned effects, and various other effects are included in the specification.

BRIEF DESCRIPTION OF DRAWINGS

The above and other exemplary embodiments, advantages and features of this disclosure will become more apparent by describing in further detail exemplary embodiments thereof with reference to the accompanying drawings, in which:

FIGS. 35 through 41 are a perspective view, a plan view, a bottom view, a front view, a rear view, a left side view, and a right side view of the display panel of FIG. 34.

DETAILED DESCRIPTION

Figure 1:
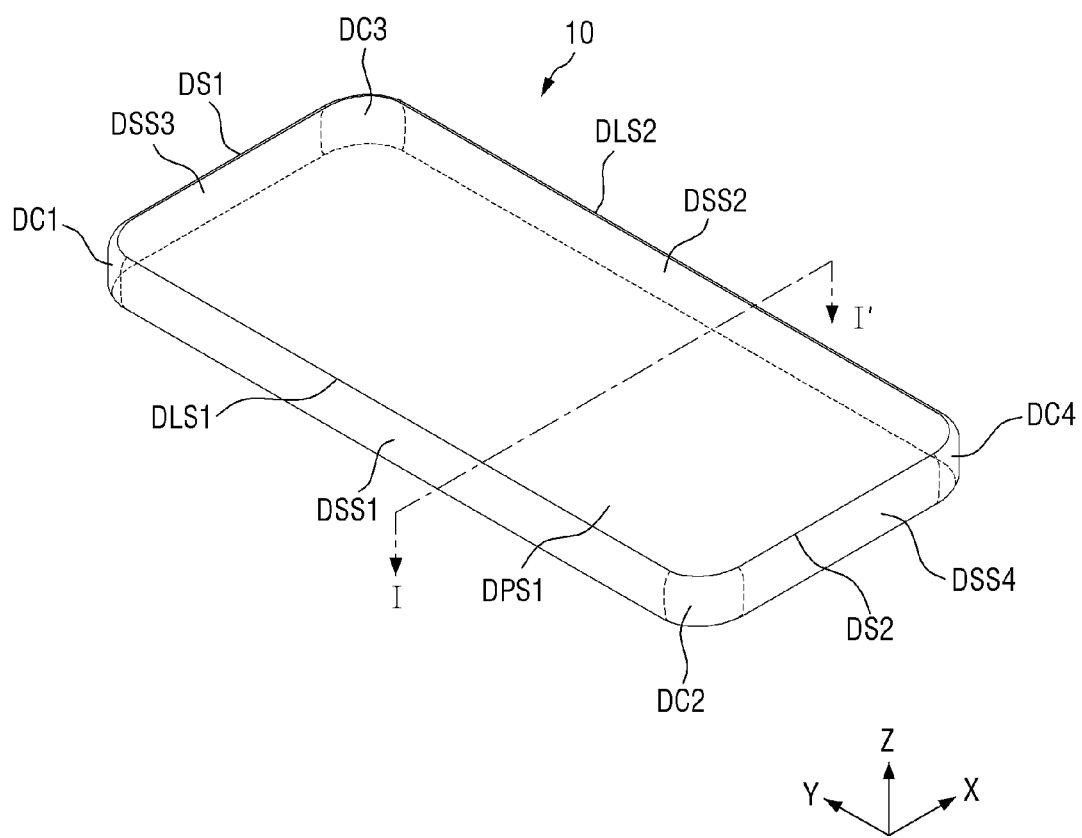
FIG. 1 is a perspective view of a display device.

Advantages and features of the invention, and a method of achieving them will become apparent with reference to the embodiments described below in detail together with the accompanying drawings. However, the invention is not limited to the embodiments disclosed below, but will be implemented in various forms different from each other, and only these embodiments make the disclosure of the invention complete, and common knowledge in the technical field to which the invention pertains. It is provided to fully inform the scope of the invention to those who have it, and the invention is only defined by the scope of the claims.

When elements or layers are referred to as "on" of another element or layer includes all cases of interposing another layer or another element directly on or in the middle of another element. The same reference numerals refer to the same elements throughout the specification. The shapes, sizes, ratios, angles, numbers, etc. disclosed in the drawings for explaining the embodiments are exemplary, and the invention is not limited to the illustrated matters.

Although the first, second, and the like are used to describe various components, it goes without saying that these components are not limited by these terms. These terms are only used to distinguish one component from another component. Therefore, it goes without saying that the first component mentioned below may be the second component within the technical idea of the invention.

Each of the features of the various embodiments of the invention can be partially or entirely combined or combined with each other, technically various interlocking and driving are possible, and each of the embodiments can be implemented independently of each other or can be implemented together in an association relationship.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary, skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, predetermined embodiments will be described with reference to the accompanying drawings.

Figure 2:
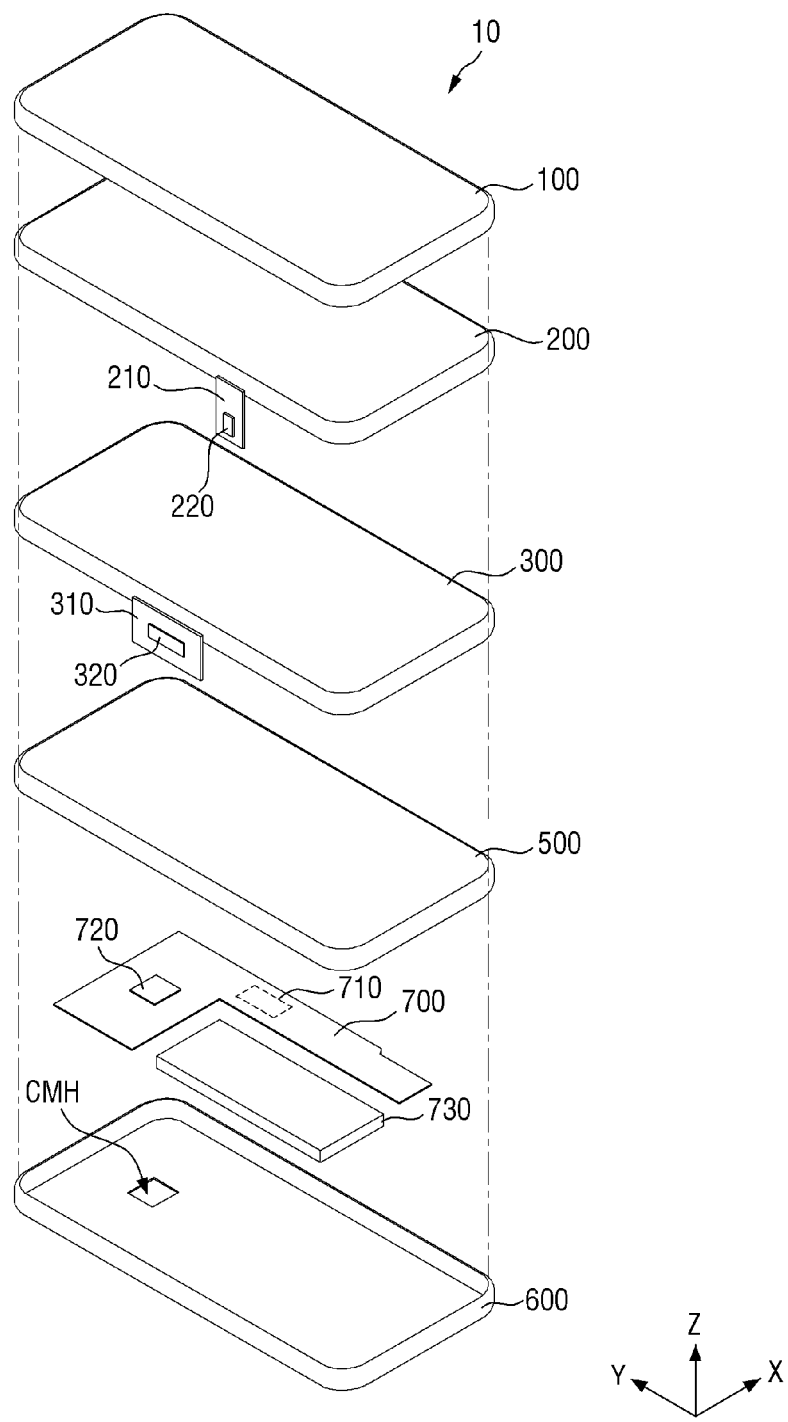
FIG. 2 is an exploded perspective view of the display device.
Figure 3:
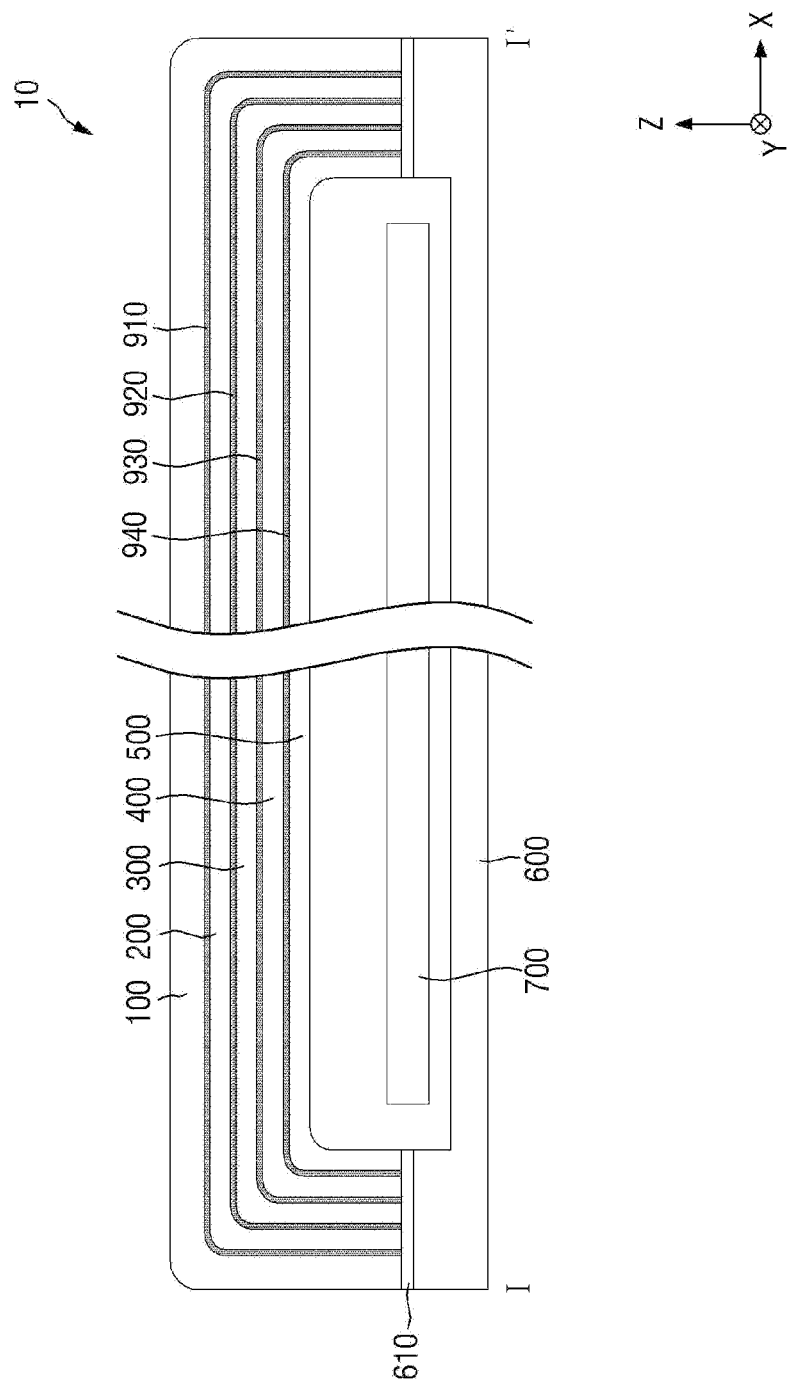
FIG. 3 is a cross-sectional view illustrating an embodiment of the display device along line I-I' of FIG. 1.

FIG. 1 is a perspective view of an embodiment of a display device. FIG. 2 is an exploded perspective view of an embodiment of the display device. FIG. 3 is a cross-sectional view illustrating an embodiment of the display device along line I-I' of FIG. 1.

Referring to FIGS. 1 through 3, the display device 10 in the embodiment is a device for displaying moving images or still images. The display device 10 may be used as a display screen in portable electronic devices such as mobile phones, smartphones, tablet personal computers ("PCs"), smart watches, watch phones, mobile communication terminals, electronic notebooks, electronic books, portable multimedia players ("PMPs"), navigation devices and ultra-mobile PCs ("UMPCs"), as well as in various products such as televisions, notebook computers, monitors, billboards and the Internet of things ("IoT").

Figure 52:
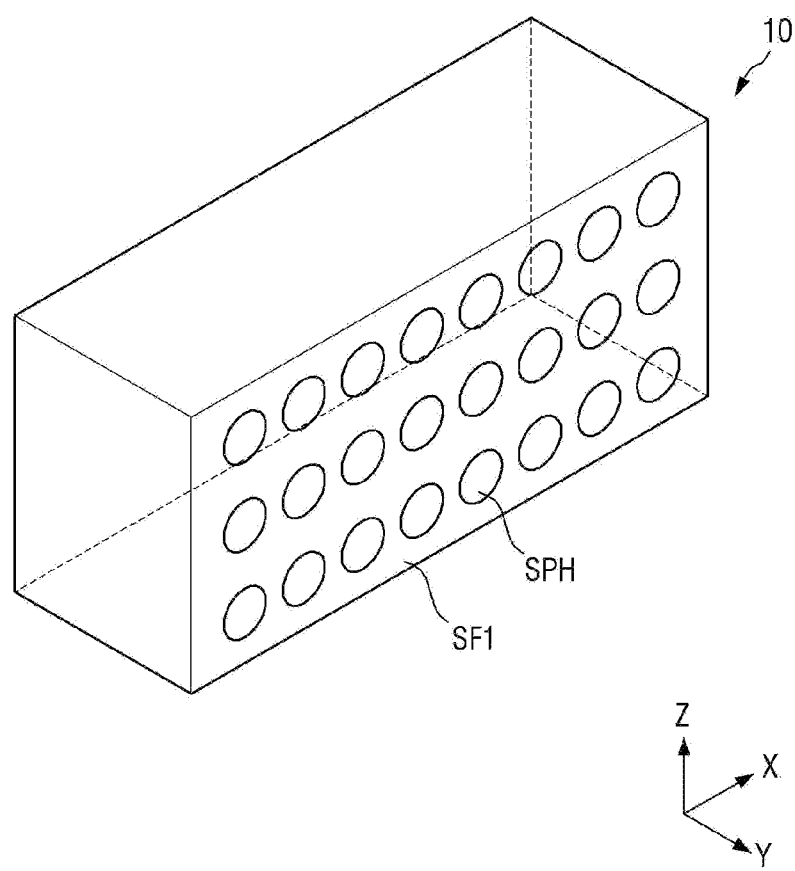
FIG. 52 is a perspective view of an embodiment of a display device.

For example, the display device 10 in the embodiment may be used as a displayable speaker including a surface SF1 in which speaker holes SPH are defined as illustrated in FIG. 52 and displaying an image on the other surfaces. Although the speaker holes SPH are defined only in the surface SF1 in FIG. the invention is not limited thereto. The speaker holes SPH may also be defined in a plurality of surfaces of the display device 10. In addition, the speaker holes SPH may be defined substantially in an entirety of the surface SF1 of the display device 10 as illustrated in FIG. 52 or may be defined only in a part of the surface SF1.

As illustrated in FIGS. 1 through 3, the display device 10 in the embodiment may include a cover window 100, a touch sensing device 200, a touch circuit board 210, a touch driver 220, a display panel 300, a display circuit board 310, a display driver 320, a panel guide member 500, a bottom frame 600, a main circuit board 700, and a bottom frame 600.

In the specification, "above," "top," and "upper surface" refer to a direction in which the cover window 100 is disposed with respect to the display panel 300, that is, a Z-axis direction, and "under," "bottom," and "lower surface" refer to a direction in which the panel guide member 500 is disposed with respect to the display panel 300, that is, a direction opposite to the Z-axis direction. In addition, "left," "right," "upper," and "lower" refer to directions when the display panel 300 is seen in a plan view. In an embodiment, "left" refers to a direction opposite to an X-axis direction, "right" refers to the X-axis direction, "upper" refers to a Y-axis direction, and "lower" refers to a direction opposite to the Y-axis direction, for example.

The display device 10 may display an image on an upper surface DPS1, a left side surface DSS1, a right side surface DSS2, an upper side surface DSS3, and a lower side surface DSS4. The left side surface DSS1 of the display device 10 may extend from a first long side DLS1 of the upper surface MPS1, the right side surface DSS2 may extend from a second long side DLS2 of the upper surface DPS1, the upper side surface DSS3 may extend from a first short side DS1 of the upper surface DPS1, and the lower side surface DSS4 may extend from a second short side DS2 of the upper surface DPS1. The first short side DS1 and the second short side DS2 may extend in a first direction (X-axis direction), and the first long side DLS1 and the second long side DLS2 may extend in a second direction (Y-axis direction) intersecting the first direction (X-axis direction).

The upper surface DPS1, the left side surface DSS1, the right side surface DSS2, the upper side surface DSS3, and the lower side surface DSS4 are quadrangular (e.g., rectangular) when seen in a plan view or a side view, but the invention is not limited thereto. The upper surface DPS1, the left side surface DSS1, the right side surface DSS2, the upper side surface DSS3, and the lower side surface DSS4 may also be formed or provided in other polygonal shapes or in a circular or elliptical shape when seen in a plan view or a side view.

A first corner surface DC1 between the left side surface DSS1 and the upper side surface DSS3, a second corner surface DC2 between the left side surface DSS1 and the lower side surface DSS4, a third corner surface DC3 between the right side surface DSS2 and the upper side surface DSS3, and a fourth corner surface DC4 between the right side surface DSS2 and the lower side surface DSS4 may be rounded with a predetermined curvature or may be right-angled when seen in a plan view. In addition, the left side surface DSS1, the second side surface DSS1, the upper side surface DSS3, and the lower side surface DSS4 are bent vertically from the upper surface DPS1 in FIG. 1, but the invention is not limited thereto.

The cover window 100 may be disposed on upper and side surfaces of the display panel 300 to cover the upper and side surfaces of the display panel 300. Therefore, the cover window 100 may function to protect the upper and side surfaces of the display panel 300. The cover window 100 may be attached to the touch sensing device 200 through a first adhesive member 910 as illustrated in FIG. 3. The first adhesive member 910 may be an optically cleared adhesive film ("OCA") or an optically cleared resin ("OCR").

The cover window 100 may include glass, sapphire, and/or plastic. The cover window 100 may be rigid or flexible. The cover window 100 may include a light transmitting part corresponding to a display area of the display panel 300 and a light blocking part corresponding to a non-display area of the display panel 300. The light blocking part may include an opaque material such as black dye. In addition, a pattern that may be shown to a user when an image is not displayed may be formed or provided on an upper surface of the light blocking part. In an embodiment, a company's logo such as "SAMSUNG" or various characters may be formed on or defined in the upper surface of the light blocking part, for example.

The touch sensing device 200 may be disposed between the cover window 100 and the display panel 300. The touch sensing device 200 may be disposed on the upper and side surfaces of the display panel 300. Therefore, a user's touch may be sensed on the upper surface DPS1, the left side surface DSS1, the right side surface DSS2, the upper side surface DSS3, and the lower side surface DSS4 of the display device 10.

The touch sensing device 200 may be attached to a lower surface of the cover window 100 through the first adhesive member 910 as illustrated in FIG. 3. A polarizing film for preventing a reduction in visibility due to reflection of external light may be added between the cover window 100 and the touch sensing device 200. In this case, the touch sensing device 200 may be attached to a lower surface of the polarizing film, and the polarizing film may be attached to the lower surface of the cover window 100 through the first adhesive member 910.

The touch sensing device 200 is a device for sensing a user's touch position and may be implemented as a capacitance type such as a self-capacitance type or a mutual capacitance type. The touch sensing device 200 may include only touch driving electrodes when implemented as the self-capacitance type but may include touch driving electrodes and touch sensing electrodes when implemented as the mutual capacitance type. A case where the touch sensing device 200 is implemented as the mutual capacitance type will be mainly described below.

The touch sensing device 200 may include a separate substrate and touch driving electrodes disposed on the separate substrate. In this case, the touch sensing device 200 may be attached onto a thin-film encapsulation layer of the display panel 300 through a second adhesive member 920 as illustrated in FIG. 3. The second adhesive member 920 may be an OCA or an OCR. In an alternative embodiment, the touch sensing device 200 may be unitary with the display panel 300. In this case, the touch driving electrodes and touch sensing electrodes of the touch sensing device 200 may be formed or disposed on the thin-film encapsulation layer of the display panel 300.

The touch circuit board 210 may be attached to a side of the touch sensing device 200. Specifically, a side of the touch circuit board 210 may be attached onto pads provided on a side of the touch sensing device 200 by an anisotropic conductive film. In addition, a touch connection part may be provided on the other side of the touch circuit board 210 and may be connected to a touch connector of the display circuit board 310. The touch circuit board may be a flexible printed circuit board.

The touch driver 220 may transmit touch driving signals to the touch driving electrodes of the touch sensing device 200, detect sensing signals from the touch sensing electrodes of the touch sensing device 200, and calculate a user's touch position by analyzing the sensing signals. The touch driver 220 may be formed or provided as an integrated circuit ("IC") and disposed (e.g., mounted) on the touch circuit hoard 210.

The display panel 300 may be disposed under the touch sensing device 200. The display panel 300 may be attached to a lower surface of the touch sensing device 200 through the second adhesive member 920 as illustrated in FIG. 3.

Figure 14:
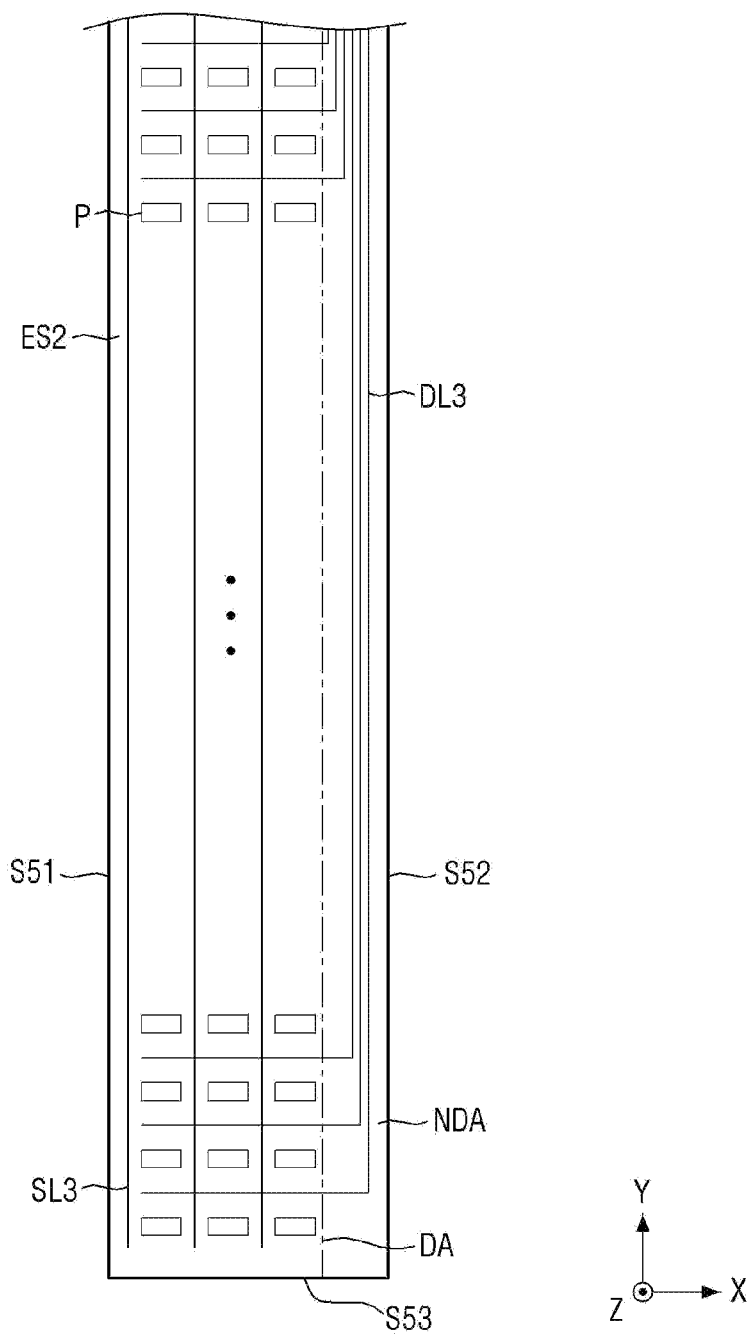
FIG. 14 is a plan view illustrating an embodiment of a second extension surface of FIG. 4 in detail.

The display panel 300 may be a light emitting display panel including light emitting elements. In an embodiment, the display panel 300 may be an organic light emitting display panel using organic light emitting diodes as light emitting elements, a micro light emitting diode ("LED") display panel using micro LEDs as light emitting elements, a quantum dot organic light emitting display panel using quantum dots and organic light emitting diodes, or an inorganic light emitting display panel using inorganic semiconductors as light emitting elements, for example, A case where the display panel 300 is an organic light emitting display panel as illustrated in FIG. 14 will be mainly described below.

The display panel 300 may include a substrate, a thin-film transistor ("TFT") layer disposed on the substrate, a light emitting element layer, and a thin-film encapsulation layer.

Since the display panel 300 is implemented to be flexible, it may include plastic. In this case, the substrate may include a flexible substrate and a support substrate. Since the support substrate is designed to support the flexible substrate, it may have less flexibility than that of the flexible substrate. Each of the flexible substrate and the support substrate may include a polymer material having flexibility.

The TFT layer is disposed on the substrate. The TFT layer may include scan lines, data lines, and TFTs. Each of the TFTs includes a gate electrode, a semiconductor layer, and source and drain electrodes. When a scan driver is directly formed or disposed on the substrate, it may be formed or provided together with the TFT layer.

The light-emitting element layer is disposed on the TFT layer. The light-emitting element layer includes anodes, a light emitting layer, a cathode, and banks. The light emitting layer may include an organic light emitting layer including an organic material. In an embodiment, the light emitting layer may include a hole injection layer, a hole transporting layer, an organic light emitting layer, an electron transporting layer, and an electrode injection layer, for example. In an alternative embodiment, the hole injection layer and the electrode injection layer may be omitted. When a voltage is applied to the anode and the cathode, holes and electrons move to the organic light emitting layer respectively through the hole transporting layer and the electron transporting layer and combine together in the organic light emitting layer to emit light. The light emitting element layer may be a pixel array layer in which pixels are formed or provided. Therefore, an area in which the light emitting element layer is formed or provided may be defined as the display area displaying an image. An area around the display area may be defined as the non-display area.

The thin-film encapsulation layer is disposed on the light emitting element layer. The thin-film encapsulation layer prevents oxygen or moisture from penetrating into the light emitting element layer. The thin-film encapsulation layer may include at least one inorganic layer and at least one organic layer.

The display circuit board 310 may be attached to any one of the side surfaces of the display panel 300, Specifically, a side of the display circuit board. 310 may be attached onto pads provided on any one of the side surfaces of the display panel 300 by an anisotropic conductive film. The display circuit board 310 may be bent under the display panel 300. The touch circuit board 210 may also be bent under the display panel 300. Accordingly, the touch circuit board 210 may overlap the display circuit board 310. Therefore, the touch connection part disposed at an end of the touch circuit board 210 may be connected to the touch connector of the display circuit board 310.

The display driver 320 outputs signals and voltages for driving the display panel 300 through the display circuit board 310, The display driver 320 may be formed or provided as an IC and disposed (e.g., mounted) on the display circuit board 310.

Figure 12:
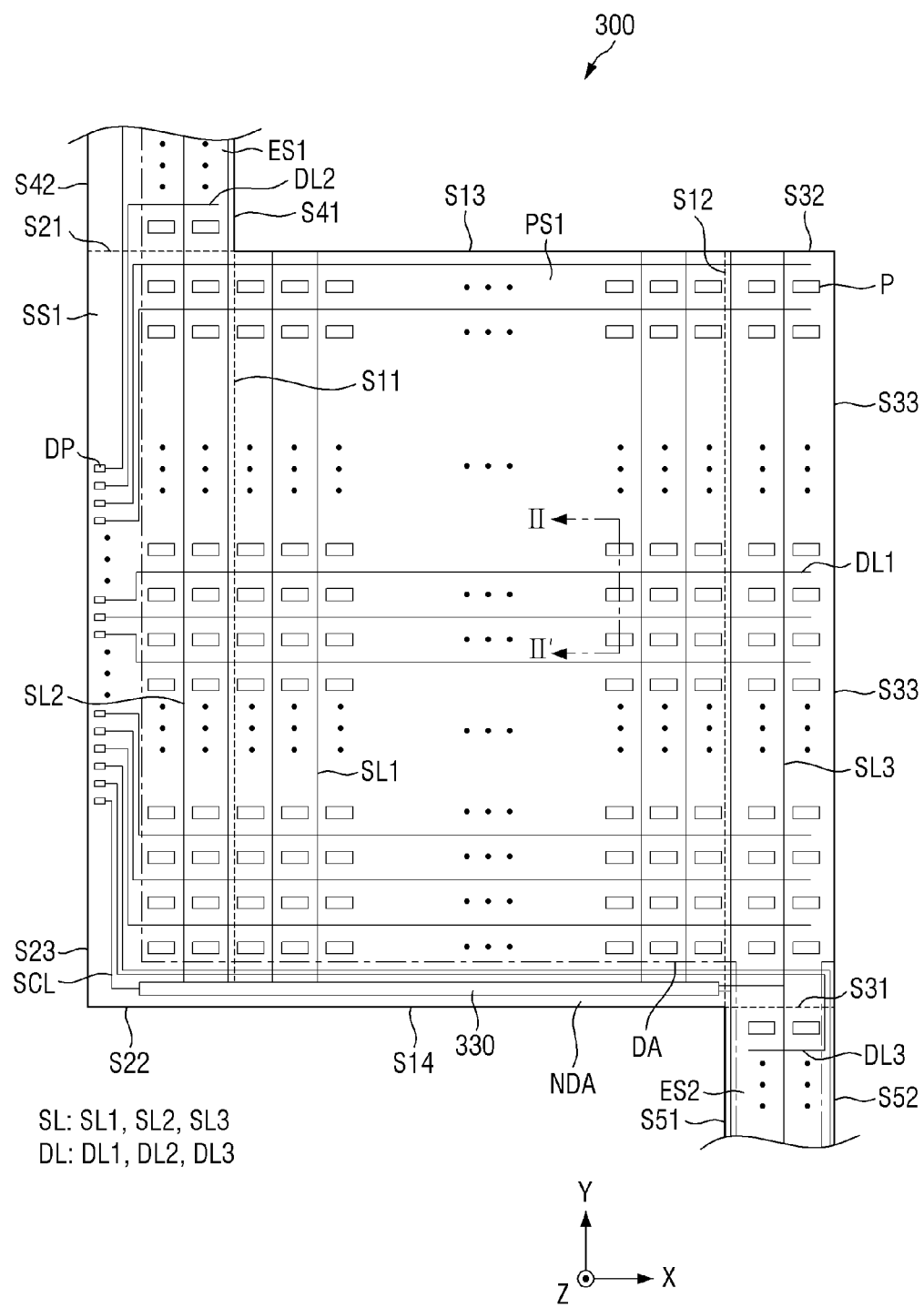
FIG. 12 is a plan view illustrating an embodiment of a first flat surface, a first side surface and a second side surface of FIG. 4 in detail.

An under-panel member 400 may be disposed under the display panel 300 as illustrated in FIG. 12, The under-panel member 400 may be attached to a lower surface of the display panel 300 through a third adhesive member 930. The third adhesive member 930 may be an OCA, an OCR, or a pressure sensitive adhesive ("PSA").

The under-panel member 400 may include at least one of a light absorbing member for absorbing light incident from the outside, a buffer member for absorbing external impact, a heat dissipating member for efficiently dissipating the heat of the display panel 300, and a light blocking layer for blocking light incident from the outside.

The light absorbing member may be disposed under the display panel 300. The light absorbing member blocks transmission of light to prevent elements disposed under the light absorbing member from being seen from above the display panel 300. The light absorbing member may include a light absorbing material such as a black pigment or dye.

The buffer member may be disposed under the light absorbing member. The buffer member absorbs external impact to prevent the display panel 300 from being damaged. The buffer member may consist of a single layer or a plurality of layers. In an embodiment, the buffer member may include polymer resin such as polyurethane, poly carbonate, polypropylene or polyethylene or may include an elastic material such as sponge formed or provided by foaming rubber, a urethane-based material or an acrylic-based material. The buffer member may be a cushion layer.

The heat dissipating member may be disposed under the buffer member. The heat dissipating member may include a first heat dissipating layer including graphite or carbon nanotubes and a second heat dissipating layer including a metal thin film (such as copper, nickel, ferrite or silver) capable of shielding electromagnetic waves and having high thermal conductivity.

The panel guide member 500 for bending and fixing the side surfaces of the display panel 300 may be disposed under the under-panel member 400. The panel guide member 500 may be disposed under the lower and side surfaces of the display panel 300.

The panel guide member 500 may include rigid plastic to support the display panel 300. In an embodiment, the panel guide member 500 may include plastic such as polycarbonate, for example. The panel guide member 500 may be attached to the lower surface of the display panel 300 through a fourth adhesive member 940 as illustrated in FIG. 3. The fourth adhesive member 940 may be an OCA, an OCR, or a PSA.

Since each of the cover window 100, the touch sensing device 200, the display panel 300, the under-panel member 400, and the panel guide member 500 does not include a lower surface extending from side surfaces as illustrated in FIG. 3, a space may be defined between the panel guide member 500 and the bottom frame 600. The main circuit board 700 and a battery 730 may be disposed in the space between the panel guide member 500 and the bottom frame 600.

The main circuit board 700 may be a printed circuit board or a flexible printed circuit board. The main circuit board 700 may include a main processor 710 and a camera device 720. The main processor 710 may be disposed on a lower surface of the main circuit board 700 which faces the bottom cover 900. In addition, the camera device 720 may be disposed on both upper and lower surfaces of the main circuit board 700.

The main processor 710 may control all functions of the display device 10. In an embodiment, the main processor 710 may output image data to the display driver 320 of the display circuit board 310 so that the display panel 300 may display an image, for example. In addition, the main processor 710 may receive touch data from the touch driver 220, determine a user's touch position, and then execute an application indicated by an icon displayed at the user's touch position. In addition, the main processor 710 may receive pressure sensing data from the touch driver 220 or a pressure sensing unit and execute an application indicated by an icon displayed at a user's pressure position according to the pressure sensing data. In addition, the main processor 710 may be controlled to implement haptic feedback by vibrating a vibration generating device according to the pressure sensing data. The main processor 710 may be an application processor central processing unit, or a system chip formed or provided as an IC.

The camera device 720 processes an image frame such as a still image or a moving image obtained by an image sensor in a camera mode and outputs the processed image frame to the main processor 710. The battery 730 provides power desired for the display device 10.

In addition, the main circuit board 700 may be further equipped with a mobile communication module capable of transmitting or receiving a wireless signal to or from at least one of a base station, an external terminal, and a server over a mobile communication network. The wireless signal may include a voice signal, a video call signal, or various types of data according to transmission/reception of text/multimedia messages. In addition, a sound output device such as a speaker capable of outputting sound may be further disposed (e.g., mounted) on the main circuit hoard 700.

The bottom cover 900 may be disposed under the panel guide member 500. The bottom cover 900 may include plastic, metal, or both plastic and metal. The bottom cover 900 may form the bottom exterior of the display device 10.

A waterproof member 610 may be disposed on edges of the bottom frame 600. The waterproof member 610 may bond the side surfaces of the display panel 300 to an upper surface of the bottom frame 600, Therefore, in the embodiment illustrated in FIGS. 2 and 3, the waterproof member 610 may prevent moisture or dust from penetrating between the display panel 300 and the bottom frame 600. That is, a waterproof and dustproof display device 10 may be provided.

A camera hole CMH into which the camera device 720 is inserted to protrude to the outside may be defined in the bottom cover 900. The position of the camera device 720 and the position of the camera hole CMH corresponding to the camera device 720 are not limited to the embodiment illustrated in FIG. 2.

Figure 4:
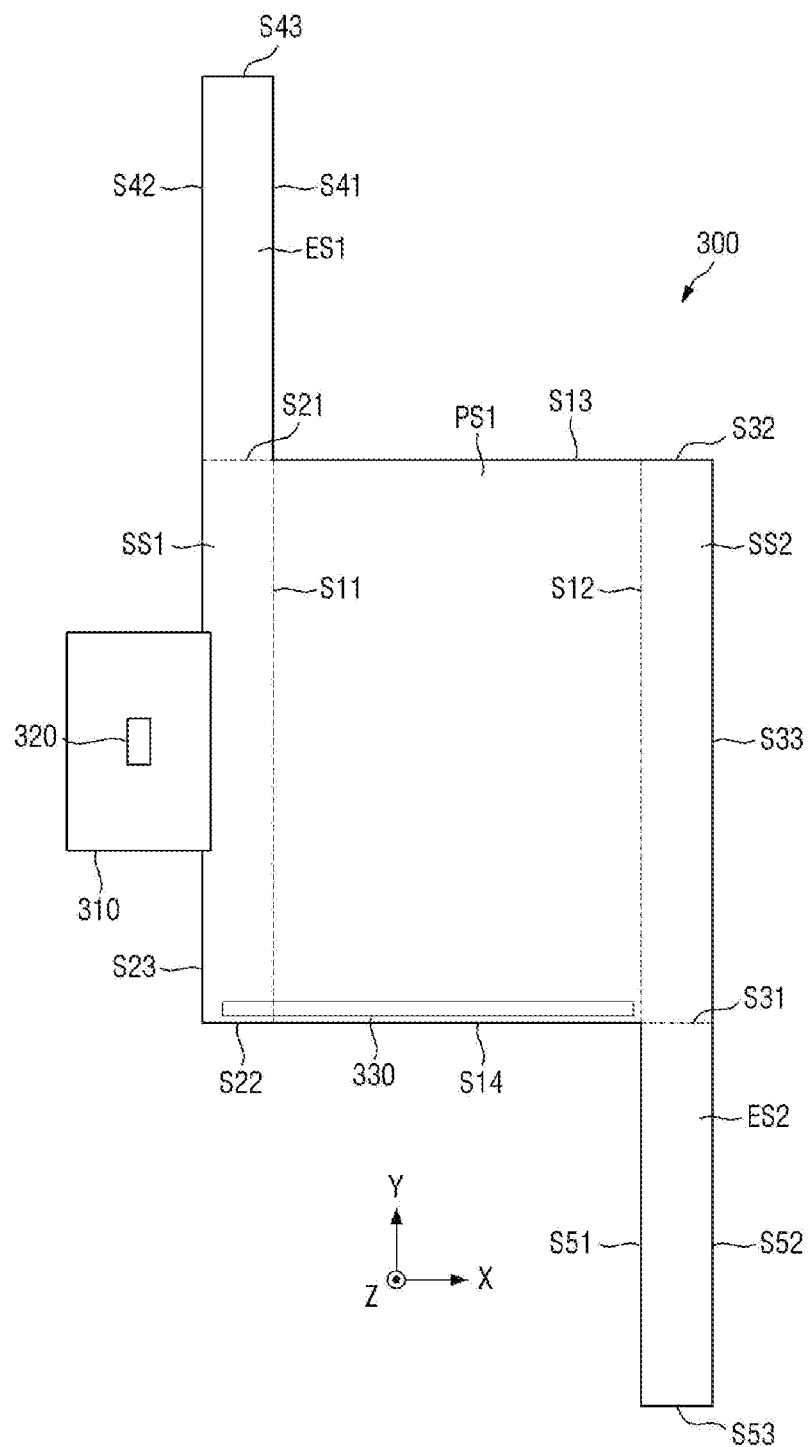
FIG. 4 is a development drawing of an embodiment of a display panel.

FIG. 4 is a development drawing of an embodiment of a display panel.

FIGS. 5 through 17 are a perspective view, a plan view, a bottom view, a front view, a rear view, a left side view, and a right side view of the display panel of FIG. 4.

Referring to FIGS. 4 and 5 through 17, the display panel 300 in the embodiment may include a first flat surface PS1, a first side surface SS1, a second side surface SS2, a first extension surface ES1, and a second extension surface ES2.

The first flat surface PS1, the first side surface SS1, the second side surface SS2, the first extension surface ES1, and the second extension surface ES2 are quadrangular e.g., rectangular) when seen in a plan view, but the invention is not limited thereto. The first flat surface PS1, the first side surface SS1, the second side surface SS2, the first extension surface ES1, and the second extension surface ES2 may also be formed or provided in other polygonal shapes or in a circular or elliptical shape when seen in a plan view.

Figure 5:
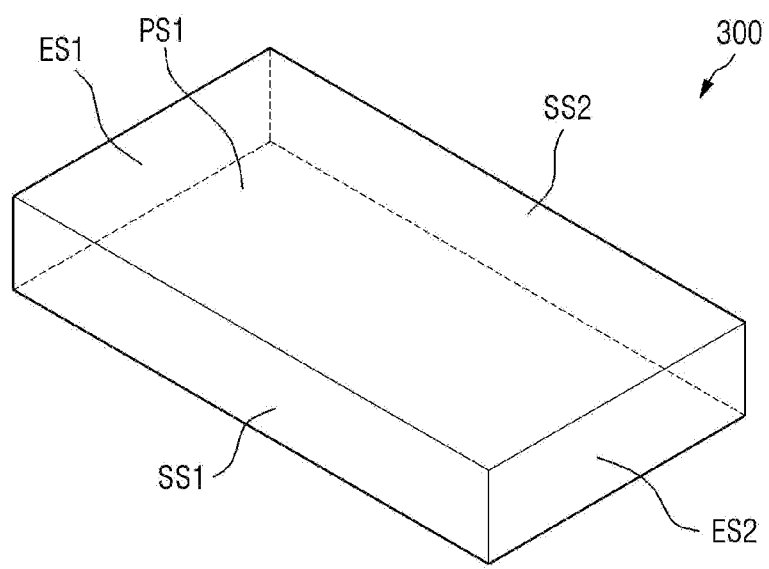
FIGS. 5 through 11 are a perspective view, a plan view, a bottom view, a front view, a rear view, a left side view, and a right side view of the display panel of FIG. 4.
Figure 6:
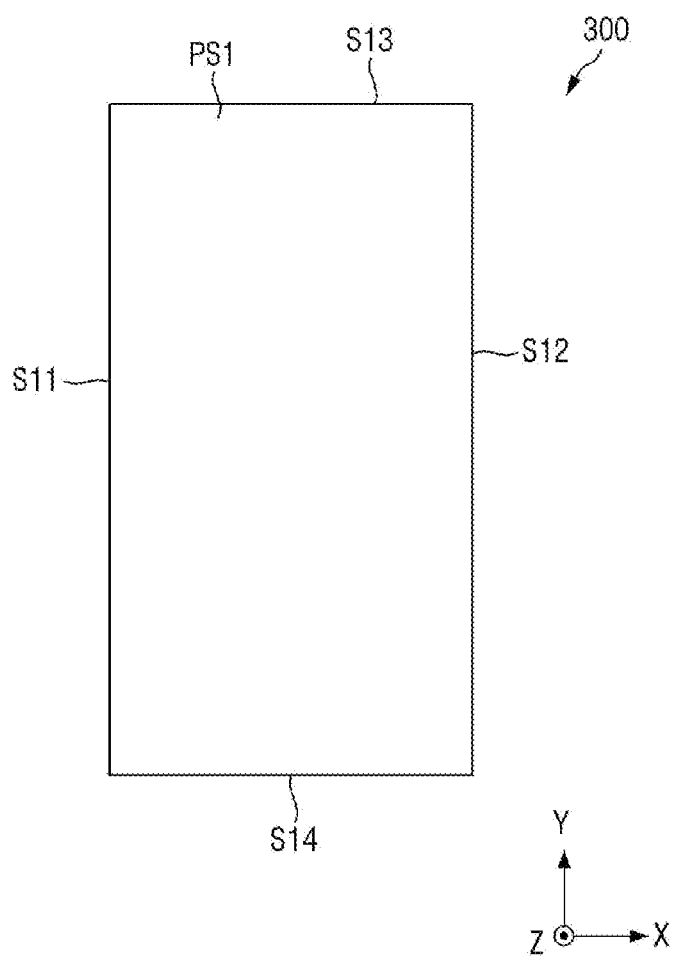

The first flat surface PS1 may include a first side S11, a second side S12, a third side S13, and a fourth side S14. The first side S11 and the second side S12 of the first flat surface PS1 may be longer than the third side S13 and the fourth side S14 of the first flat surface PS1. The first side S11 and the second side S12 of the first flat surface PS1 may be parallel to each other, and the third side S13 and the fourth side S14 may be parallel to each other. Although the first side S11 and the second side S12 of the first flat surface PS1 have the same length in FIG. 4, they may also have different lengths. In addition, although the third side S13 and the fourth side S14 of the first flat surface PS1 have the same length, they may also have different lengths. The first flat surface PS1 may be an upper surface of the display panel 300 as illustrated in FIGS. 5 and 6. The first flat surface PS1 may overlap an upper surface DPS1 of the cover window 100.

Figure 10:
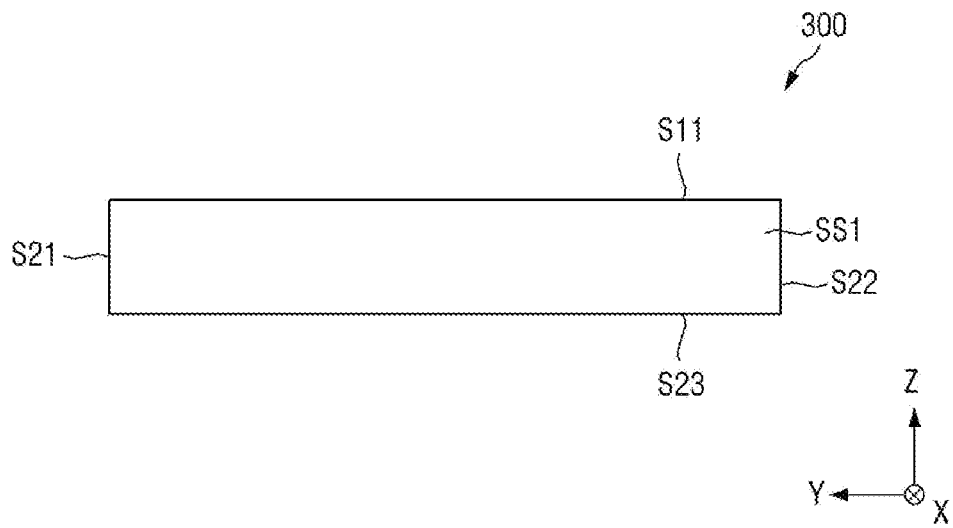

The first side surface SS1 may extend from the first side S11 of the first flat surface PS1. The first side surface SS1 may be bent in a third direction (Z-axis direction) from the first side S11 of the first flat surface PS1. The first side surface SS1 may be a left side surface of the display panel 300 as illustrated in FIGS. 5 and 10, The first side surface SS1 may include a first side S21, a second side S22 and a third side S23 and may share the first side Sit of the first flat surface PS1 as one side with the first flat surface PS1. The first side S21 and the second side S22 of the first side surface SS1 may be parallel to each other and may be shorter than the third side S23 of the first side surface SS1. Although the first side S21 and the second side S22 of the first side surface SS1 have the same length FIG. 4, they may also have different lengths. The first side surface SS1 may overlap a left side surface DSS1 of the cover window 100.

Figure 11:
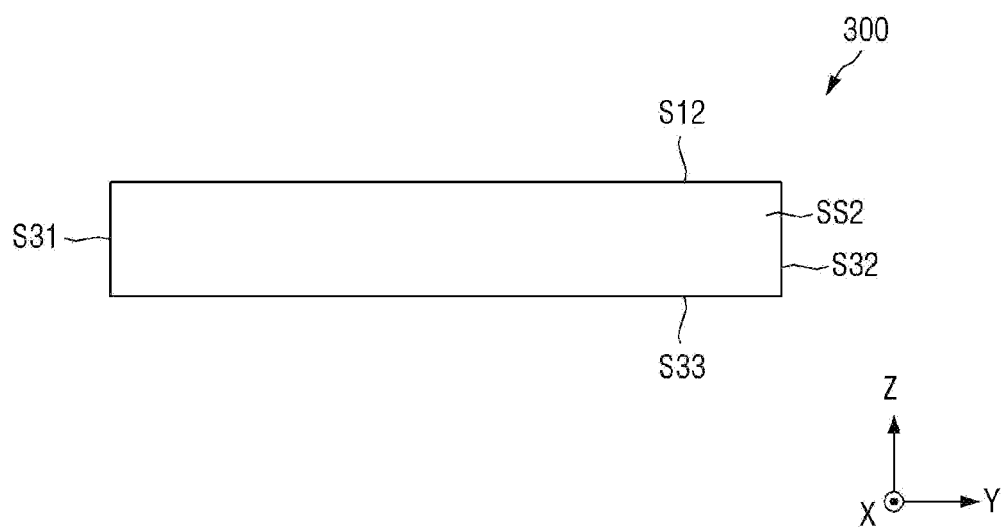

The second side surface SS2 may extend from the second side S12 of the first flat surface PS1. The second side surface SS2 may be bent in the third direction (Z-axis direction) from the second side S12 of the first flat surface PS1. The second side surface SS2 may be a right side surface of the display panel 300 as illustrated in FIGS. 5 and 11. The second side surface SS2 may include a first side S31, a second side S32 and a third side S33 and may share the second side S12 of the first flat surface PS1 as one side with the first flat surface PS1. The first side S31 and the second side S32 of the second side surface SS2 may be parallel to each other and may be shorter than the third side S33 of the second side surface SS2. Although the first side S31 and the second side S32 of the second side surface SS2 have the same length in FIG. 4, they may also have different lengths. The second side surface SS2 may overlap a right side surface DSS2 of the cover window 100.

Figure 7:
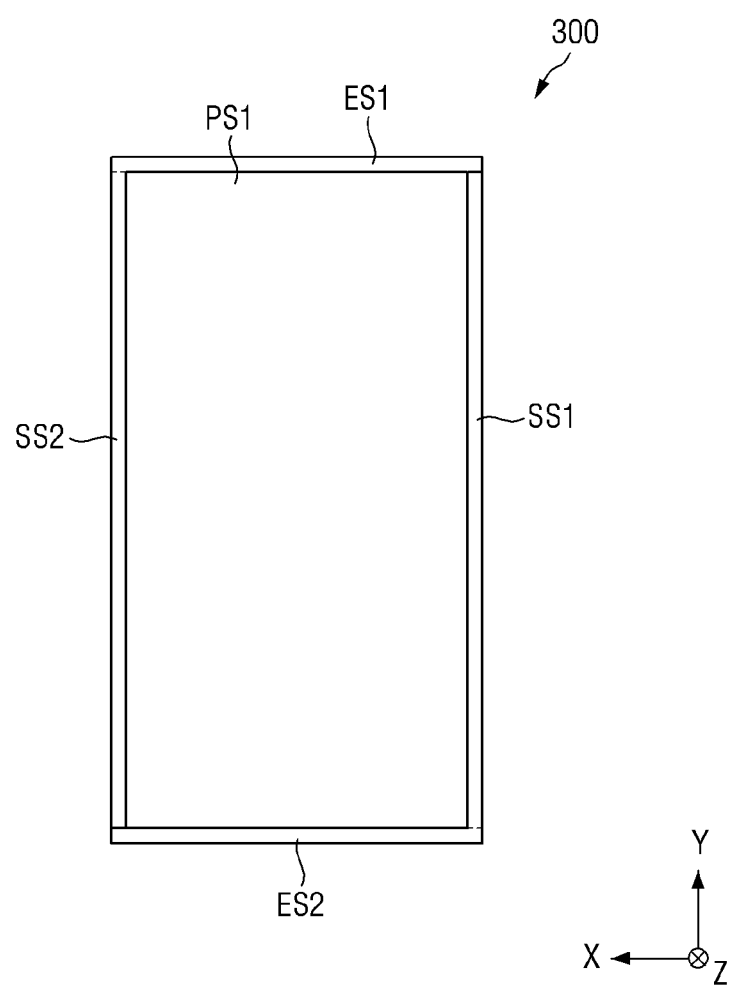

The first extension surface ES1 may extend from the first side S21 of the first side surface SS1. The first extension surface ES1 may be bent in the first direction (X-axis direction) from the first side S21 of the first side surface SS1. The first extension surface ES1 may be an upper side surface of the display panel 300 as illustrated in FIGS. 5 and 7. The first extension surface ES1 may include a first side S41, a second side S42 and a third side S43 and may share the first side S21 of the first side surface SS1 as one side with the first side surface SS1. The first side S41 and the second side S42 of the first extension surface EST may be parallel to each other and may be longer than the third side S43 of the first extension surface ES1. The first extension surface ES1 may overlap an upper side surface DSS3 of the cover window 100.

Figure 8:
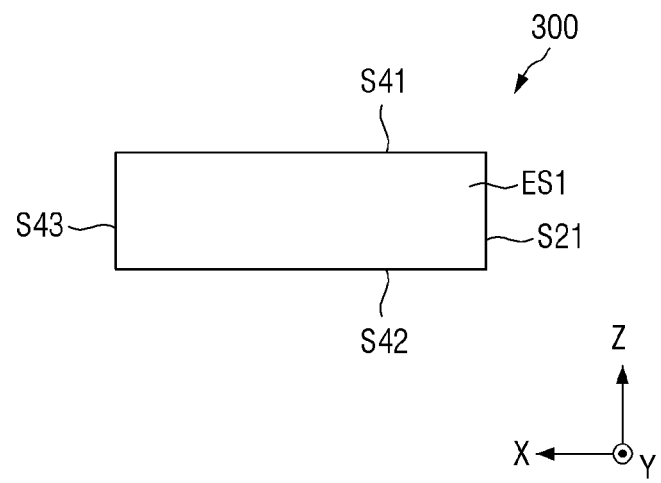
Figure 9:
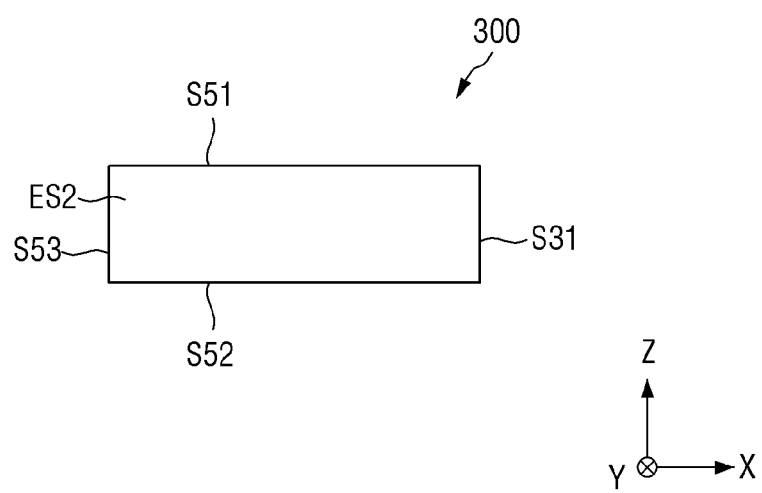

The second extension surface ES2 may extend from the first side S31 of the second side surface SS2. The second extension surface ES2 may be bent in the first direction (X-axis direction) from the first side S31 of the second side surface SS2. The second extension surface ES2 may be a lower side surface of the display panel 300 as illustrated in FIGS. 5 and 8. The second extension surface ES2 may include a first side SS1, a second side SS2 and a third side S53 and may share the first side S31 of the second side surface SS2 as one side with the second side surface S52. The first side S51 and the second side S52 of the second extension surface ES2 may be parallel to each other and may be longer than the third side S53 of the second extension surface ES2. The second extension surface ES2 may overlap a lower side surface DSS4 of the cover window 100.

The first extension surface ES1 is bent in the first direction (X-axis direction) from the first side S21 of the first side surface SS1. Therefore, the first side S41 of the first extension surface ES1 may face the third side S13 of the first flat surface PS1, and the third side S43 of the first extension surface ES1 may face the second side S32 of the second side surface SS2. In this case, a length of the first side S41 of the first extension surface ES1 and a length of the third side S13 of the first flat surface PS1 may be substantially the same, and a length of the third side S43 of the first extension surface ES1 and a length of the second side S32 of the second side surface SS2 may be substantially the same. In addition, a fine gap may be defined between the first side S41 of the first extension surface ES1 and the third side S13 of the first flat surface PS1 and between the third side S43 of the first extension surface ES1 and the second side S32 of the second side surface SS2. In an alternative embodiment, the first side S41 of the first extension surface ES1 and the third side S13 of the first flat surface PS1 may contact each other, and the third side S43 of the first extension surface ES1 and the second side S32 of the second side surface SS2 may contact each other.

The second extension surface ES2 is bent in the first direction (X-axis direction) from the first side S31 of the second side surface SS2. Therefore, the first side S51 of the second extension surface ES2 may face the fourth side S14 of the first flat surface PS1, and the third side S53 of the second extension surface ES2 may face the second side S22 of the first side surface SS1. In this case, a length of the first side S51 of the second extension surface ES2 and a length of the fourth side S14 of the first flat surface PS1 may be substantially the same, and a length of the third side S53 of the second extension surface ES2 and a length of the second side S22 of the first side surface SS1 may be substantially the same. In addition, a fine gap may be defined between the first side S51 of the second extension surface ES2 and the fourth side S14 of the first flat surface PS1 and between the third side S53 of the second extension surface ES2 and the second side S22 of the first side surface SS1. In an alternative embodiment, the first side S51 of the second extension surface ES2 and the fourth side S14 of the first flat surface PS1 may contact each other, and the third side S53 of the second extension surface ES2 and the second side S22 of the first side surface SS1 may contact each other.

A scan driver 330 may output scan signals to scan lines. The scan driver 330 may be disposed on the first flat surface PS1 and the first side surface SS1. The scan driver 330 may be disposed adjacent to the fourth side S14 of the first flat surface PS1 and the second side S22 of the first side surface SS1, The scan driver 330 may also be disposed on the second side surface SS2, in which case it may be disposed adjacent to the first side S31 of the second side surface SS2.

The display circuit board 310 may be disposed on display pads disposed adjacent to the first side S21 of the first side surface SS1. The display circuit board 310 may be electrically connected to data lines through the display pads. The display driver 320 of the display circuit board 310 may output data voltages to the data lines.

The scan lines connected to the scan driver 330 and the display pads and data lines connected to the display circuit board 310 will be described in detail later with reference to FIGS. 5 through 15.

According to the embodiment illustrated in FIGS. 4 and 5 through 11, the display panel 300 may include the first flat surface PS1, the first side surface SS1, the second side surface SS2, the first extension surface ES1, and the second extension surface ES2. Therefore, the display panel 300 has pixels disposed not only on the first flat surface PS1 but also on the first side surface SS1, the second side surface SS2, the first extension surface ES1 and the second extension surface ES2. Accordingly, an image may be also displayed on the first side surface SS1, the second side surface SS2, the first extension surface ES1, and the second extension surface ES2. That is, the display panel 300 may display an image on its upper and side surfaces.

FIG. 12 is a plan view illustrating an embodiment of the first flat surface, the first side surface and the second side surface of FIG. 4 in detail. FIG. 5 is a plan view illustrating an embodiment of the first extension surface of FIG. 4 in detail. FIG. 14 is a plan view illustrating an embodiment of the second extension surface of FIG. 4 in detail.

Figure 13:
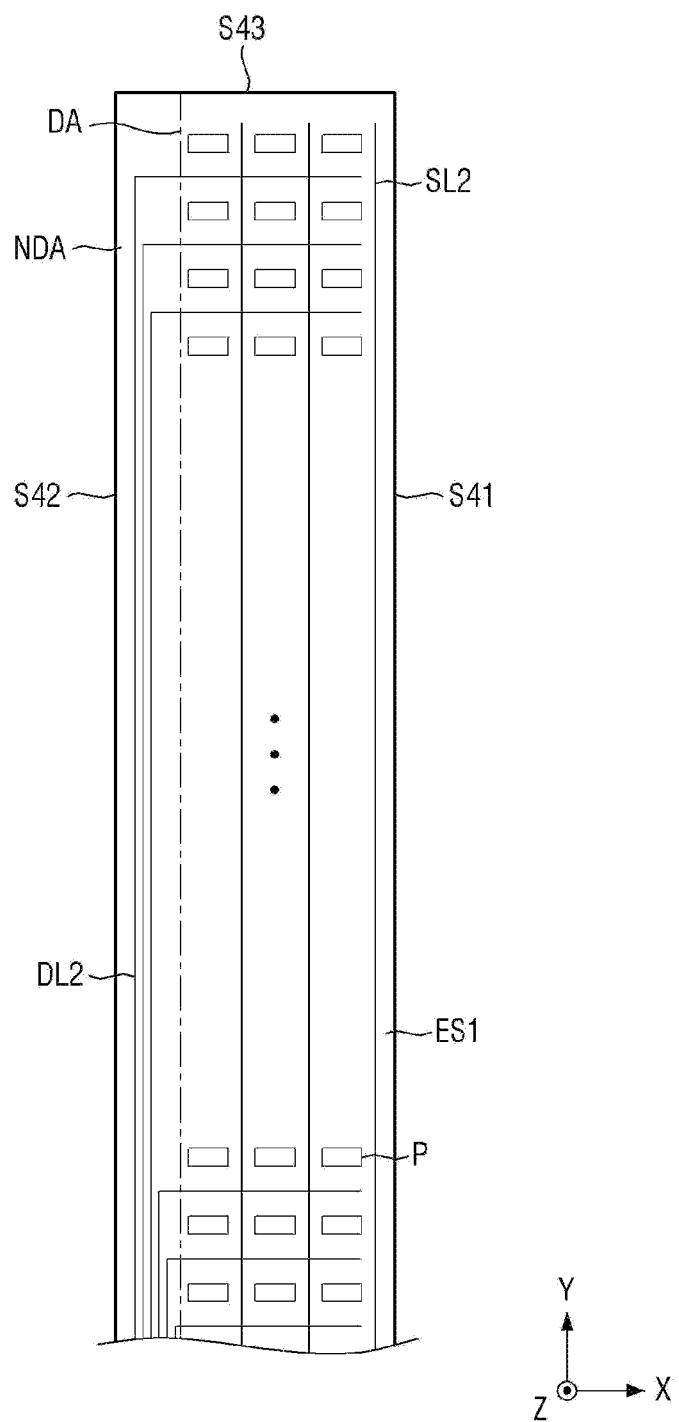
FIG. 13 is a plan view illustrating an embodiment of a first extension surface of FIG. 4 in detail.

Referring to FIGS. 12 through 14, the display panel 300 may include scan lines SL, data lines DL, pixels P, display pads DP, and the scan driver 330. The scan lines SL, the data lines DL, and the pixels P may be disposed on the first flat surface PS1, the first side surface SS1, the second side surface SS2, the first extension surface ES1, and the second extension surface ES2 of the display panel 300. The display pads DP may be disposed on the first side surface SS1 of the display panel 300. The scan driver 330 may be disposed on the first flat surface PS1 and the first side surface SS1 of the display panel 300.

The display panel 300 may include a display area in which pixels display an image and a non-display area NDA which is disposed around the display area DA. The non-display area NDA may be defined as an area extending from the outside of the display area DA to edges of the display panel 300. A black matrix may be formed or provided in the non-display area NDA. The non-display area NDA may be overlapped by the light blocking part of the cover window 100. Accordingly, the non-display area NDA may be covered by the light blocking part of the cover window 100 so that it is not visible from the outside.

The scan lines SL, the data lines DL, and the pixels P may be disposed in the display area DA, and the display pads DP and the scan driver 330 may be disposed in the non-display area NDA.

The scan lines SL may be formed or provided parallel to each other and extend in the second direction (Y-axis direction), and the data lines DL may be formed or provided parallel to each other and extend in the first direction (X-axis direction) intersecting the second direction (Y-axis direction). The scan lines SL may be connected to the scan driver 330, and the data lines DL may be connected to the display pads DP.

The pixels P may be formed or provided in a matrix form. However, the invention is not limited thereto, and the pixels P may be formed or provided in various other forms. Each of the pixels P may be connected to at least any one of the scan lines SL and any one of the data lines DL. Each of the pixels P may include TFTs including a driving transistor and at least one switching transistor, an organic light emitting diode, and a capacitor. Each of the pixels P may receive a data voltage of a data line DL when a scan signal is transmitted from a scan line SL and may emit light as the driving transistor supplies a driving current to the organic light emitting diode according to the data voltage applied to a gate electrode.

The pixels P illustrated in FIG. 12 may be subpixels, and a plurality of pixels P may be defined as one pixel group that may display white light. In an embodiment, three pixels P adjacent in the first direction (X-axis direction) or the second direction (Y-axis direction) may be defined as one pixel group, for example. In this case, among the three pixels P, a first pixel may display light of a first color, a second pixel may display light of a second color, and a third pixel may display light of a third color. The light of the first color may be red, the light of the second color may be green, and the light of the third color may be blue. However, the invention is not limited thereto. In an alternative embodiment, four adjacent pixels P in a quadrangular (e.g., rectangular) shape when seen in a plan view may be defined as one pixel group. In this case, among the four pixels P, a first pixel may display light of a first color, a second pixel may display light of a second color, a third pixel may display light of a third color, and a fourth pixel may display light of a fourth color. The light of the first color may be red, the light of the second color may be green, the light of the third color may be blue, and the light of the fourth color may be white or green. However, the invention is not limited thereto.

The scan lines SL may include first scan lines SL1 disposed on the first flat surface PS1, second scan lines SL2 disposed on the first side surface SS1 and the first extension surface ES1, and third scan lines SL3 disposed on the second side surface SS2 and the second extension surface ES2. The first scan lines SL1, the second scan lines SL2, and the third scan lines SL3 may extend in the second direction (Y-axis direction).

Each of the first scan lines SL1 may be connected to pixels P disposed on the first flat surface PS1. The scan lines SL extend in the second direction (Y-axis direction), the first extension surface ES1 extends from the first side surface SS1 in the second direction (Y-axis direction), and the second extension surface ES2 extends from the second side surface SS2 in the second direction (Y-axis direction).

Therefore, the second scan lines SL2 may be connected to pixels P of the first side surface SS1 and pixels P of the first extension surface ES1. The third scan lines SL3 may be connected to pixels P of the second side surface SS2 and pixels P of the second extension surface ES2.

The data lines DL may include first data lines DL1 disposed on the first side surface SS1, the first flat surface PS1 and the second side surface SS2, second data lines DL2 disposed on the first side surface SS1 and the first extension surface ES1, and third data lines DL3 disposed on the first side surface SS1, the first flat surface PS1, the second side surface SS2 and the second extension surface ES2.

Each of the first data lines DL1 may extend in the first direction (X-axis direction) and may be connected to the pixels P disposed on the first side surface SS1, the first flat surface PS1 and the second side surface SS2.

Each of the second data lines DL2 may be connected to the pixels P disposed on the first extension surface ES1. As illustrated in FIG. 5, each of the second data lines DL2 may extend in the second direction (Y-axis direction), bend in the first direction (X-axis direction) from the second direction (Y-axis direction), and then extend in the first direction (X-axis direction). In this case, the second data lines DL2 may be disposed parallel to the second scan lines SL2 on the first side surface SS1 and may intersect the second scan lines SL2 on the first extension surface ES1. In an alternative embodiment, each of the second data lines DL2 may extend in the first direction (X-axis direction), bend in the second direction (Y-axis direction) from the first direction (X-axis direction), and then extend in the second direction (Y-axis direction). In this case, the second data lines DL2 may be disposed parallel to the second scan lines SL2 on the first extension surface ES1.

Each of the third data lines DL3 may be connected to the pixels P disposed on the second extension surface ES2. As illustrated in FIGS. 12 and 14, each of the third data lines DL3 may extend in the second direction (Y-axis direction), bend in the first direction (X-axis direction) from the second direction (Y-axis direction) at a position adjacent to the second side S22 of the first side surface SS1, extend in the first direction (X-axis direction), extend in the second direction (Y-axis direction) on the second side surface SS2, bend in the first direction (X-axis direction) from the second direction (Y-axis direction) on the second extension surface ES2, and then extend in the first direction (X-axis direction). In this case, the third data lines DL3 may intersect the second scan lines SL2 on the first flat surface PS1. In addition, the third data lines DL3 may be disposed between the scan driver 330 and the pixels P on the first flat surface PS1 or between the scan driver 330 and the fourth side S14 of the first flat surface PS1.

The display pads DP may be disposed adjacent to the third side S23 of the first side surface SS1. The display pads DP may be connected to the data lines DL and a scan control line SCL connected to the scan driver 330. Although the scan driver 330 is connected to one scan control line SCL in FIG. 12, it may be connected to a plurality of scan control lines SCL.

The display pads DP may be attached to lead terminals of the display circuit board 310 by an anisotropic conductive film. Accordingly, the display pads DP may be electrically connected to the display driver 320 of the display circuit board 310. Therefore, a scan control signal of the display driver 320 may be supplied to the scan control line SCL through the display pads DP, and data signals may be supplied to the data lines DL through the display pads DP.

The scan driver 330 may be disposed adjacent to the fourth side S14 of the first flat surface PS1. The scan driver 330 may be connected to the scan lines SL. The scan driver 330 may generate scan signals according to the scan control signal supplied through the scan control line SCL and supply the scan signals to the scan lines SL.

In FIGS. 5 and 14, a case where the pixels P are disposed in three rows extending in the second direction (Y-axis direction) on each of the first side surface SS1, the second side surface SS2, the first extension surface ES1 and the second extension surface ES2 is illustrated as an example for ease of description. However, the invention is not limited thereto.

According to the embodiment illustrated in FIGS. 12 through 14, the display panel 300 has pixels disposed not only on the first flat surface PS1 but also on the first side surface SS1, the second side surface SS2, the first extension surface ES1, and the second extension surface ES2. Therefore, an image may be disposed on the first side surface SS1, the second side surface SS2, the first extension surface ES1, and the second extension surface ES2.

Since the first extension surface ES1 extends long in the second direction (Y-axis direction), it is difficult to efficiently arrange the scan lines SL and the data lines DL on the first extension surface ES1. Therefore, the arrangement area of the scan lines SL and the data lines DL on the first extension surface ES1 relative to the total area of the first extension surface ES1 may be larger than the arrangement area of the scan lines SL and the data lines DL on the first flat surface PS1 relative to the total area of the first flat surface PS1. Accordingly, the area of the pixels P relative to the total area of the first extension surface ES1 may be smaller than the area of the pixels P relative to the total area of the first flat surface PS1. Therefore, the number of pixels per inch of the first extension surface ES1 may be smaller than the number of pixels per inch of the first flat surface PS1. Accordingly, the resolution of the first extension surface ES1 may be lower than that of the first flat surface PS1.

Similarly, the number of pixels per inch of the second extension surface ES2 may also be smaller than the number of pixels per inch of the first flat surface PS1. Accordingly, the resolution of the first extension surface ES1 may be lower than that of the first flat surface PS1.

In contrast, although the first side surface SS1 extends long in the second direction (Y-axis direction), the scan lines SL and the data lines DL of the first side surface SS1 may be disposed similarly to the scan lines SL and the data lines DL of the first flat surface PS1. Therefore, the number of pixels per inch of the first side surface SS1 may be substantially equal to the number of pixels per inch of the first flat surface PS1. Accordingly, the resolution of the first side surface SS1 may be substantially the same as that of the first flat surface PS1.

Similarly, the number of pixels per inch of the second side surface SS2 may also be substantially equal to the number of pixels per inch of the first flat surface PS1. Accordingly, the resolution of the second side surface SS2 may be substantially the same as that of the first flat surface PS1.

Figure 15:
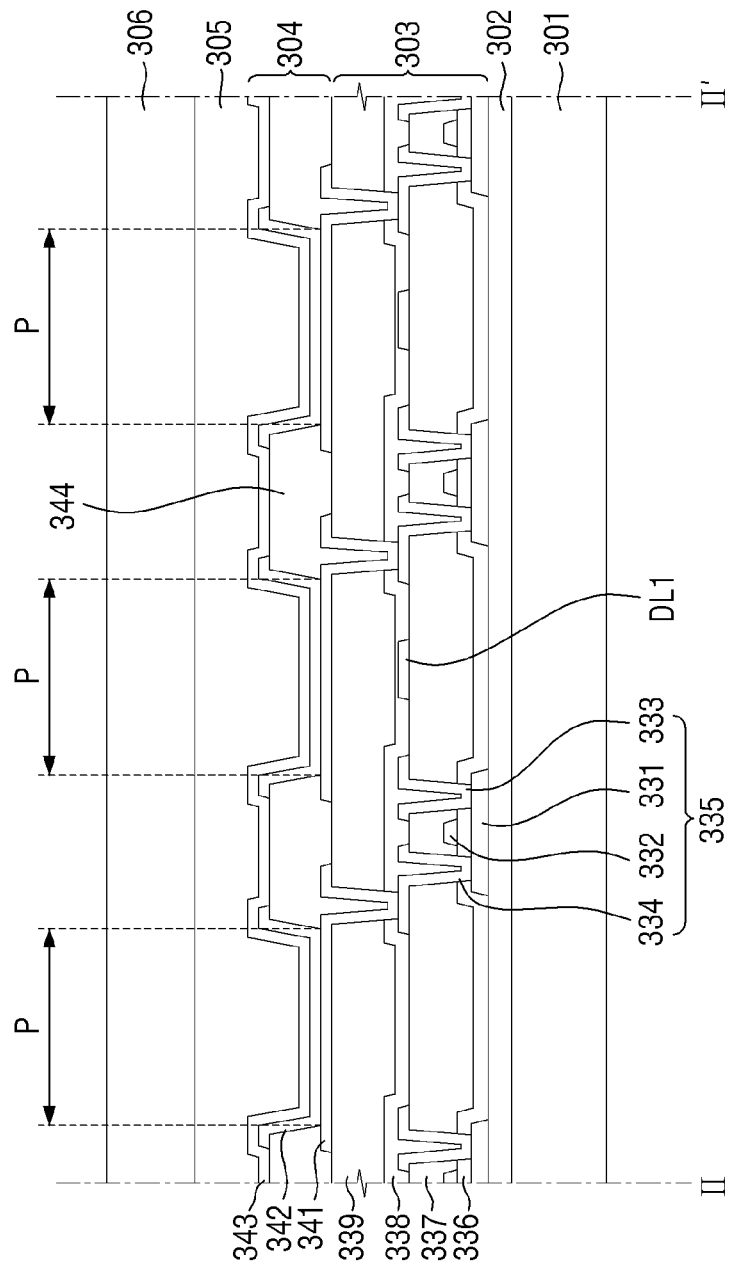
FIG. 15 is a cross-sectional view illustrating an embodiment of the display panel along II-II' of FIG. 12.

FIG. 15 is a cross-sectional view illustrating an embodiment of the display panel along line II-II' of FIG. 12. FIG. 15 illustrates cross sections of the pixels PX of the display panel 300.

Referring to FIG. 15, the display panel 300 may include a support substrate 301, a flexible substrate 302, a TFT layer 303, a light emitting element layer 304, a thin-film encapsulation layer 305, and an opposite substrate 306.

The flexible substrate 302 is disposed on the support substrate 301. Each of the support substrate 301 and the flexible substrate 302 may include a polymer material having flexibility. In an embodiment, each of the support substrate 301 and the flexible substrate 302 may be polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate, cellulose triacetate ("CAT"), cellulose acetate propionate ("CAP"), or a combination of the same, for example. In an alternative embodiment, the support substrate 301 may be omitted to increase the flexibility of the display panel 300.

The TFT layer 303 is formed or disposed on the flexible substrate 302. The TFT layer 303 includes TFTs 335, a gate insulating layer 336, an interlayer insulating film 337, a protective layer 338, and a planarization layer 339.

A buffer layer may be formed or disposed on the flexible substrate 302. The buffer layer may be formed or disposed on the flexible substrate 302 to protect the TFTs 335 and light emitting elements from moisture introduced through the support substrate 301 and the flexible substrate 302 which are vulnerable to moisture penetration. The buffer layer may consist of a plurality of inorganic layers stacked alternately. In an embodiment, the buffer layer may be a multilayer in which one or more inorganic layers selected from a silicon oxide (SiOx) layer, a silicon nitride (SiNx) layer, and SiON are alternately stacked, for example. In an alternative embodiment the buffer layer may be omitted.

The TFTs 335 are formed or disposed on the buffer layer. Each of the TFTs 335 includes an active layer 331, a gate electrode 332, a source electrode 333, and a drain electrode 334. In FIG. 5, each of the TFTs 335 is formed or provided as a top-gate type in which the gate electrode 332 is disposed above the active layer 331. However, it should be noted that embodiments of the invention are not limited to this case. That is, each of the TFTs 335 may also be formed or provided as a bottom-gate type in which the gate electrode 332 is disposed under the active layer 331 or a double-gate type in which the gate electrode 332 is disposed both above and under the active layer 331.

The active layers 331 are formed or disposed on the buffer layer. The active layers 331 may include a silicon-based semiconductor material or an oxide-based semiconductor material. A light blocking layer may be formed or disposed between the buffer layer and the active layers 331 to block external light from entering the active layers 331.

The gate insulating layer 336 may be formed or disposed on the active layers 331. The gate insulating layer 336 may be an inorganic layer, for example, a silicon oxide (SiOx) layer, a silicon nitride (SiNx) layer, or a multilayer composed of these layers.

The gate electrodes 332 and gate lines may be formed or disposed on the gate insulating layer 336. Each of the gate electrodes 332 and the gate lines may be a single layer or a multilayer including any one or more of molybdenum (Mo), aluminum (Al), chromium (Cr), gold (Au), titanium (Ti), nickel (Ni), neodymium (Nd), copper (Cu), and alloys of the same.

The interlayer insulating film 337 may be formed or disposed on the gate electrodes 332 and the gate lines. The interlayer insulating film 337 may be an inorganic layer, for example, a silicon oxide (SiOx) layer, a silicon nitride (SiNx) layer, or a multilayer composed of these layers.

The source electrodes 333, the drain electrodes 334, and data lines may be formed or disposed on the interlayer insulating film 337. Each of the source electrodes 333 and the drain electrodes 334 may be connected to an active layer 331 through a contact hole passing through the gate insulating layer 336 and the interlayer insulating film 337. Each of the source electrodes 333, the drain electrodes 334, and the data lines may be a single layer or a multilayer including any one or more of molybdenum (Mo), aluminum (Al), chromium (Cr), gold (Au), titanium (Ti), nickel (Ni), neodymium (Nd), copper (Cu), and alloys of the same.

The protective layer 338 for insulating the TFTs 335 may be formed or disposed on the source electrodes 333, the drain electrodes 334, and the data lines. The protective layer 338 may be an inorganic layer, for example, a silicon oxide (SiOx) layer, a silicon nitride (SiNx) layer, or a multilayer composed of these layers.

The planarization layer 339 may be formed or disposed on the protective layer 338 to planarize a step due to the TFTs 335. The planarization layer 339 may include an organic layer such as acryl resin, epoxy resin, phenolic resin, polyamide resin, or polyimide resin.

The light emitting element layer 304 is formed or disposed on the TFT layer 303. The light emitting element layer 304 includes the light emitting elements and a pixel defining layer 344.

The light emitting elements and the pixel defining layer 344 are formed or disposed on the planarization layer 339. The light emitting elements may be organic light emitting devices. In this case, each of the light emitting elements may include an anode 341, a light emitting layer 342, and a cathode 343.

The anodes 341 may be formed or disposed on the planarization layer 339. The anodes 341 may be connected to the source electrodes 333 of the TFTs 335 through contact holes passing through the protective layer 338 and the planarization layer 339.

The pixel defining layer 344 may be formed or disposed on the planarization layer 339 to cover edges of the anodes 341 to separate pixels. That is, the pixel defining layer 344 serves as a pixel defining layer for defining pixels. Each of the pixels is an area in which the anode 341, the light emitting layer 342 and the cathode 343 are sequentially stacked so that holes from the anode 341 and electrons from the cathode 343 combine together in the light emitting layer 342 to emit light.

The light emitting layers 342 are formed or disposed on the anodes 341 and the pixel defining layer 344. The light emitting layers 342 may be organic light emitting layers. Each of the light emitting layers 342 may emit one of red light, green light, and blue light. The red light may have a peak wavelength range of about 620 nanometers (nm) to about 750 nm, and the green light may have a peak wavelength range of about 495 nm to about 570 nm. In addition, the blue light may have a peak wavelength range of about 450 nm to about 495 nm, in an alternative embodiment, the light emitting layers 342 may be white light emitting layers which emit white light. In this case, the light emitting layers 342 may be a stack of a red light emitting layer, a green light emitting layer and a blue light emitting layer and may be a common layer formed or provided in common to all pixels. In this case, the display panel 300 may further include color filters for displaying red, green and blue.

Each of the light emitting layers 342 may include a hole transporting layer, a light emitting layer, and an electron transporting layer. In addition, each of the light emitting layers 342 may be formed or provided in a tandem structure of two or more stacks, in which case a charge generating layer may be formed or disposed between the stacks.

The cathode 343 is formed or disposed on the light emitting layers 342. The cathode 343 may cover the light emitting layers 342. The cathode 343 may be a common layer formed or provided in common to all pixels.

When the light emitting element layer 304 is formed or provided as a top emission type which emits light in an upward direction, the anodes 341 may include a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu). In addition, the cathode 263 may include a transparent conductive material ("TCO") capable of transmitting light, such as indium tin oxide ("ITO") or indium zinc oxide ("IZO"), or a semi-transmissive conductive material such as magnesium (Mg), silver (Ag) or an alloy of Mg and Ag. When the cathode 343 includes a semi-transmissive conductive material, the light output efficiency may be increased by a microcavity.

When the light emitting element layer 304 is formed or provided as a bottom emission type which emits light in a downward direction, the anodes 341 may include a TCO such as ITO or IZO or a semi-transmissive conductive material such as magnesium (Mg), silver (Ag) or an alloy of Mg and Ag. The cathode 343 may include a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/TO) of an APC alloy and indium tin oxide. When the anodes 341 include a semi-transmissive conductive material, the light output efficiency may be increased by a microcavity.

The thin-film encapsulation layer 305 is formed or disposed on the light emitting element layer 304. The thin-film encapsulation layer 305 serves to prevent oxygen or moisture from penetrating into the light emitting layers 342 and the cathode 343. To this end, the thin-film encapsulation layer 305 may include at least one inorganic layer. The inorganic layer may include silicon nitride, aluminum nitride, zirconium nitride, titanium nitride, hafnium nitride, tantalum nitride, silicon oxide, aluminum oxide, or titanium oxide. In addition, the thin-film encapsulation layer 305 may further include at least one organic layer. The organic layer may have a sufficient thickness so as to prevent particles from penetrating the thin-film encapsulation layer 305 and entering the light emitting layers 342 and the cathode 343. The organic layer may include any one of epoxy, acrylate, and urethane acrylate. The opposite substrate 306 may be disposed on the thin-film encapsulation layer 305.

Figure 16:
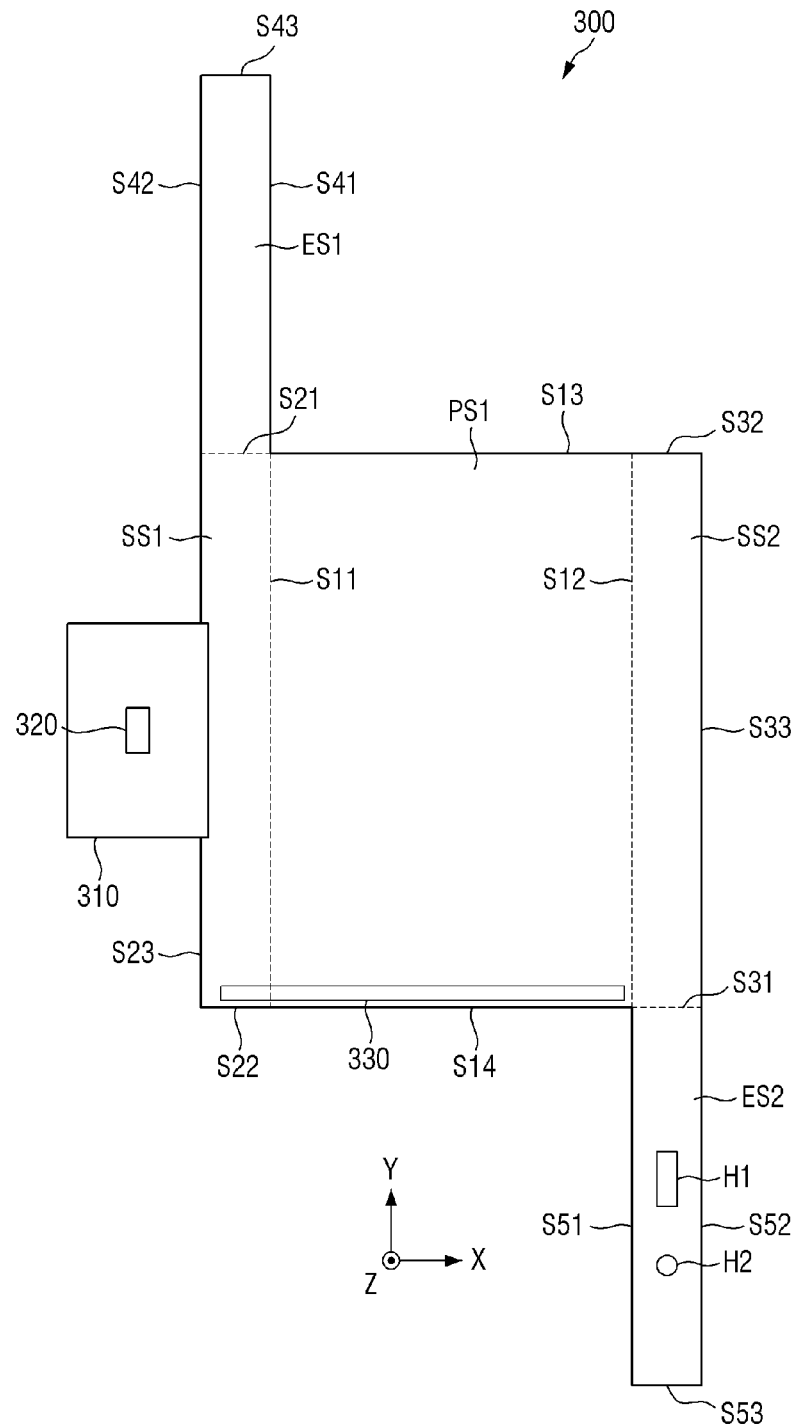
FIG. 16 is a development drawing of an embodiment of a display panel.
Figure 17:
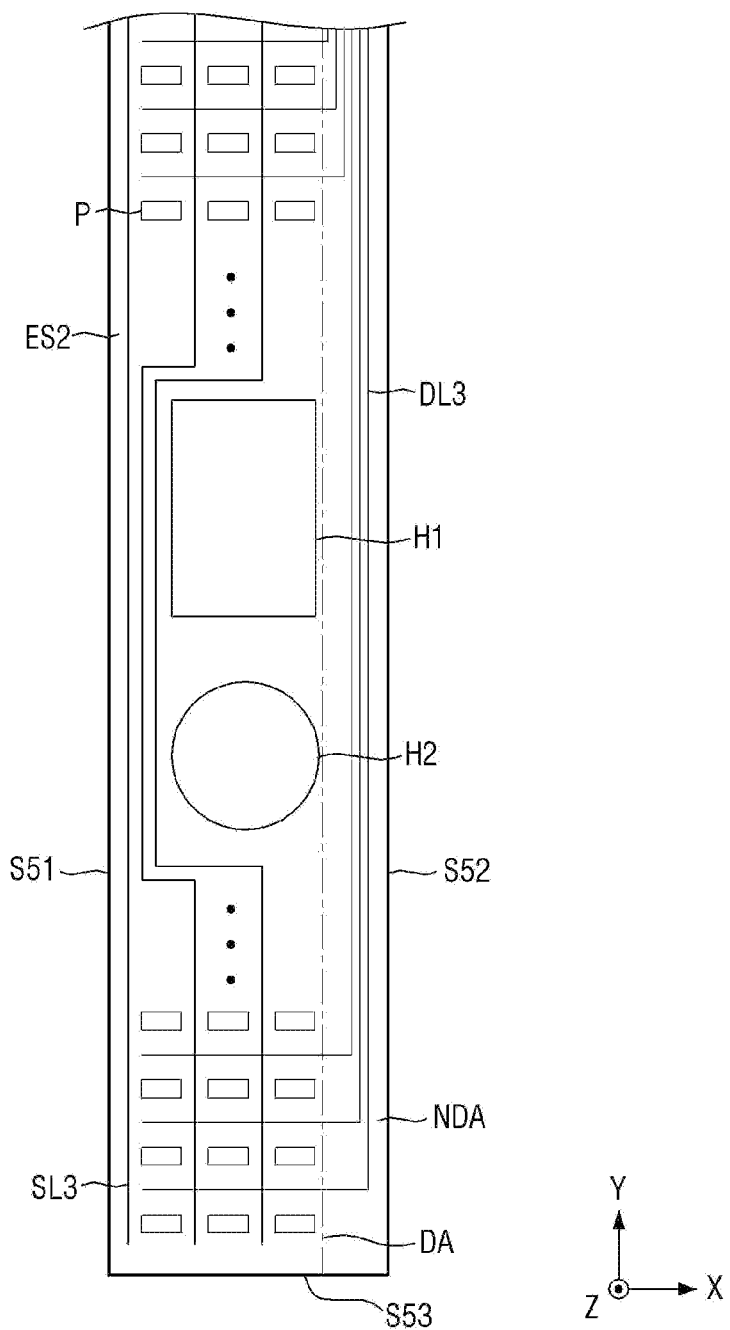
FIG. 17 is a plan view illustrating an embodiment of a second extension surface of FIG. 16 in detail.

FIG. 16 is a development drawing of another embodiment of a display panel. FIG. 17 is a plan view illustrating an embodiment of a second extension surface of FIG. 16 in detail.

The embodiment illustrated in FIGS. 16 and 17 is different from the embodiment illustrated in FIGS. 12 through 15 in that at least one of holes H1 and H2 is defined in the second extension part ES2. Therefore, in FIGS. 16 and 17, the description already provided in the embodiment illustrated in FIGS. 12 through 15 will not be repeated.

Referring to FIGS. 16 and 17, at least one of holes H1 and H2 penetrating the display panel 300 may be formed or disposed in the second extension part ES2. Although two holes H1 and H2 are defined in the second extension part ES2 in FIGS. 16 and 17, the invention is not limited thereto.

A first hole H1 may be quadrangular (e.g., rectangular) when seen in a plan view, and a second hole H2 may be circular when seen in a plan view. However, the invention is not limited thereto. Each of the first hole H1 and the second hole H2 may also have a polygonal shape including a rectangle, a circular shape, or an elliptical shape.

Pixels P do not overlap the first hole H1 and the second hole H2 in the second extension part ES2. As illustrated in FIG. 17, the pixels P may be omitted from an area in which the first hole H1 and the second hole H2 are defined.

In addition, third scan lines SL3 and third data lines DL3 do not overlap the first hole H1 and the second hole H2 in the second extension part ES2. As illustrated in FIG. 17, the third scan lines SL3 may go around a side of each of the first hole H1 and the second hole H2 to be adjacent to a first side S51 of the second extension part ES2. In this case, the third data lines DL3 may be disposed adjacent to a second side S52 of the second extension part ES2.

Although at least one of holes H1 and H2 is defined only in the second extension part ES2 in FIGS. 16 and 17, the invention is not limited thereto. At least one of holes H1 and H2 may also be defined only in a first extension part ES1 or in both the first extension part ES1 and the second extension part ES2. That is, at least one of holes H1 and H2 may be defined in any one surface or a plurality of surfaces among a first flat surface PS1, a first side surface S51, a second side surface SS2, the first extension surface ES1, and the second extension surface ES2.

According to the embodiment illustrated in FIGS. 16 and 17, at least one of holes H1 and H2 may be defined in any one surface or a plurality of surfaces among the first flat surface ES1, the first side surface SS1, the second side surface SS2, the first extension surface ES1 and the second extension surface ES2 of the display panel 300, and a charging terminal or an earphone terminal of the display device 10 may be exposed through at least one of holes H1 and H2, or a speaker hole of the display device 10 may be used as at least one of holes H1 and H2.

Figure 18:
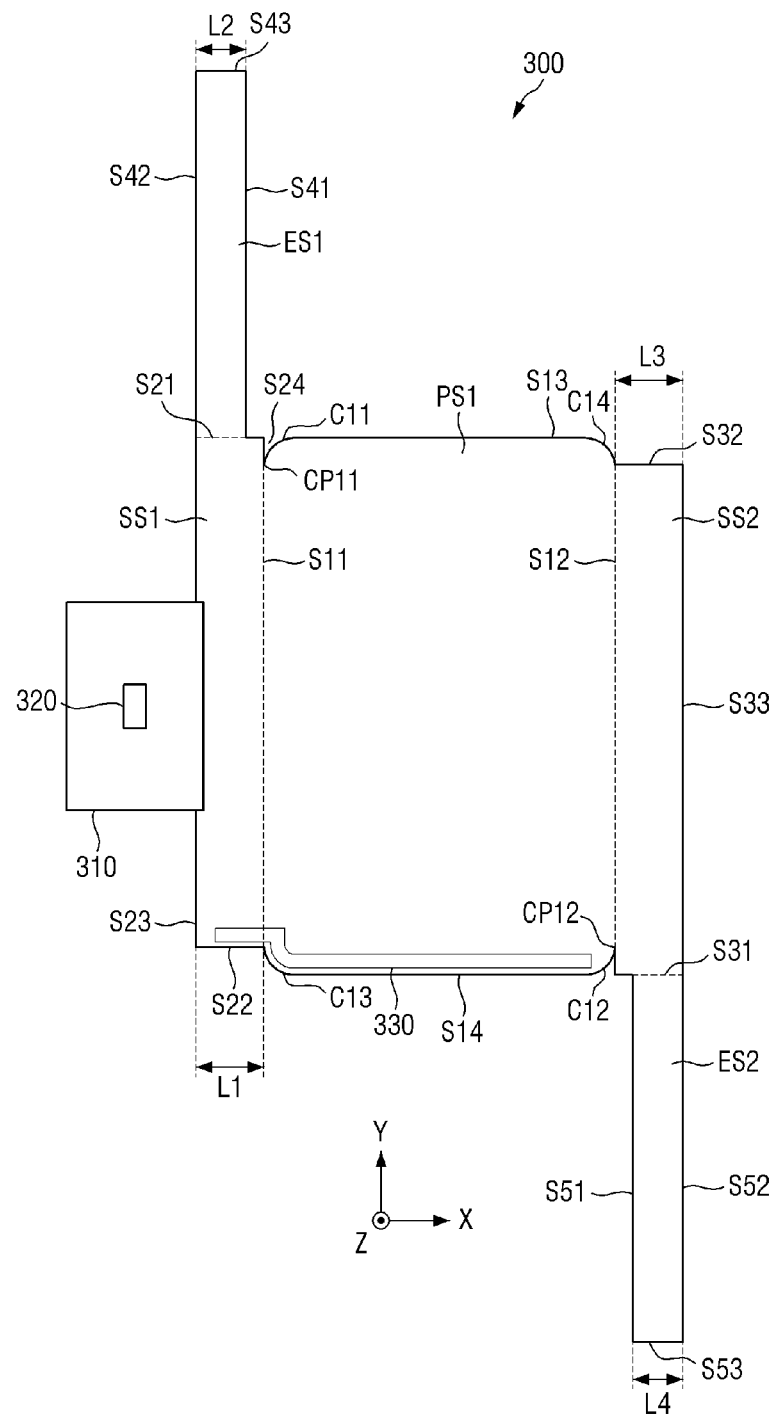
FIG. 18 is a development drawing of an embodiment of a display panel.

FIG. 18 is a development drawing of another embodiment of a display panel. FIGS. 19 through 25 are a perspective view, a plan view, a bottom view, a front view, a rear view, a left side view, and a right side view of the display panel of FIG. 18.

The embodiment illustrated in FIGS. 18 and 19 through 25 is different from the embodiment illustrated in FIGS. 4 and 5 through 11 in that a length L2 of a third side S43 of a first extension part ES1 is smaller than a length L1 of each of a first side S21 and a second side S22 of a first side surface SS1, and a length L4 of a third side S53 of a second extension part ES2 is smaller than a length L3 of each of a first side S31 and a second side S32 of a second side surface SS2. In addition, the embodiment illustrated in FIGS. 18 and 19 through 25 is different from the embodiment illustrated in FIGS. 4 and 5 through 11 in that corners C11 through C14 of a first flat surface PS1 are rounded with a predetermined curvature. Therefore, in FIGS. 18 and 19 through 25, the description already provided in the embodiment illustrated in FIGS. 4 and 5 through 11 will not be repeated.

Referring to FIGS. 18 and 19 through 25, the first flat surface PS1 may include a first corner C11 between a first side S11 and a third side S13 of the first flat surface PS1, a second corner C12 between a second side S12 and a fourth side S14 of the first flat surface PS1, a third corner C13 between the first side S11 and the fourth side S14 of the first flat surface PS1, and a fourth corner C14 between the second side S12 and the third side S13 of the first flat surface PS1. The first corner C11, the second corner C12, the third corner C13, and the fourth corner C14 may be rounded with a predetermined curvature.

Figure 24:
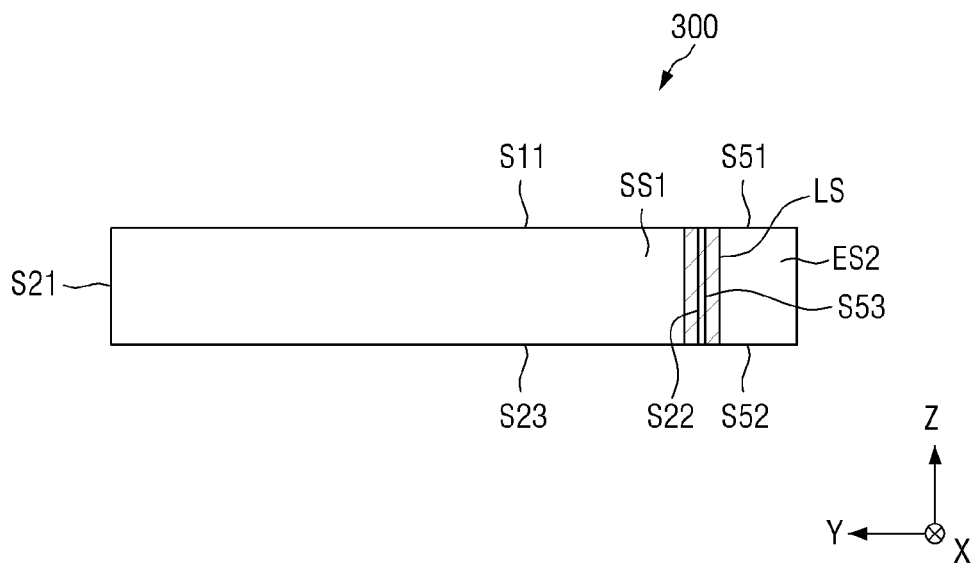

When the first flat surface PS1 includes the corners C11 through C14, a length of the first flat surface PS1 in the second direction (Y-axis direction) may be greater than a length of the first side surface SS1 in the second direction (Y-axis direction) and a length of the second side surface SS2 in the second direction (Y-axis direction). In this case, as illustrated in FIGS. 18 and 24, the second side S22 of the first side surface SS1 may face the third side S53 of the second extension part ES2 in the left side view of the display panel 300. In FIG. 24, a gap is defined between the second side S22 of the first side surface SS1 and the third side S53 of the second extension part ES2. However, the second side S22 of the first side surface SS1 may also contact the third side S53 of the second extension part ES2. An area in which the second side S22 of the first side surface SS1 and the third side S53 of the second extension part ES2 face each other may overlap a light blocking part LS of a cover window 100, Accordingly, the area in which the second side S22 of the first side surface SS1 and the third side S53 of the second extension part ES2 face each other may be covered by the light blocking part LS of the cover window 100 so that it is not visible from the outside.

Figure 25:
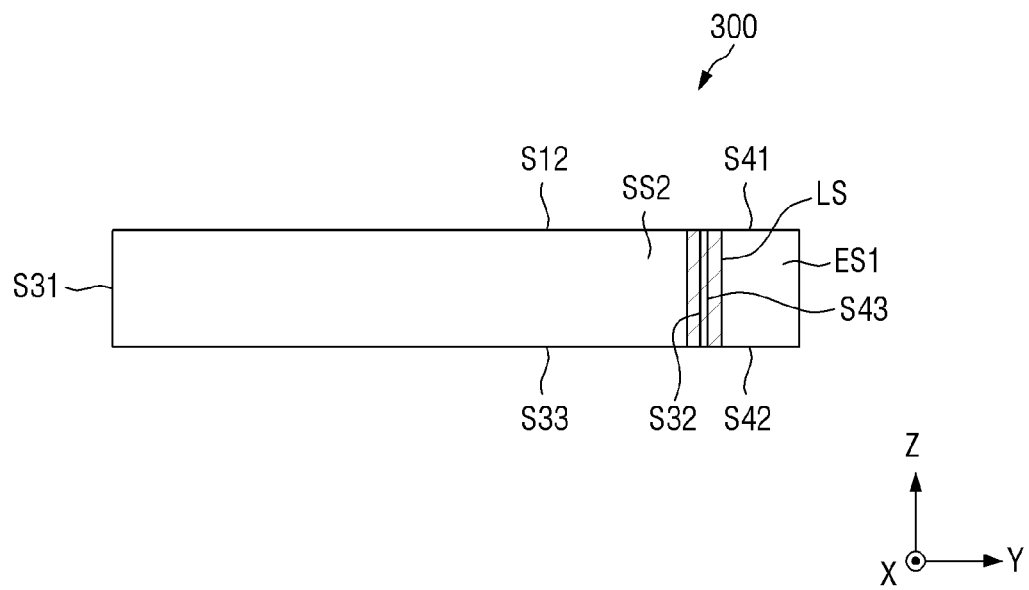

As illustrated in FIGS. 18 and 25, the second side S32 of the second side surface SS2 may face the third side S43 of the first extension part ES1 in the right side view of the display panel 300. In FIG. 25, a gap is between the second side S32 of the second side surface SS2 and the third side S43 of the first extension part ES1. However, the second side S32 of the second side surface SS2 may also contact the third side S43 of the first extension part ES1. An area in which the second side S32 of the second side surface SS2 and the third side S43 of the first extension part ES1 face each other may overlap the light blocking part LS of the cover window 100. Accordingly, the area in which the second side S32 of the second side surface SS2 and the third side S43 of the first extension part ES1 face each other may be covered by the light blocking part LS of the cover window 100 so that it is not visible from the outside.

A scan driver 330 may be formed or provided along the second side S22 of the first side surface SS1 and the third corner C13 and the fourth side S14 of the first flat surface PS1 as illustrated in FIG. 18. Although the scan driver 330 is curved with a curvature corresponding to the third corner C13 of the first flat surface PS1 in FIG. 18, the invention is not limited thereto. The scan driver 330 may also be formed or provided in a straight line in an area corresponding to the third corner C13 of the first flat surface PS1.

Figure 22:
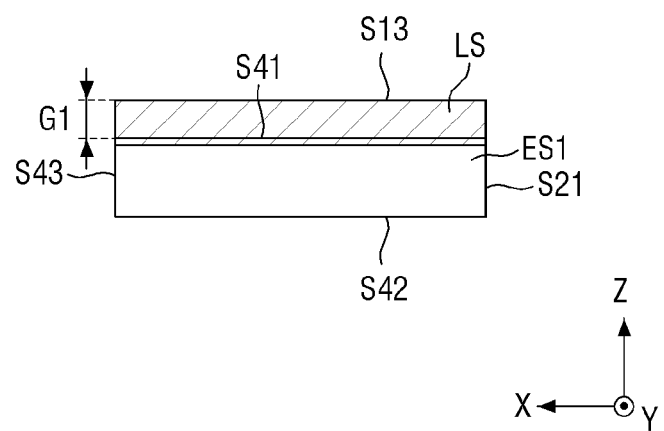

Since the first extension surface ES1 is bent in the first direction (X-axis direction) from the first side S21 of the first side surface SS1, a large stress may be applied to the first side S21 of the first side surface SS1 by a bending force of the first extension surface ES1. In order to reduce the stress applied to the first side S21 of the first side surface SS1 by the bending force of the first extension surface ES1, the length L2 of the third side S43 of the first extension part ES1 may be smaller than the length L1 of each of the first side S21 and the second side S22 of the first side surface SS1. In this case, as illustrated in FIGS. 18 and 22, a first gap G1 may be defined between a first side S41 of the first extension part ES1 and the third side S13 of the first flat surface PS1 in the front view of the display panel 300. The first gap G1 may overlap the light blocking part LS of the cover window 100. Accordingly, the first gap G1 may be covered by the light blocking part LS of the cover window 100 so that it is not visible from the outside.

Figure 23:
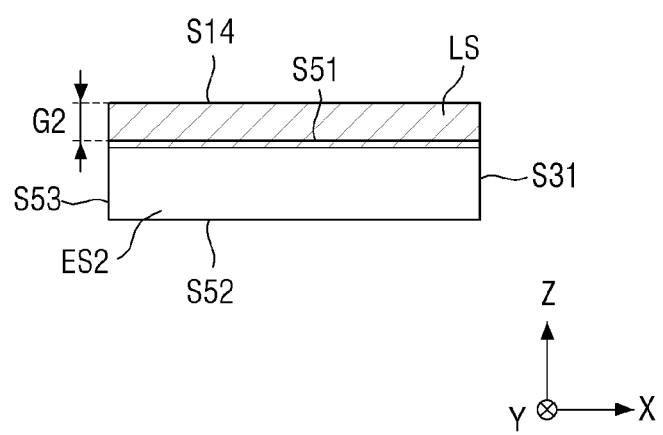

Since the second extension surface ES2 is bent in the first direction (X-axis direction) from the first side S31 of the second side surface SS2, a large stress may be applied to the first side S31 of the second side surface SS2 by a bending force of the second extension surface ES2, In order to reduce the stress applied to the first side S31 of the second side surface SS2 by the bending force of the second extension surface ES2, the length L4 of the third side S53 of the second extension part ES2 may be smaller than the length L3 of each of the first side S31 and the second side S32 of the second side surface SS2. In this case, as illustrated in FIGS. 18 and 23, a second gap G2 may be defined between a first side S51 of the second extension part ES2 and the fourth side S14 of the first flat surface PS1 in the rear view of the display panel 300. The second gap G2 may overlap the light blocking part LS of the cover window 100. Accordingly, the second gap G2 may be covered by the light blocking part LS of the cover window 100 so that it is not visible from the outside. A length of the first gap G1 and a length of the second gap G2 may be substantially the same.

In FIGS. 18 and 19 through 25, the first side surface S51 protrudes further in the second direction (Y-axis direction) than a first contact point CP11 between the first corner C11 and the first side S11 of the first flat surface PS1, and the first side S21 of the first side surface SS1 is formed or provided side by side with the third side S13 of the first flat surface PS1 in the first direction (X-axis direction). However, the invention is not limited thereto. The first side S21 of the first side surface SS1 may also be disposed between the first contact point CP11 and the third side S13 of the first flat surface PS1.

Figure 19:
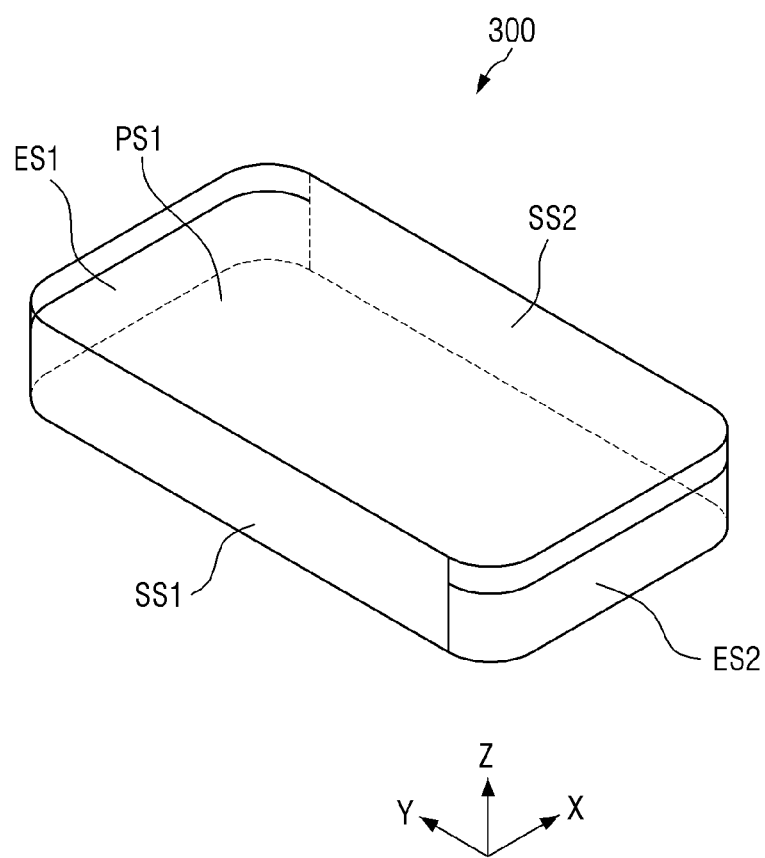
FIGS. 19 through 25 are a perspective view, a plan view, a bottom view, a front view, a rear view, a left side view, and a right side view of the display panel of FIG. 18.
Figure 20:
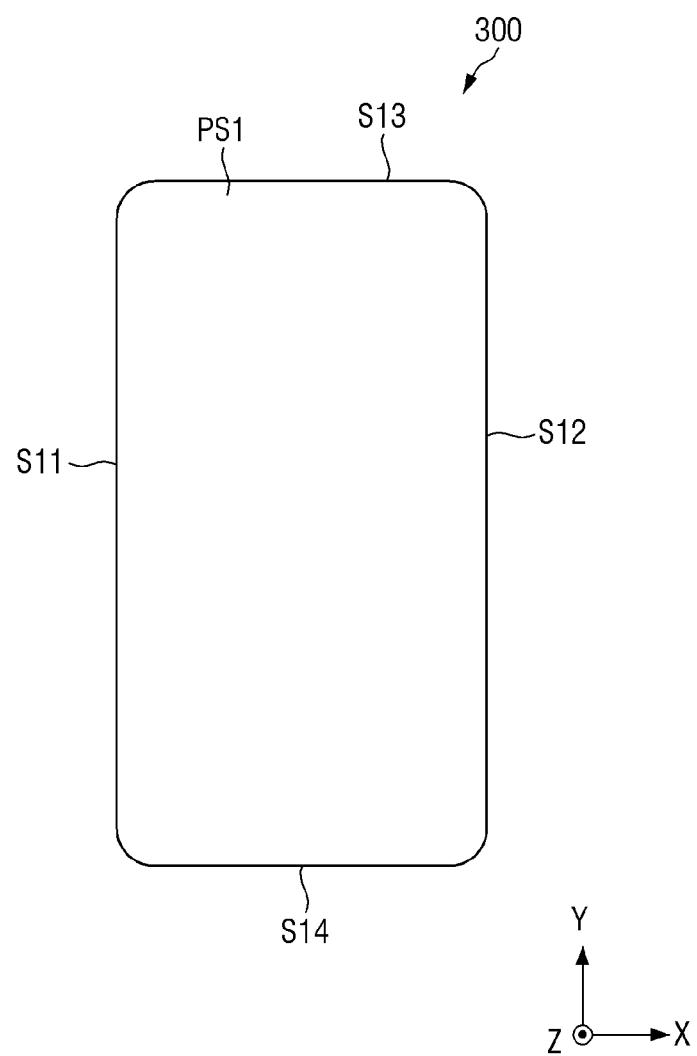
Figure 21:
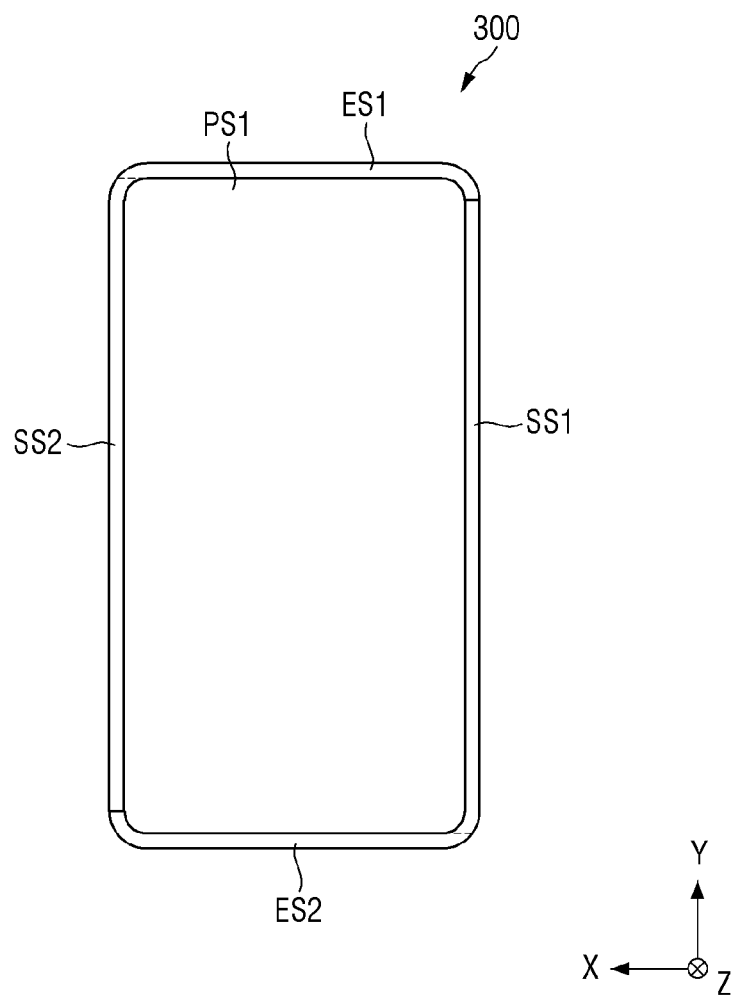

It should be noted that the light blocking part LS of the cover window 100 is illustrated only in FIGS. 22 through 25 and is not illustrated in FIGS. 18 and 19 for ease of description.

According to the embodiment illustrated in FIGS. 18 and 19 through 25, the length L2 of the third side S43 of the first extension part ES1 may be smaller than the length L1 of each of the first side S21 and the second side S22 of the first side surface SS1, and the length L4 of the third side S53 of the second extension part ES2 may be smaller than the length L3 of each of the first side S31 and the second side S32 of the second side surface SS2. Therefore, the stress applied to the first side S21 of the first side surface SS1 by the bending force of the first extension surface ES1 and the stress applied to the first side S31 of the second side surface SS2 by the bending force of the second extension surface ES2 may be reduced. In addition, the first extension surface ES1 and the second extension surface ES2 may be more easily bent in the first direction (X-axis direction).

Figure 26A:
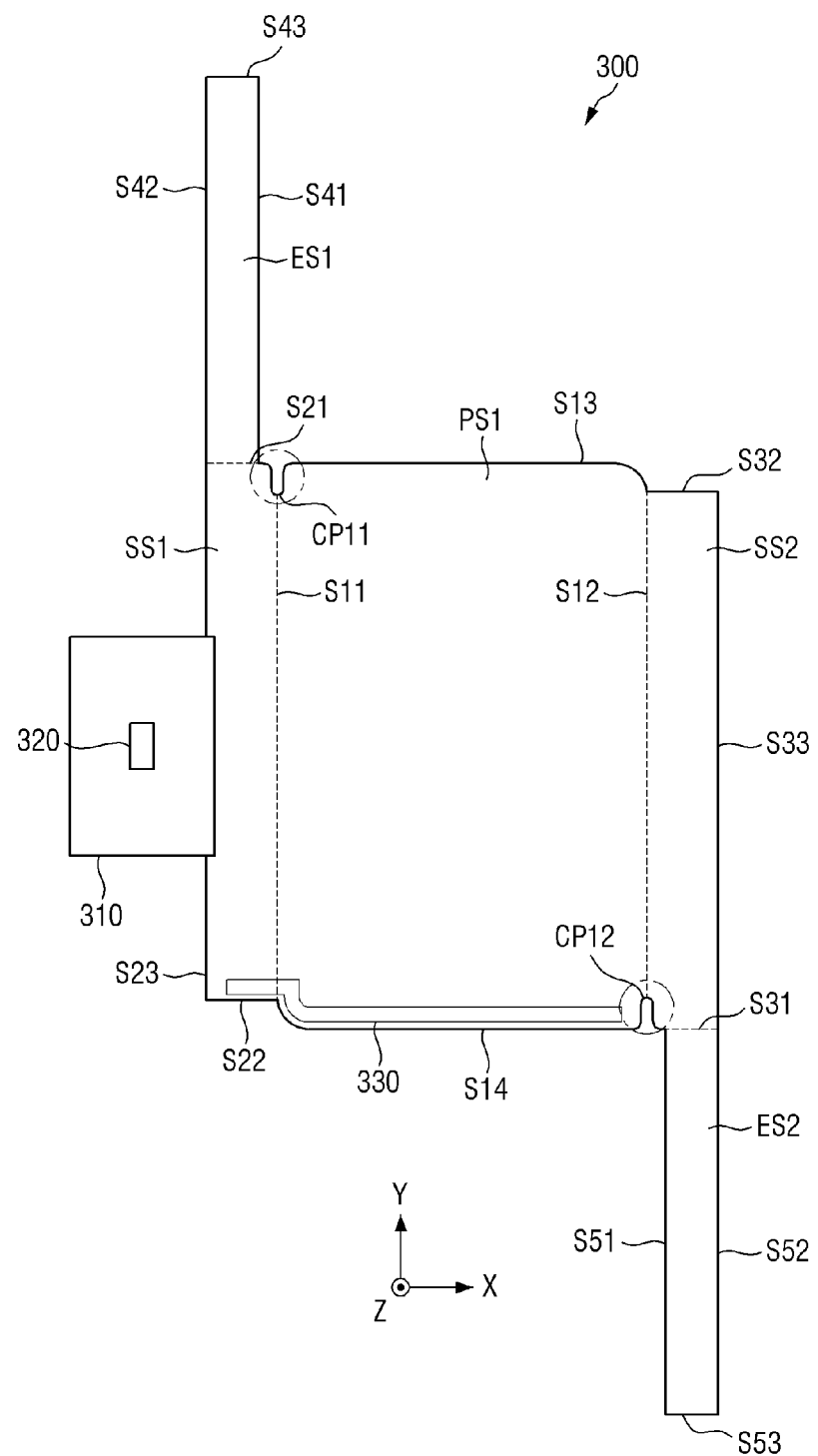
FIG. 26A is a development drawing of an embodiment of a display panel.
Figure 26B:
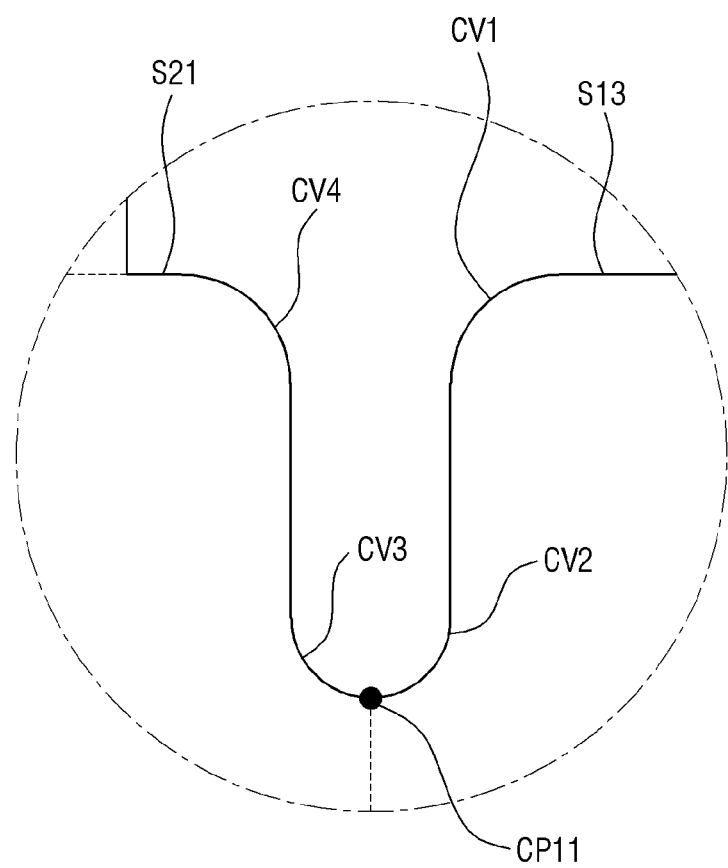
FIGS. 26B and 26C are enlarged views of respective portions of the embodiment of the display panel of FIG. 26A.
Figure 26C:
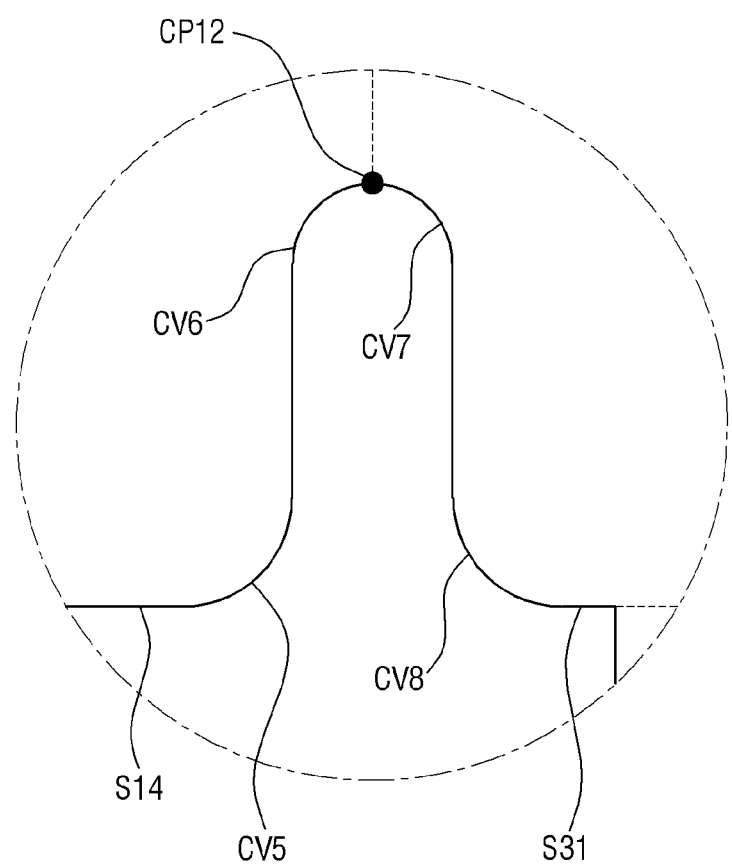
Figure 27:
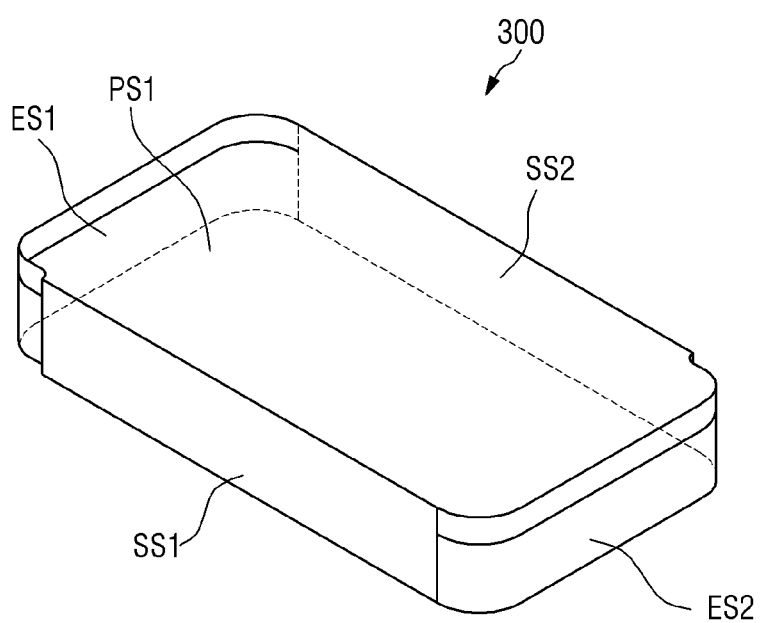
FIGS. 27 through 33 are a perspective view, a plan view, a bottom view, a front view, a rear view, a left side view, and a right side view of the display panel of FIG. 26A.
Figure 28:
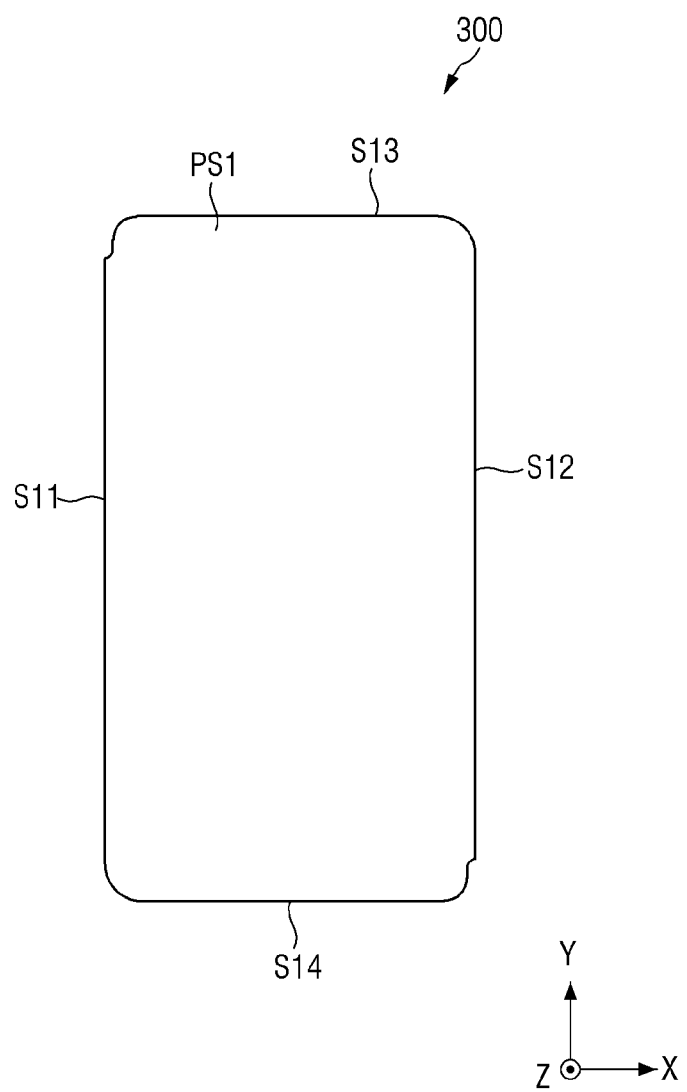
Figure 29:
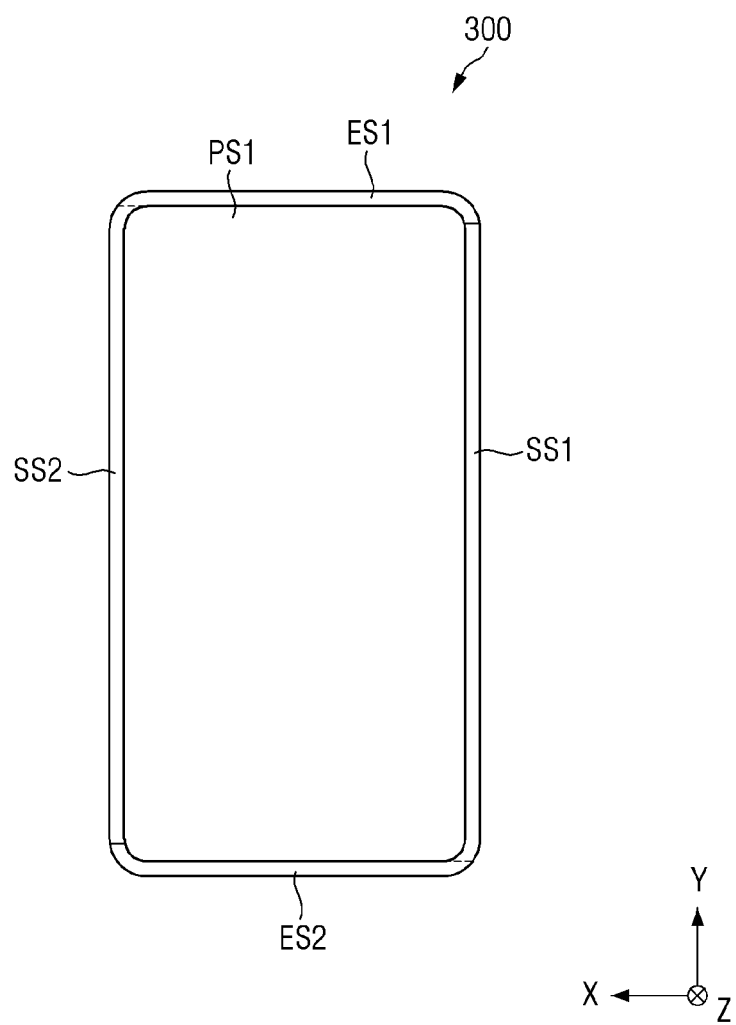
Figure 30:
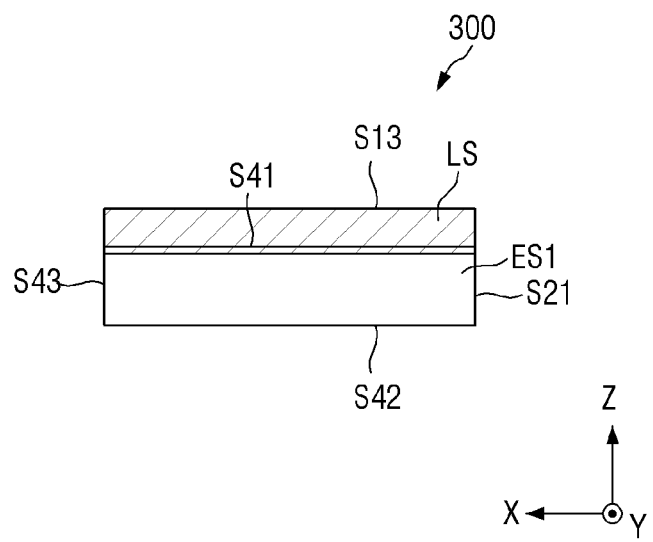
Figure 31:
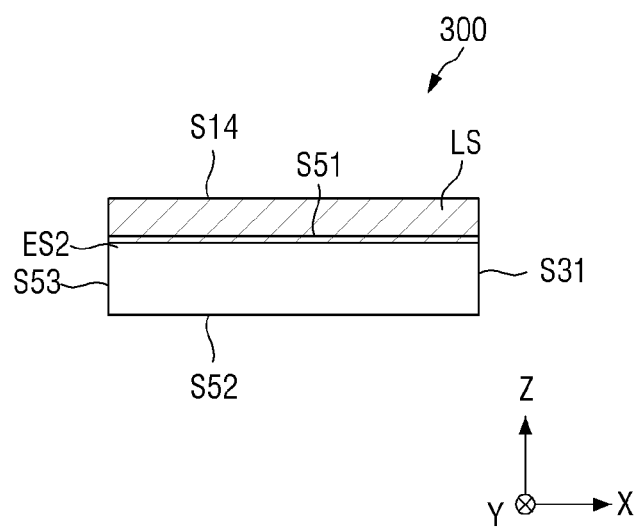
Figure 32:
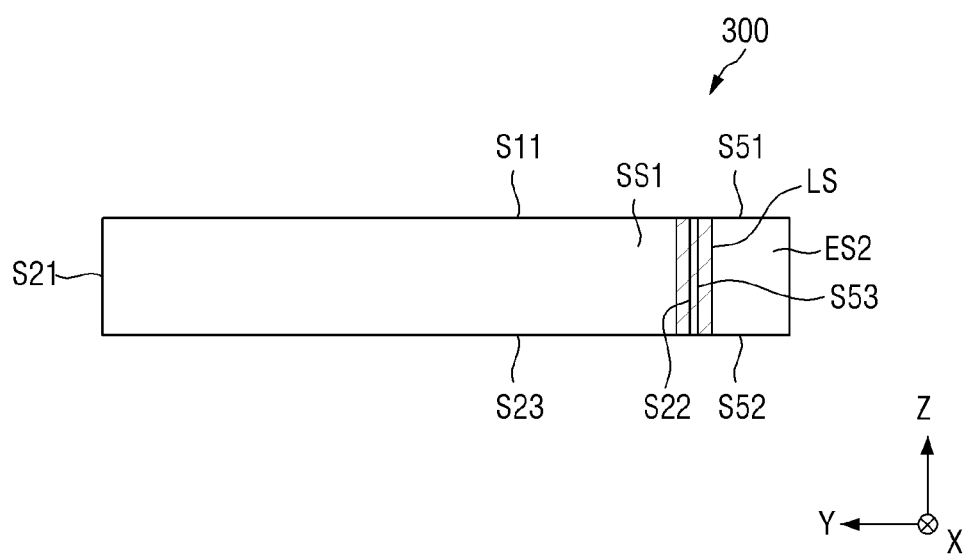
Figure 33:
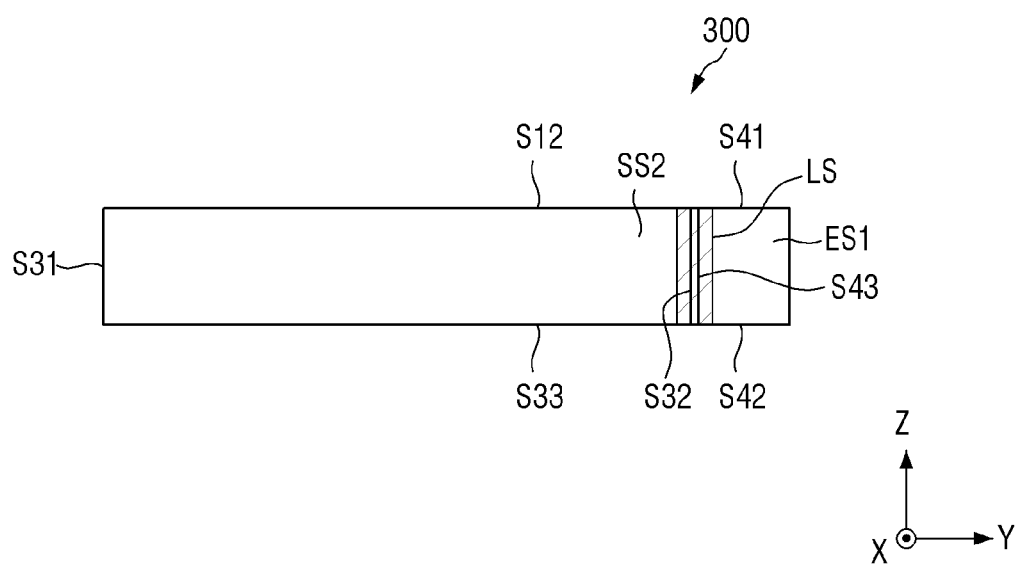

FIG. 26A is a development drawing of another embodiment of a display panel, and FIGS. 26B and 26C are enlarged views of respective portions of the embodiment of the display panel of FIG. 26A. FIGS. 27 through 33 are a perspective view, a plan view, a bottom view, a front view, a rear view, a left side view, and a right side view of the display panel of FIG. 26A.

The embodiment illustrated in FIGS. 26A, 26B, 26C and 27 through 33 is different from the embodiment illustrated in FIGS. 18 and 19 through 25 in that an area between a first side S11 and a third side S13 of a first flat surface PS1 and an area between the first side S11 of the first flat surface PS1 and a first side S21 of a first side surface S51 have a compound curvature, and an area between a second side S12 and a fourth side S14 of the first flat surface PS1 and an area between the second side S12 of the first flat surface PS1 and a first side S31 of a second side surface SS2 have a compound curvature. Therefore, in FIGS. 26A, 26B, 26C and 27 through 33, the description already provided in the embodiment illustrated in FIGS. 18 and 19 through 25 will not be repeated.

Referring to FIGS. 26A, 26B, 26C and 27 through 33, since a first extension surface ES1 is bent in the first direction (X-axis direction) from the first side S21 of the first side surface SS1, a first contact point CP11 disposed between the first side S11 and the third side S13 of the first flat surface PS1 may be subjected to the greatest stress by a bending force of the first extension surface ES1. In order to reduce the stress applied to the first contact point CP11, an area between the third side S13 of the first flat surface PS1 and the first contact point CP11 and an area between the first side S21 of the first side surface SS1 and the first contact point CP11 may be rounded.

Specifically, a first curvature portion CV1 curved with a first curvature from the third side S13 of the first flat surface PS1 and a second curvature portion CV2 curved with a second curvature between the first curvature portion CV1 and the first contact point CP11 may be formed or provided between the third side S13 of the first flat surface PS1 and the first contact point CP11. Here, a tangent line to the first curvature portion CV1 may have a greater positive slope from the third side S13 of the first flat surface PS1 toward the second curvature portion CV2. A tangent line to the second curvature portion CV2 may have a smaller positive slope from the first curvature portion CV1 toward the first contact point CP11.

A third curvature portion CV3 curved with a third curvature and a fourth curvature portion CV4 curved with a fourth curvature between the third curvature portion CV3 and the first side S21 of the first side surface SS1 may be included between the first contact point CP11 and the first side S21 of the first side surface SS1. Here, a tangent line to the third curvature portion CV3 may have a greater negative slope from the first contact point CP11 toward the fourth curvature portion CV4. A tangent line to the fourth curvature portion CV4 may have a smaller negative slope from the third curvature portion CV3 toward the first side S21 of the first side surface SS1.

In addition, since a second extension surface ES2 is bent in the first direction (X-axis direction) from the first side S31 of the second side surface SS2, a second contact point CP12 disposed between the second side S12 and the fourth side S14 of the first flat surface PS1 may be subjected to the greatest stress by a bending force of the second extension surface ES2. In order to reduce the stress applied to the second contact point CP12, an area between the fourth side S14 of the first flat surface PS1 and the second contact point CP12 and an area between the first side S31 of the second side surface SS2 and the second contact point CP12 may be rounded. In an embodiment, a compound curvature portion having a compound curvature may be formed or provided between the fourth side S14 of the first flat surface PS1 and the first contact point CP11 and between the first side S31 of the second side surface SS2 and the first contact point CP11, for example.

Specifically, a fifth curvature portion CV5 curved with a fifth curvature from the fourth side S14 of the first flat surface PS1 and a sixth curvature portion CV6 curved with a sixth curvature between the fifth curvature portion CV5 and the second contact point CP12 may be included between the fourth side S14 of the first flat surface PS1 and the second contact point CP12. The fifth curvature may be substantially the same as the first curvature, and the sixth curvature may be substantially the same as the second curvature, but the invention is not limited thereto. Here, a tangent line to the fifth curvature portion CV5 may have a greater positive slope from the fourth side S14 of the first flat surface PS1 toward the sixth curvature portion CV6. A tangent line to the sixth curvature portion CV6 may have a smaller positive slope from the fifth curvature portion CV5 toward the second contact point CP12.

A seventh curvature portion CV7 curved with a seventh curvature between the second contact point CP12 and the first side S31 of the second side surface SS2 and an eighth curvature portion CV8 curved with an eighth curvature between the seventh curvature portion CV7 and the first side S31 of the second side surface SS2 may be included between the second contact point CP12 and the first side S31 of the second side surface SS2. Here, a tangent line to the seventh curvature portion CV7 may have a greater negative slope from the second contact point CP12 toward the eighth curvature portion CV8. A tangent line to the eighth curvature portion CV5 may have a smaller negative slope from the seventh curvature portion CV7 toward the first side S31 of the second side surface SS2.

According to the embodiment illustrated in FIGS. 26A, 26B, 26C and 27 through 33, a compound curvature portion may be formed or provided between the third side S13 of the first flat surface PS1 and the first contact point CP11 and between the first side S21 of the first side surface SS1 and the first contact point CP11, and a compound curvature portion may be formed or provided between the fourth side S14 of the first flat surface PS1 and the second contact point CP12 and between the first side S31 of the second side surface SS2 and the second contact point CP12. The stress applied to the first contact point CP11 by the bending force of the first extension surface ES1 and the stress applied to the second contact point CP12 by the bending force of the second extension surface ES2 may be reduced. In addition, the first extension surface ES1 and the second extension surface ES2 may be more easily bent in the first direction (X-axis direction).

Figure 34:
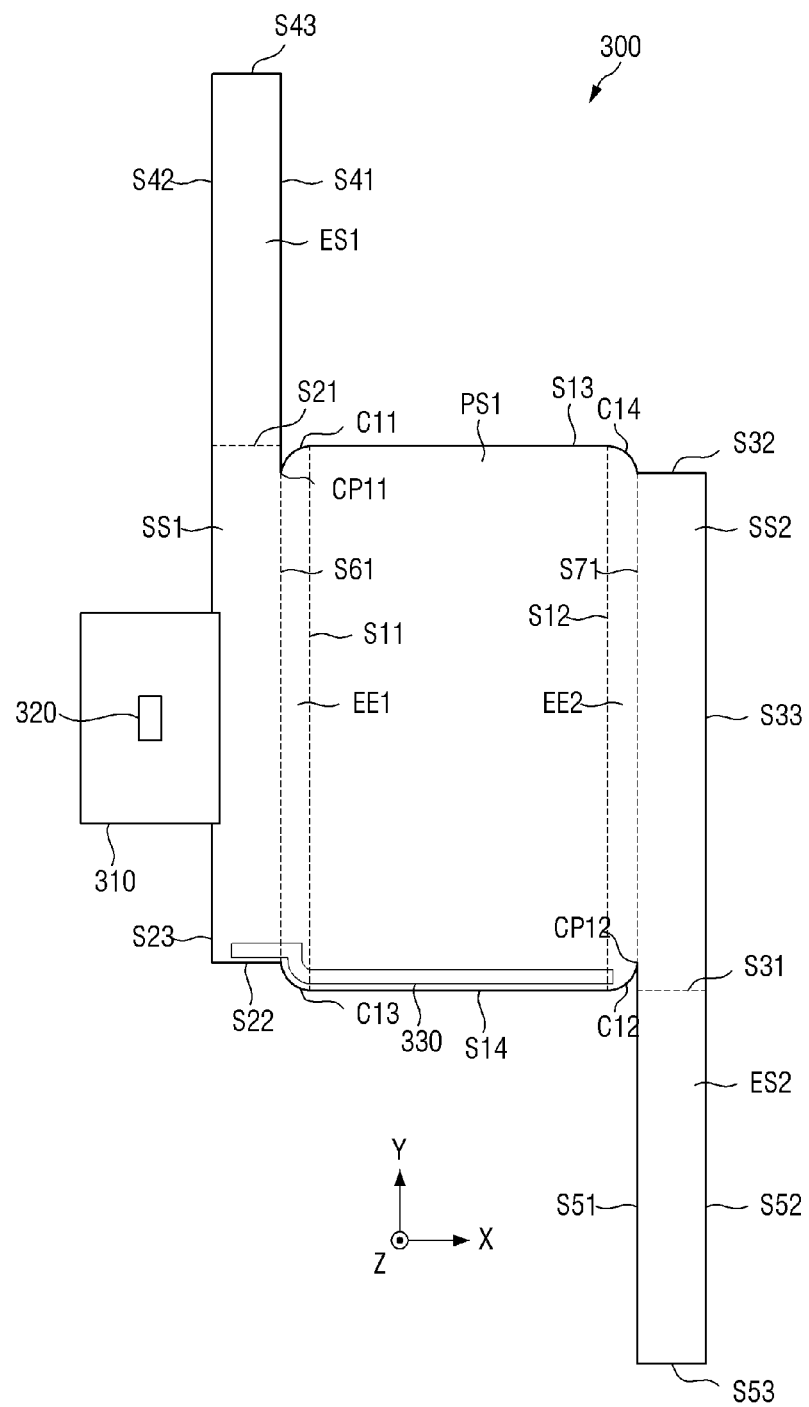
FIG. 34 is a development drawing of an embodiment of a display panel.
Figure 36:
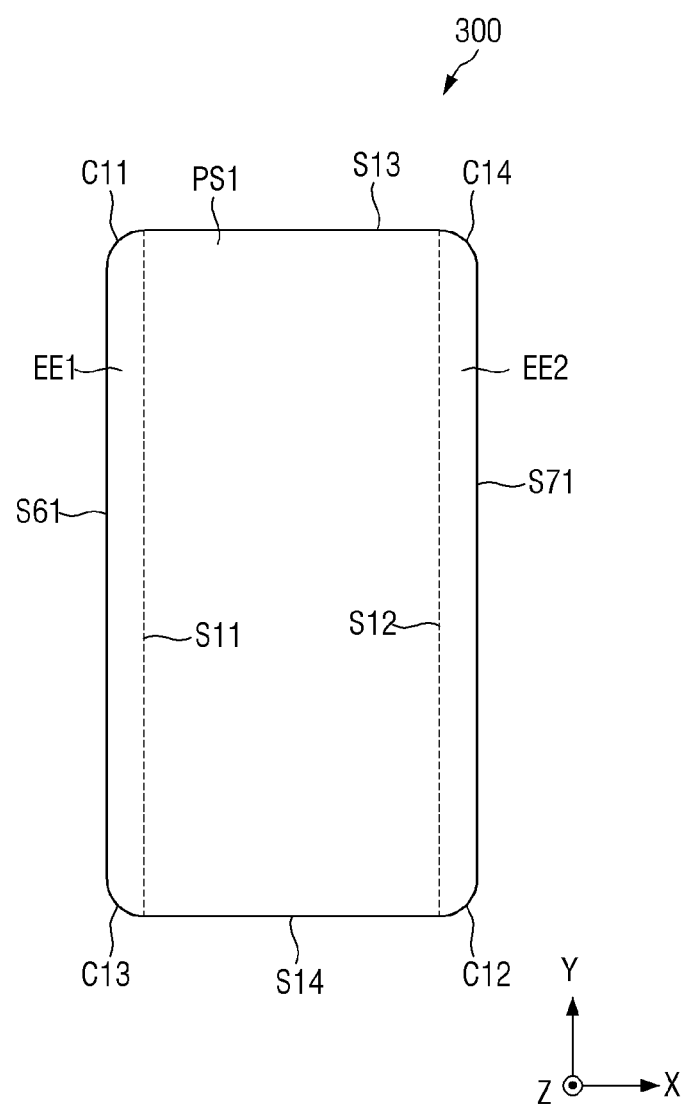
Figure 37:
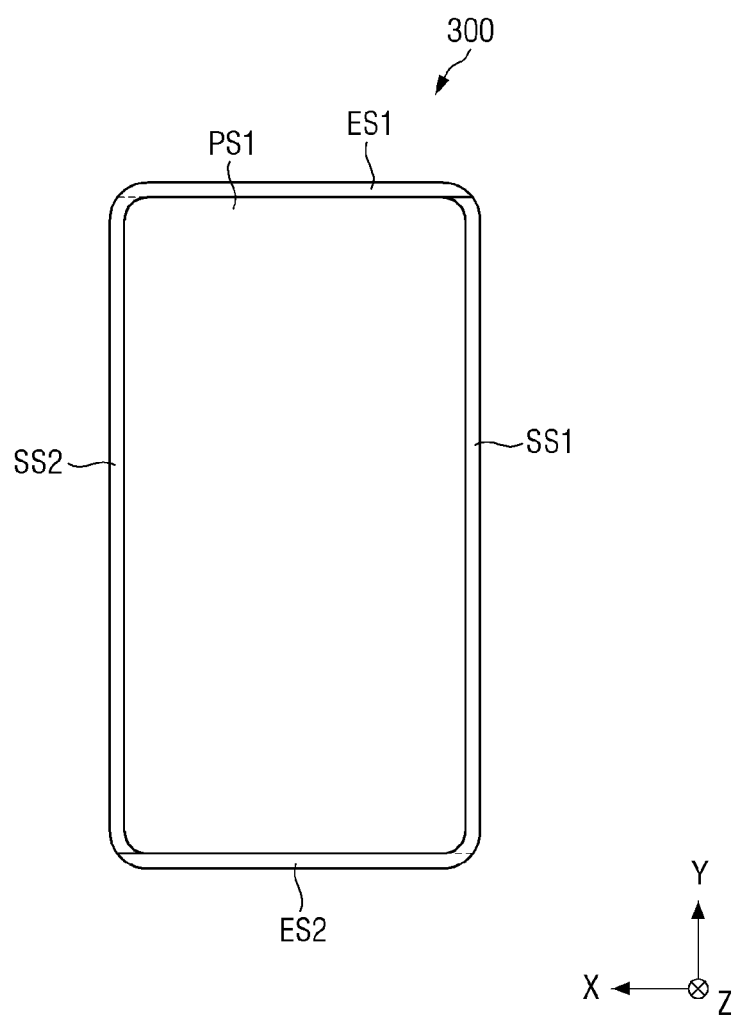
Figure 38:
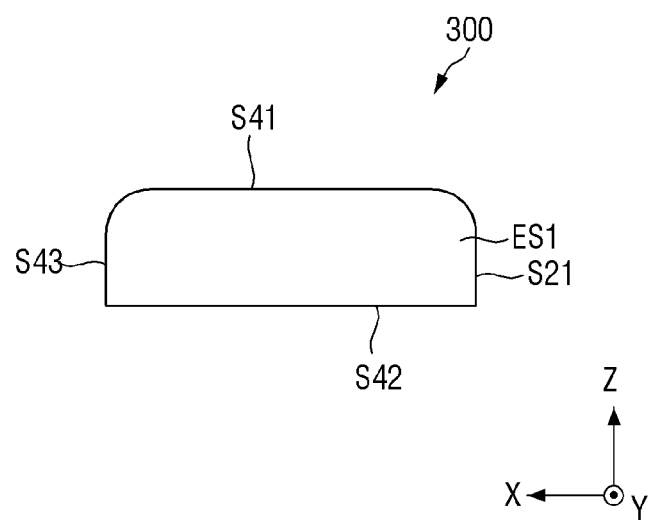
Figure 39:
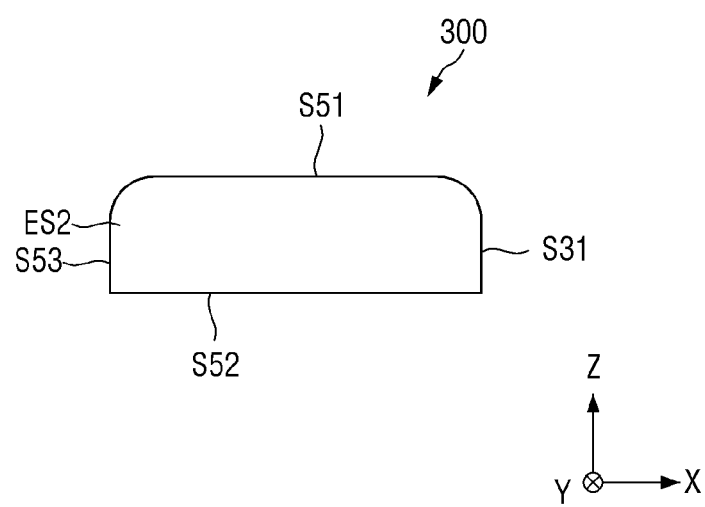

FIG. 34 is a development drawing of another embodiment of a display panel. FIGS. 35 through 41 are a perspective view, a plan view, a bottom view, a front view, a rear view, a left side view, and a right side view of the display panel of FIG. 34.

The embodiment illustrated in FIGS. 34 and 35 through 41 is different from the embodiment illustrated in FIGS. 4 and 5 through 11 in that the display panel 300 further includes a first edge surface EE1 disposed between a first flat surface PS1 and a first side surface SS1 and a second edge surface EE2 disposed between the first flat surface PS1 and a second side surface SS2 and that corners C through C14 of the first flat surface PS1 are rounded with a predetermined curvature. Therefore, in FIGS. 34 and 35 through 41, the description already provided in the embodiment illustrated in FIGS. 4 and 5 through 11 will not be repeated.

Referring to FIGS. 34 and 35 through 41, the first edge surface EE1 may be disposed between the first flat surface PS1 and the first side surface SS1. The first edge surface EE1 may be bent from a first side S11 of the first flat surface PS1. In this case, an angle defined by the first edge surface EE1 and the first flat surface PS1 may be 90 degrees or less. The first side surface SS1 may be bent in the third direction (Z-axis direction) from a first side S61 of the first edge surface EE1. In this case, an angle defined by the first edge surface EE1 and the first side surface SS1 may be 90 degrees or less.

The first edge surface EE1 may include the first side S61, a first corner C11 and a third corner C13 and may share the first side S11 of the first flat surface PS1 as one side with the first flat surface PS1. The first side S61 of the first edge surface EE1 and the first side S11 of the first flat surface PS1 may be parallel to each other. The first corner C11 may be disposed between a third side S13 of the first flat surface PS1 and the first side S61 of the first edge surface EE1 and may be rounded with a predetermined curvature. The third corner C13 may be disposed between a fourth side S14 of the first flat surface PS1 and the first side S61 of the first edge surface EE1 and may be rounded with a predetermined curvature. In this case, a length of the first side S11 of the first flat surface PS1 may be greater than a length of the first side S61 of the first edge surface EE1.

When the first edge surface EE1 is provided between the first flat surface PS1 and the first side surface SS1, an angle at which a first extension surface ES1 is bent from a first side S21 of the first side surface SS1 may be reduced. Accordingly, stress applied to the first side S21 of the first side surface SS1 by a bending force of the first extension surface ES1 may be reduced. Therefore, even when a length L2 (refer to FIG. 18) of a third side S43 of the first extension part ES1 is not made to be smaller than a length L1 (refer to FIG. 18) of each of the first side S21 and a second side S22 of the first side surface SS1 to reduce the stress applied to the first side S21 of the first side surface SS1 as in the embodiment illustrated in FIG. 18, the first extension surface ES1 may be easily bent in the first direction (X-axis direction).

The second edge surface EE2 may be disposed between the first flat surface PS1 and the second side surface SS2. The second edge surface EE2 may be bent from a first side S12 of the first flat surface PS1. In this case, an angle defined by the second edge surface EE2 and the first flat surface PS1 may be 90 degrees or less. The second side surface SS2 may be bent in the third direction (Z-axis direction) from a first side S71 of the second edge surface EE2. In this case, an angle defined by the second edge surface EE2 and the second side surface SS2 may be 90 degrees or less.

The second edge surface EE2 may include the first side S71, a second corner C12 and a fourth corner C14 and may share the second side S12 of the first flat surface PST as one side with the first flat surface PS1. The first side S71 of the second edge surface EE2 and the second side S12 of the first flat surface PS1 may be parallel to each other. The second corner C12 may be disposed between the fourth side S14 of the first flat surface PS1 and the first side S71 of the second edge surface EE2 and may be rounded with a predetermined curvature. The fourth corner C14 may be disposed between the third side S13 of the first flat surface PS1 and the first side S71 of the second edge surface EE2 and may be rounded with a predetermined curvature. In this case, a length of the second side S12 of the first flat surface PS1 may be greater than a length of the first side S71 of the second edge surface EE2.

When the second edge surface EE2 is provided between the first flat surface PS1 and the second side surface SS2, an angle at which a second extension surface ES2 is bent from a first side S31 of the second side surface SS2 may, be reduced. Accordingly, stress applied to the first side S31 of the second side surface SS2 by a bending force of the second extension surface ES2 may be reduced. Therefore, even when a length L4 (refer to FIG. 18) of a third side S53 of the second extension part ES2 is not made to be smaller than a length L3 (refer to FIG. 18) of each of the first side S31 and a second side S32 of the second side surface SS2 to reduce the stress applied to the first side S31 of the second side surface SS2 as in the embodiment illustrated in FIG. 18, the second extension surface ES2 may be easily bent in the first direction (X-axis direction).

Figure 40:
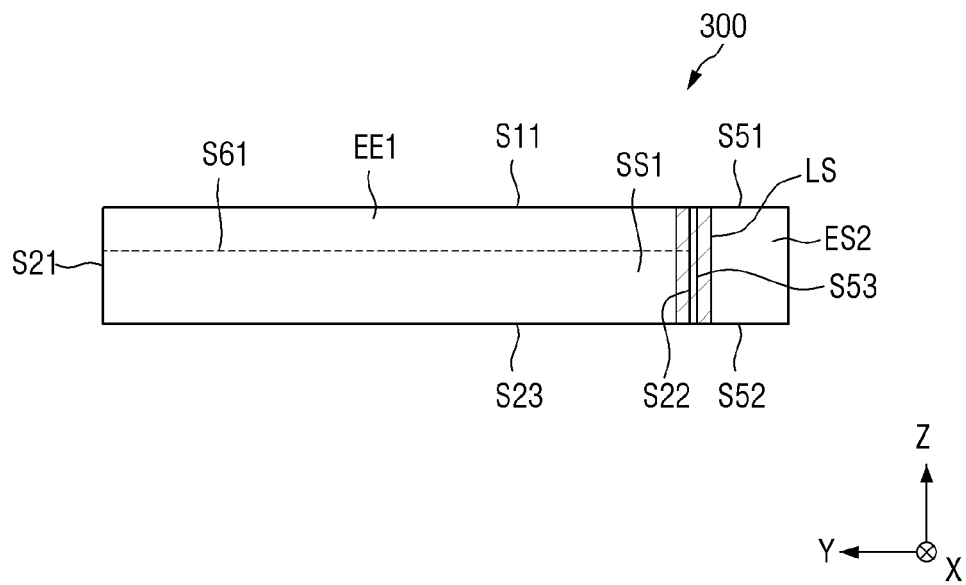

When the first flat surface PS1 includes the corners C11 through C14, a length of the first flat surface PS1 in the second direction (Y-axis direction) may, be greater than a length of the first side surface SS1 in the second direction (Y-axis direction and a length of the second side surface SS2 in the second direction (Y-axis direction). In this case, as illustrated in FIGS. 34 and 40, the second side S22 of the first side surface SS1 may face the third side S53 of the second extension part ES2 in the left side view of the display panel 300. In FIG. 40, a gap is defined between the second side S22 of the first side surface SS1 and the third side S53 of the second extension part ES2. However, the second side S22 of the first side surface SS1 may also contact the third side S53 of the second extension part ES2. An area in which the second side S22 of the first side surface SS1 and the third side S53 of the second extension part ES2 face each other may overlap a light blocking part LS of a cover window 100. Accordingly, the area in which the second side S22 of the first side surface SS1 and the third side S53 of the second extension part ES2 face each other may be covered by the light blocking past LS of the cover window 100 so that it is not visible from the outside.

Figure 41:
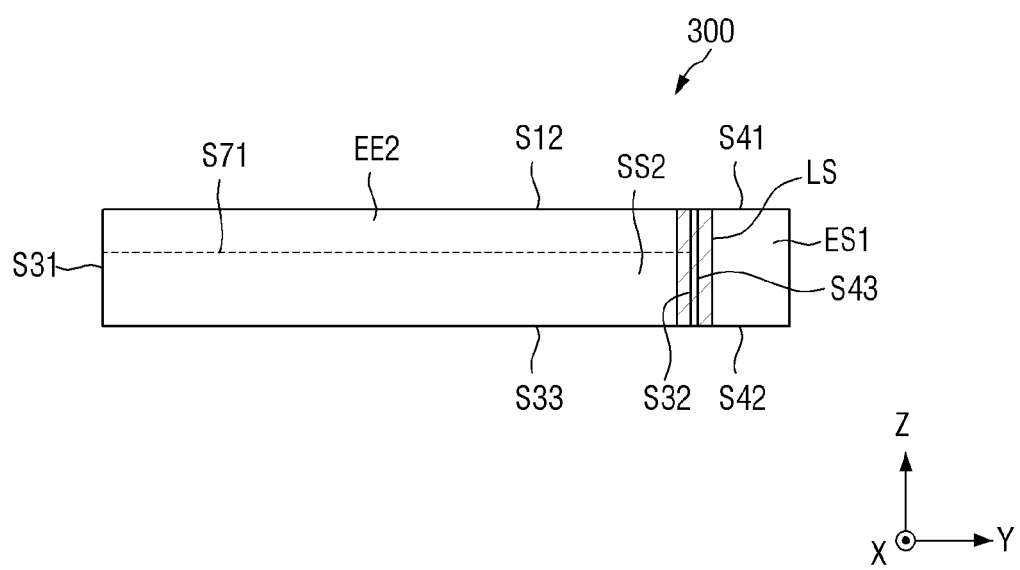

As illustrated in FIGS. 34 and 41, the second side S32 of the second side surface SS2 may face the third side S43 of the first extension part ES1 in the right side view of the display panel 300. In FIG. 41, a gap is defined between the second side S32 of the second side surface SS2 and the third side S43 of the first extension part ES1. However, the second side S32 of the second side surface SS2 may also contact the third side S43 of the first extension part ES1. An area in which the second side S32 of the second side surface S52 and the third side S43 of the first extension part ES1 face each other may overlap the light blocking part LS of the cover window 100. Accordingly, the area in which the second side S32 of the second side surface SS2 and the third side S43 of the first extension part ES1 face each other may be covered by the light blocking part LS of the cover window 100 so that it is not visible from the outside.

A scan driver 330 may be formed or provided along the second side S22 of the first side surface SS1 and the third corner C13 and the fourth side S14 of the first flat surface PS1 as illustrated in FIG. 34. Although the scan driver 330 is curved with a curvature corresponding to the third corner C13 of the first flat surface PS1 in FIG. 34, the invention is not limited thereto. The scan driver 330 may also be formed or provided in a straight line in an area corresponding to the third corner C13 of the first flat surface PS1.

It should be noted that the light blocking part LS of the cover window 100 is illustrated only in FIGS. 40 and 41 and is not illustrated in FIGS. 34 and 35 for ease of description.

According to the embodiment illustrated in FIGS. 34 and 35 through 41, the angle at which the first extension surface ES1 is bent from the first side S21 of the first side surface SS1 may be reduced by the first edge surface EE1 between the first flat surface PS1 and the first side surface SS1. In addition, the angle at which the second extension surface ES2 is bent from the first side S31 of the second side surface SS2 may be reduced by the second edge surface EE2 between the first flat surface PS1 and the second side surface SS2. Therefore, the stress applied to the first side S21 of the first side surface SS1 by the bending force of the first extension surface ES1 and the stress applied to the first side S31 of the second side surface SS2 by the bending force of the second extension surface ES2 may be reduced.

Figure 42:
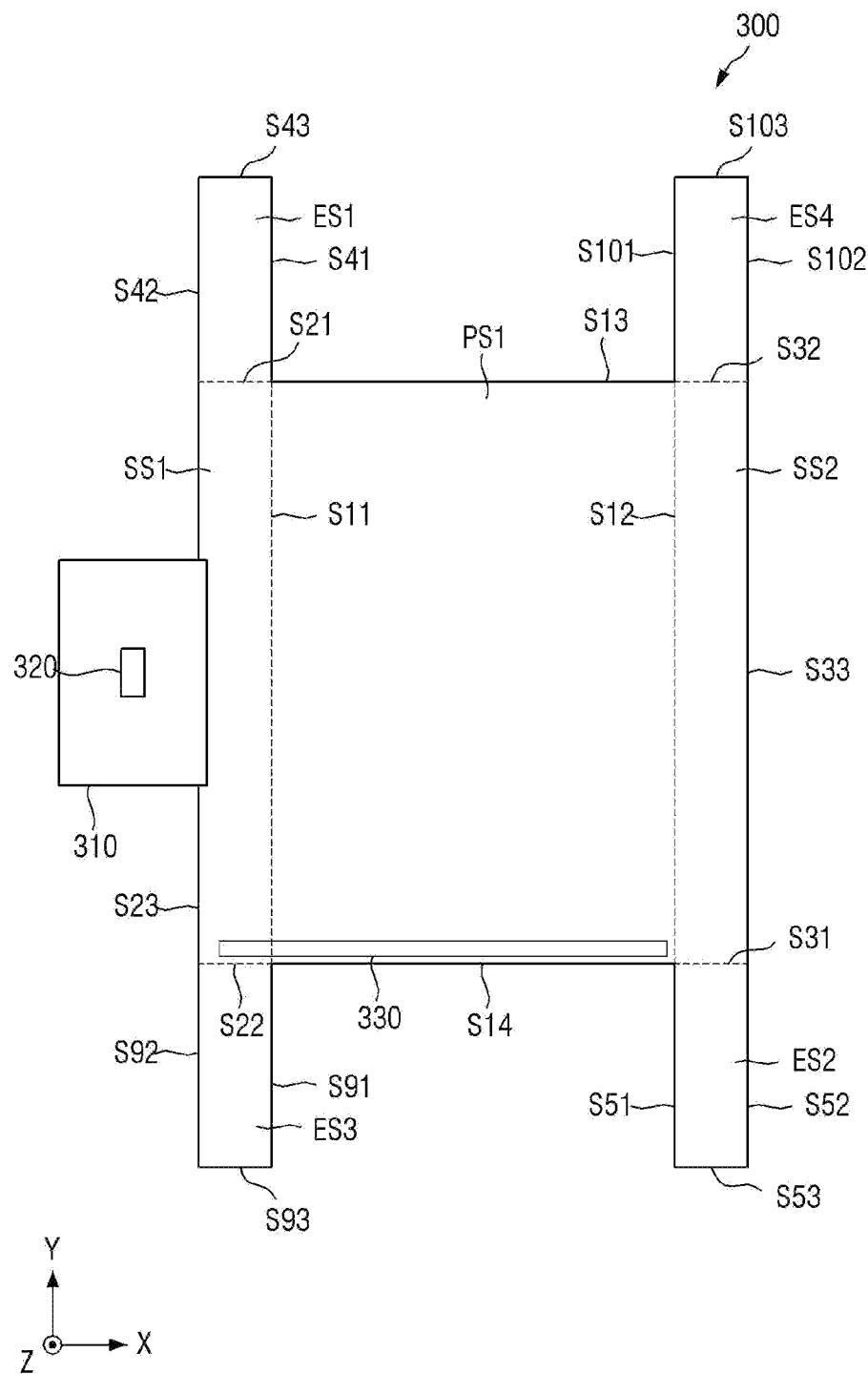
FIG. 42 is a development drawing of an embodiment of a display panel.

FIG. 42 is a development drawing of another embodiment of a display panel. FIGS. 43 through 49 are a perspective view, a plan view, a bottom view, a front view, a rear view, a left side view, and a right side view of the display panel of FIG. 42.

The embodiment illustrated in FIGS. 42 and 43 through 49 is different from the embodiment illustrated in FIGS. 4 and 5 through 11 in that the display panel 300 further includes a third extension surface ES3 extending from a second side S22 of a first side surface SS1 and a fourth extension surface ES4 extending from a second side S32 of a second side surface SS2. Therefore, in FIGS. 42 and 43 through 49, the description already provided in the embodiment illustrated in FIGS. 4 and 5 through 11 will not be repeated.

Referring to FIGS. 42 and 43 through 49, the third extension surface ES3 may extend from the second side S22 of the first side surface SS1. The third extension surface ES3 may include a first side S91, a second side S92 and a third side S93 and may share the second side S22 of the first side surface SS1 as one side with the first side surface SST. The first side S91 and the second side S92 of the third extension surface ES3 may be parallel to each other and may be longer than the third side S93 of the third extension surface ES3.

Figure 43:
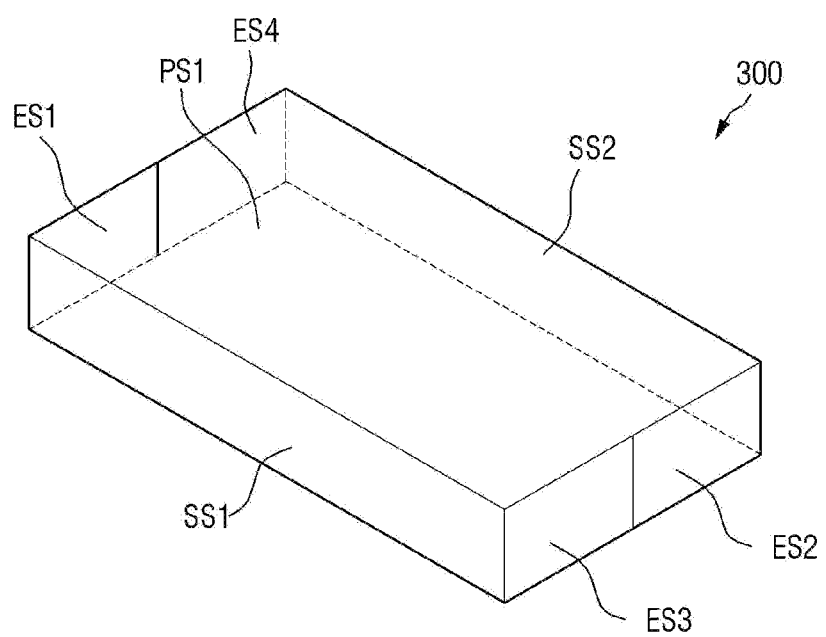
FIGS. 43 through 49 are a perspective view, a plan view, a bottom view, a front view, a rear view, a left side view, and a right side view of the display panel of FIG. 42.
Figure 44:
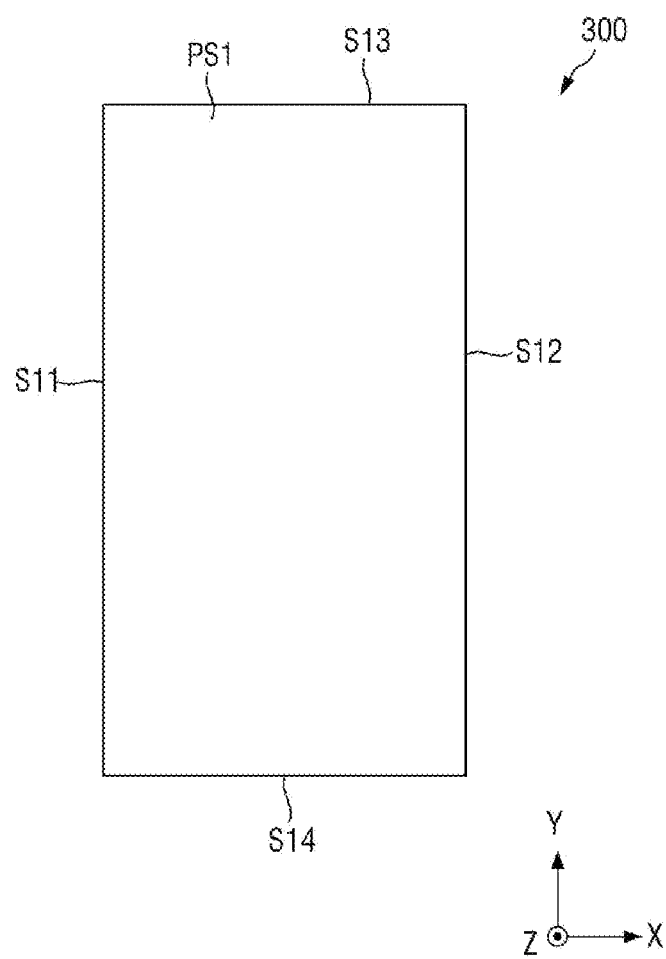
Figure 46:
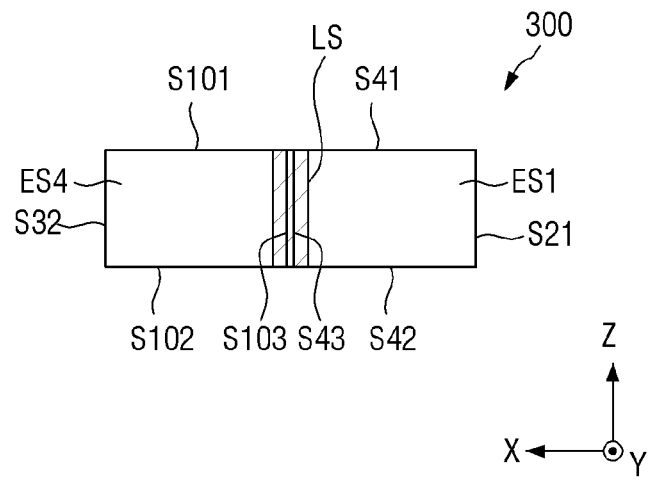

The third extension surface ES3 may be bent in the first direction (X-axis direction) from the second side S22 of the first side surface SS1. As illustrated in FIGS. 43 and 46, the third extension surface ES3 may form a lower side surface of the display panel 300 together with a second extension surface ES2. In this case, the second extension surface ES2 and the third extension surface ES3 may overlap a lower side surface DSS4 of a cover window 100.

The first side S91 of the third extension surface ES3 may face a fourth side S14 of a first flat surface PS1, and the third side S93 of the third extension surface ES3 may face a third side S53 of the second extension surface ES2. A fine gap may be defined between the first side S91 of the third extension surface ES3 and the fourth side S14 of the first flat surface PS1 and between the third side S93 of the third extension surface ES3 and the third side S53 of the second extension surface ES2. In an alternative embodiment, the first side S91 of the third extension surface ES3 and the fourth side S14 of the first flat surface PS1 may contact each other, and the third side S93 of the third extension surface ES3 and the third side S53 of the second extension surface ES2 may contact each other. An area in which the third side S93 of the third extension surface ES3 and the third side S53 of the second extension surface ES2 face each other may overlap a light blocking part LS of the cover window 100 as illustrated in FIG. 46. Accordingly, the gap between the third side S93 of the third extension surface ES3 and the third side S53 of the second extension surface ES2 may be covered by the light blocking part LS of the cover window 100 so that it is not visible from the outside.

A length of the third side S93 of the third extension surface ES3 may be substantially the same as a length of the third side S53 of the second extension surface ES2. In addition, the sum of a length of the first side S91 of the third extension surface ES3 and a length of a first side S51 of the second extension surface ES2 may be substantially the same as a length of the fourth side S14 of the first flat surface PS1 When the sum of the length of the first side S91 of the third extension surface ES3 and the length of the first side S51 of the second extension surface ES2 is smaller than the length of the fourth side S14 of the first flat surface PS1, a gap may be defined between the third side S93 of the third extension surface ES3 and the third side S53 of the second extension surface ES2.

Figure 47:
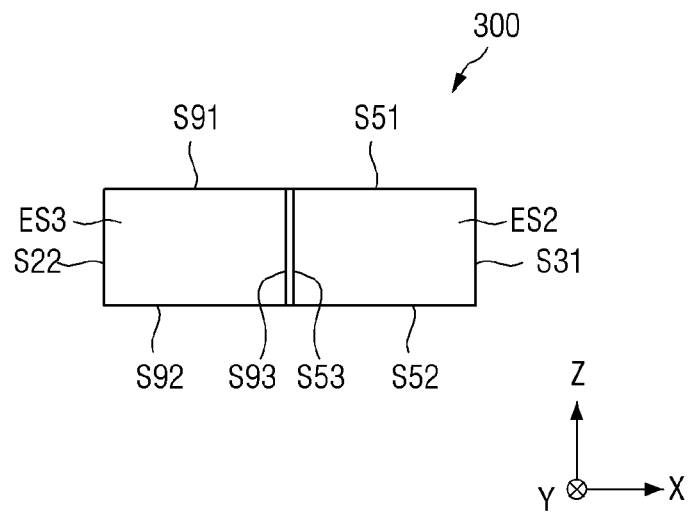
Figure 48:
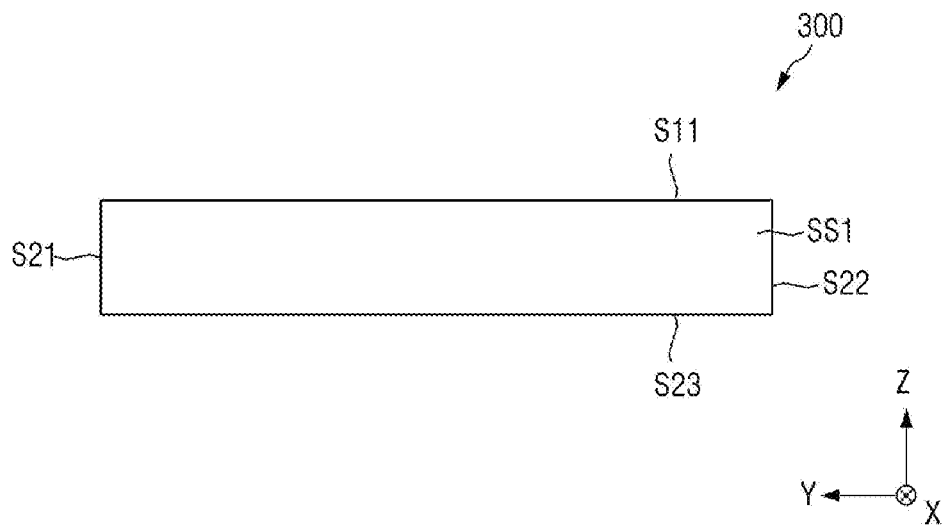
Figure 49:
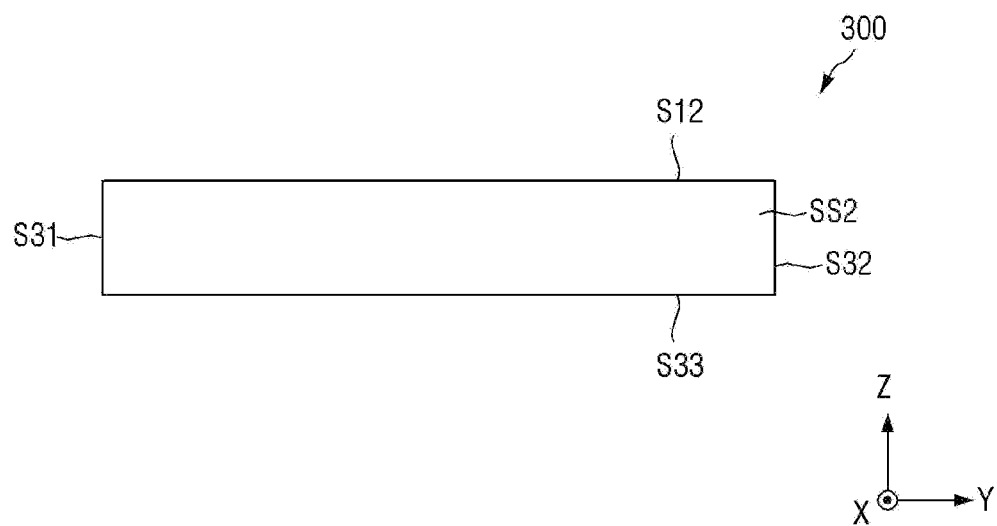

In FIGS. 43 and 47, the length of the first side S91 of the third extension surface ES3 is substantially the same as the length of the first side S51 of the second extension surface ES2. However, the invention is not limited thereto. The length of the first side S91 of the third extension surface ES3 may also be different from the length of the first side S51 of the second extension surface ES2.

The fourth extension surface ES4 may extend from the second side S32 of the second side surface SS2. The fourth extension surface ES4 may include a first side S101, a second side S102 and a third side S103 and may share the second side S32 of the second side surface SS2 as one side with the second side surface SS2. The first side S101 and the second side S102 of the fourth extension surface ES4 may be parallel to each other and may be longer than the third side S103 of the fourth extension surface ES4.

Figure 45:
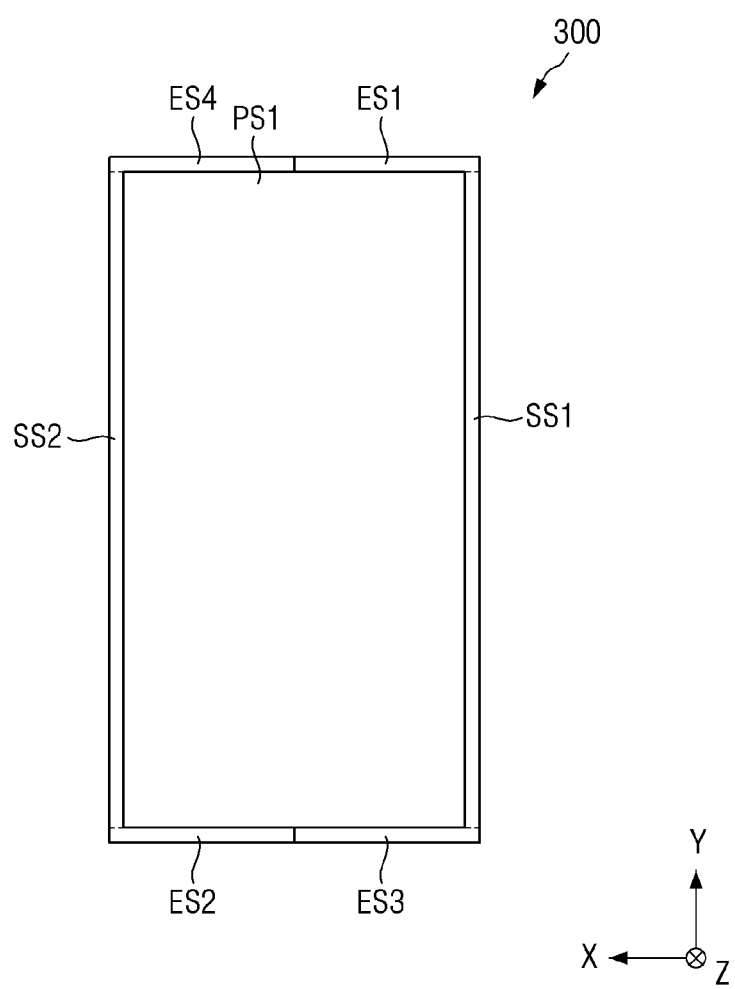

The fourth extension surface ES4 may be bent in the first direction (X-axis direction) from the second side S32 of the second side surface SS2. As illustrated in FIGS. 43 and 45, the fourth extension surface ES4 may form an upper side surface of the display panel 300 together with a first extension surface ES1. In this case, the first extension surface ES1 and the fourth extension surface ES4 may overlap an upper side surface DSS3 of the cover window 100.

The first side S101 of the fourth extension surface ES4 may face a third side S13 of the first flat surface PS1, and the third side S103 of the fourth extension surface ES4 may face a third side S43 of the first extension surface ES1. A fine gap may be defined between the first side S101 of the fourth extension surface ES4 and the third side S13 of the first flat surface PS1 and between the third side S103 of the fourth extension surface ES4 and the third side S43 of the first extension surface ES1. In an alternative embodiment, the first side S10.1 of the fourth extension surface ES4 and the third side S13 of the first flat surface PS1 may contact each other, and the third side S103 of the fourth extension surface ES4 and the third side S43 of the first extension surface ES1 may contact each other. An area in which the third side S103 of the fourth extension surface ES4 and the third side S43 of the first extension surface ES1 face each other may overlap the light blocking part LS of the cover window 100 as illustrated in FIG. 46. Accordingly, the gap between the third side S103 of the fourth extension surface ES4 and the third side S43 of the first extension surface ES1 may be covered by the light blocking part LS of the cover window 100 so that it is not visible from the outside.

A length of the third side S103 of the fourth extension surface ES4 may be substantially the same as a length of the third side S43 of the first extension surface ESL In addition, the sum of a length of the first side S1.01 of the fourth extension surface ES4 and a length of a first side S41 of the first extension surface ES1 may be substantially the same as a length of the third side S13 of the first flat surface PS1. When the sum of the length of the first side S101 of the fourth extension surface ES4 and the length of the first side S41 of the first extension surface ES1 is smaller than the length of the third side S13 of the first flat surface PS1, a gap may be defined between the third side S103 of the fourth extension surface ES4 and the third side S43 of the first extension surface ESE in FIGS. 43 and 46, the length of the first side S101 of the fourth extension surface ES4 is substantially the same as the length of the first side S41 of the first extension surface ESL However, the invention is not limited thereto. The length of the first side S101 of the fourth extension surface ES4 may also be different from the length of the first side S41 of the first extension surface ES1.

In addition, the arrangement area of scan lines SL and data lines DL on each of the third extension surface ES3 and the fourth extension surface ES4 relative to the total area of the third extension surface ES3 or the fourth extension surface ES4 may be larger than the arrangement area of the scan lines SL and the data lines DL on the first flat surface PS1 relative to the total area of the first flat surface PS1. Therefore, the number of pixels per inch of each of the third extension surface ES3 and the fourth extension surface ES4 may also be smaller than the number of pixels per inch of the first flat surface PS1. Accordingly, the resolution of each of the third extension surface ES3 and the fourth extension surface ES4 may be lower than that of the first flat surface PS1.

In the embodiment illustrated in FIGS. 42 and 43 through 49, as in the embodiment illustrated in FIGS. 18 and 19 through 25, a length L2 (refer to FIG. 18) of the third side S43 of the first extension part ES1 may be smaller than a length L1 (refer to FIG. 18) of each of a first side S21 and the second side S22 of the first side surface SS1, and a length L4 (refer to FIG. 18) of the third side S53 of the second extension part ES2 may be smaller than a length L3 (refer to FIG. 18) of each of a first side S31 and the second side S32 of the second side surface SS2. In addition, corners C11 through C14 (refer to FIG. 18) of the first flat surface PS1 may be rounded with a predetermined curvature.

It should be noted that the light blocking part LS of the cover window 100 is illustrated only in FIGS. 46 and 47 and is not illustrated in FIGS. 42 and 43 for ease of description.

In addition, in the embodiment illustrated in FIGS. 42 and 43 through 49, as in the embodiment illustrated in FIGS. 26A, 26B 26C and 27 through 33, an area between a first side S11 and the third side S13 of the first flat surface PS1 and an area between the first side S11 of the first flat surface PS1 and the first side S21 of the first side surface SS1 may have a compound curvature, and an area between a second side S12 and the fourth side S14 of the first flat surface PS1 and an area between the second side S14 of the first flat surface PS1 and the first side S31 of the second side surface SS2 may have a compound curvature. In addition, as in the embodiment illustrated in FIGS. 26A, 26B 26C and 27 through 33, an area between the first side S11 and the fourth side S14 of the first flat surface PS1 and an area between the first side S11 of the first flat surface PS1 and the second side S22 of the first side surface SS1 may have a compound curvature, and an area between the second side S12 and the third side S13 of the first flat surface PS1 and an area between the second side S14 of the first flat surface PS1 and the second side S32 of the second side surface SS2 may have a compound curvature.

In addition, in the embodiment illustrated in FIGS. 42 and 43 through 49, as in the embodiment illustrated in FIGS. 34 and 35 through 41, the display panel 300 may further include a first edge surface EE1 disposed between the first flat surface PS1 and the first side surface SS1 and a second edge surface EE2 disposed between the first flat surface PS1 and the second side surface SS2, and the corners C11 through C14 of the first flat surface PS1 may be rounded with a predetermined curvature.

As described above, in the embodiment illustrated in FIGS. 42 and 43 through 49, the display panel 300 has pixels disposed not only on the first flat surface PS1 but also on the first side surface SS1, the second side surface SS2, the first extension surface ES1, the second extension surface ES2, the third extension surface ES3, and the fourth extension surface ES4. Therefore, an image may be disposed on the first side surface SS1, the second side surface SS2, the first extension surface ES1, the second extension surface ES2, the third extension surface ES3, and the fourth extension surface ES4.

Figure 50:
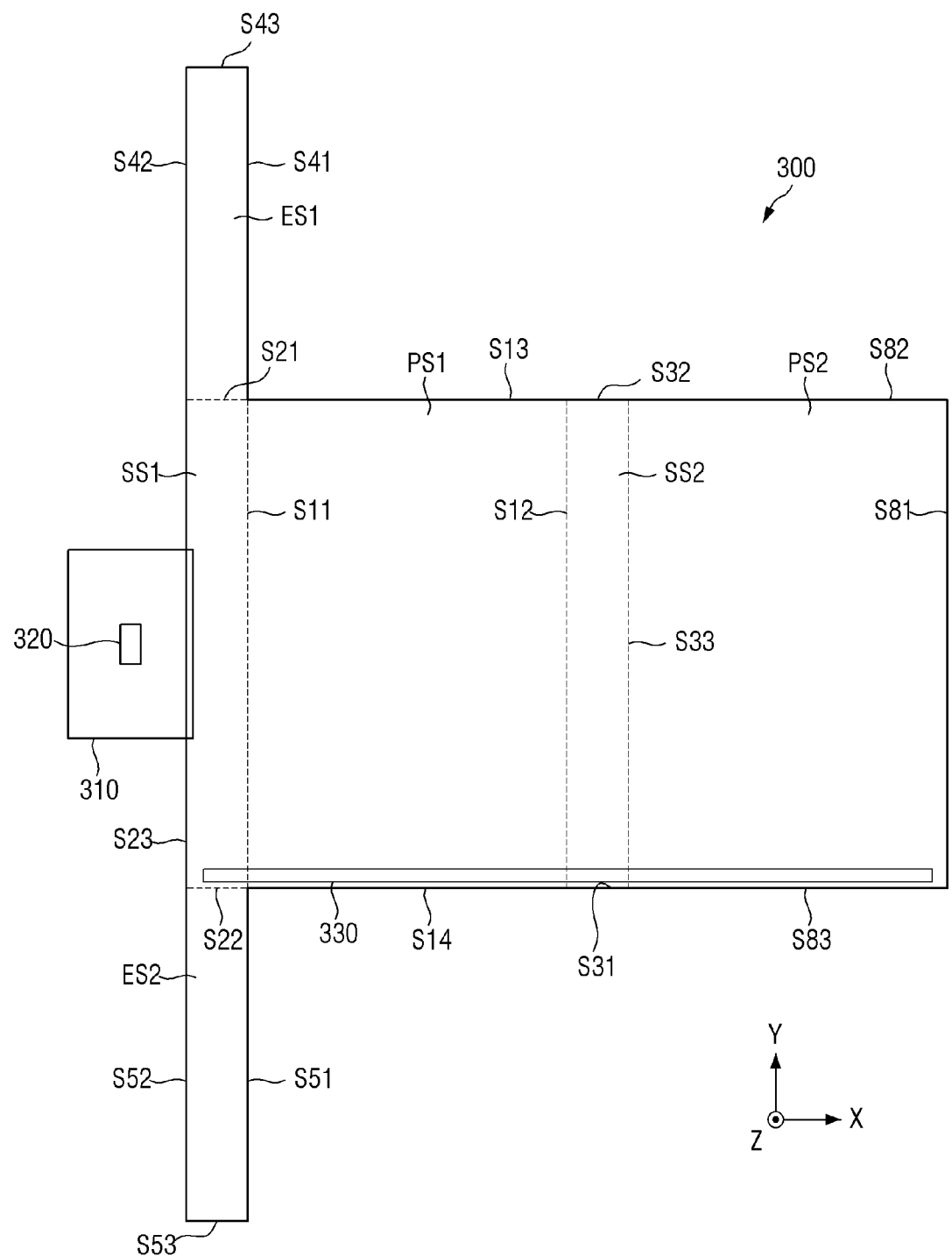
FIG. 50 is a development drawing of an embodiment of a display panel.
Figure 51:
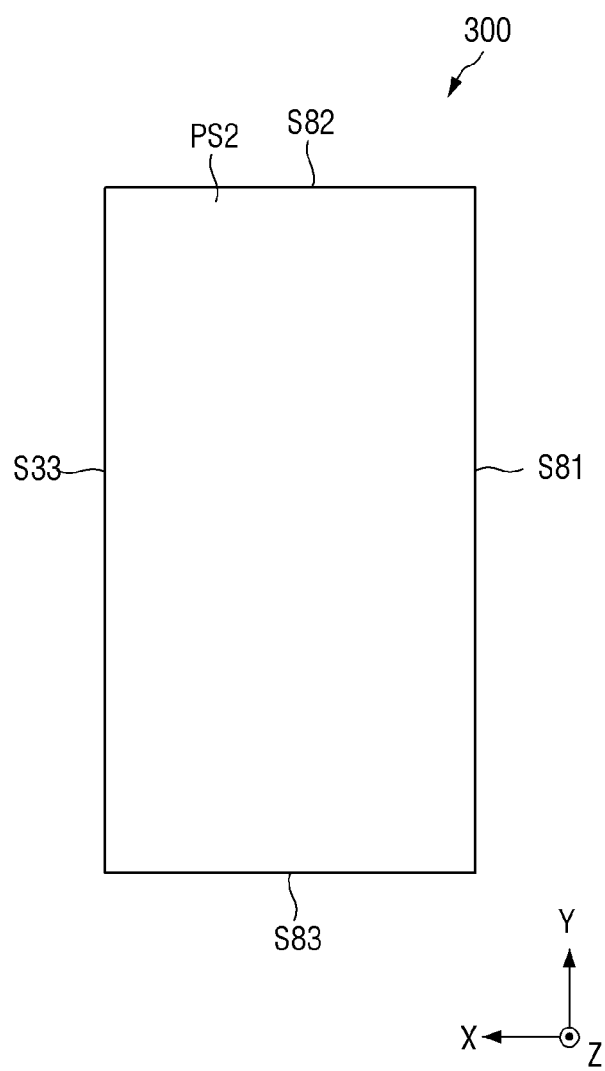
FIG. 51 is a rear view of the display panel of FIG. 50.

FIG. 50 is a development drawing of another embodiment of a display panel. FIG. 51 is a rear view of the display panel of FIG. 50. A perspective view, a plan view, a front view, a rear view, a left side view, and a right side view of the embodiment illustrated in FIG. 51 are substantially the same as those illustrated in FIGS. 5, 6 and 8 through 11.

The embodiment illustrated in FIGS. 50 and 51 is different from the embodiment illustrated in FIGS. 4 and 5 through 11 in that the display panel 300 includes a second flat surface PS2. Therefore, in FIGS. 50 and 51, the description already provided in the embodiment illustrated in FIGS. 4 and 5 through 11 will not be repeated.

Referring to FIGS. 50 and 51, the second flat surface PS2 may include a first side SS1, a second side S82 and a third side S83 and may share a third side S33 of a second side surface SS2 as one side with the second flat surface PS2, The first side S81 of the second flat surface PS2 may be longer than the second side S82 and the third side S83 of the second flat surface PS2, The first side S81 of the second flat surface PS2 and the third side S33 of the second side surface SS2 may be parallel to each other, and the second side S82 and the third side S83 of the second flat surface PS2 may be parallel to each other. Although the first side S81 of the second flat surface PS2 and the third side S33 of the second side surface SS2 have the same length in FIG. 50, they may also have different lengths. In addition, although the second side S82 and the third side S83 of the second flat surface PS2 have the same length, they may also have different lengths. The second flat surface PS2 may be a lower surface of the display panel 300 as illustrated in FIGS. 50 and 51. The second flat surface PS2 may overlap a lower surface of a cover window 100.

A first extension surface ES1 is bent in the first direction (X-axis direction) from a first side S21 of a first side surface SS1. Therefore, a second side S42 of the first extension surface ES1 may face the second side S82 of the second flat surface PS2. In this case, a fine gap may be defined between the second side S42 of the first extension surface ES1 and the second side S82 of the second flat surface PS2, or the second side S42 of the first extension surface ES1 and the second side S82 of the second flat surface PS2 may contact each other.

A second extension surface ES2 is bent in the first direction (X-axis direction) from a second side S22 of the first side surface SS1. Therefore, a second side S52 of the second extension surface ES2 may face the third side S83 of the second flat surface PS2. In this case, a fine gap may be defined between the second side S52 of the second extension surface ES2 and the third side S83 of the second flat surface PS2, or the second side S52 of the second extension surf, ES2 and the third side S83 of the second flat surface PS2 may contact each other.

A scan driver 330 may output scan signals to scan lines. The scan driver 330 may be disposed on a first flat surface PS1, the second flat surface PS2, the first side surface SS1, and the second side surface SS2. The scan driver 330 may be disposed adjacent to a fourth side S14 of the first flat surface PS1, the third side S83 of the second flat surface PS2, a second side S22 of the first side surface SS1, and a first side S31 of the second side surface SS2.

According to the embodiment illustrated in FIGS. 50 and 51, the display panel 300 may include the first flat surface PS1, the second flat surface PS2, the first side surface SS1, the second side surface SS2, the first extension surface ES1, and the second extension surface ES2. Therefore, the display panel 300 has pixels disposed not only on the first flat surface PS1 but also on the second flat surface PS2, the first side surface SS1, the second side surface SS2, the first extension surface ES1 and the second extension surface ES2. Accordingly, an image may be also displayed on the second flat surface PS2, the first side surface SS1, the second side surface S52, the first extension surface ES1, and the second extension surface ES2. That is, the display panel 300 may display an image on all surfaces.

Figure 53:
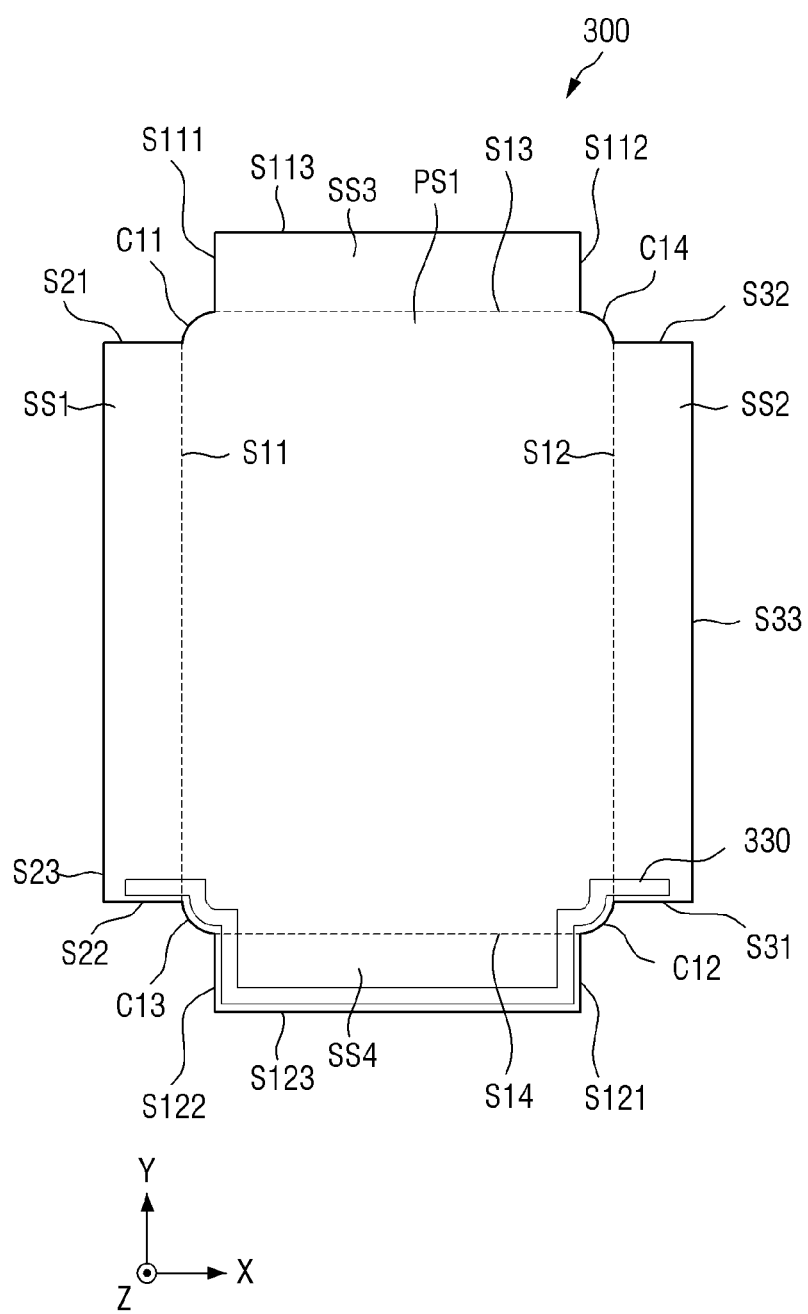
FIG. 53 is a development drawing of an embodiment of a display panel.

FIG. 53 is a development drawing of another embodiment of a display panel. FIGS. 54 through 60 are a perspective view, a plan view, a bottom view, a front view, a rear view, a left side view, and a right side view of the display panel of FIG. 53.

The embodiment illustrated in FIGS. 53 and 54 through 60 is different from the embodiment illustrated in FIGS. 4 and 5 through 11 in that the display panel 300 includes a third side surface SS3 and a fourth side surface S54 instead of a first extension surface ES1 and a second extension surface ES2 and that corners C11 through C14 of a first flat surface PS1 are rounded with a predetermined curvature. Therefore, in FIGS. 53 and 54 through 60, the description already provided in the embodiment illustrated in FIGS. 4 and 5 through 11 will not be repeated.

Figure 54:
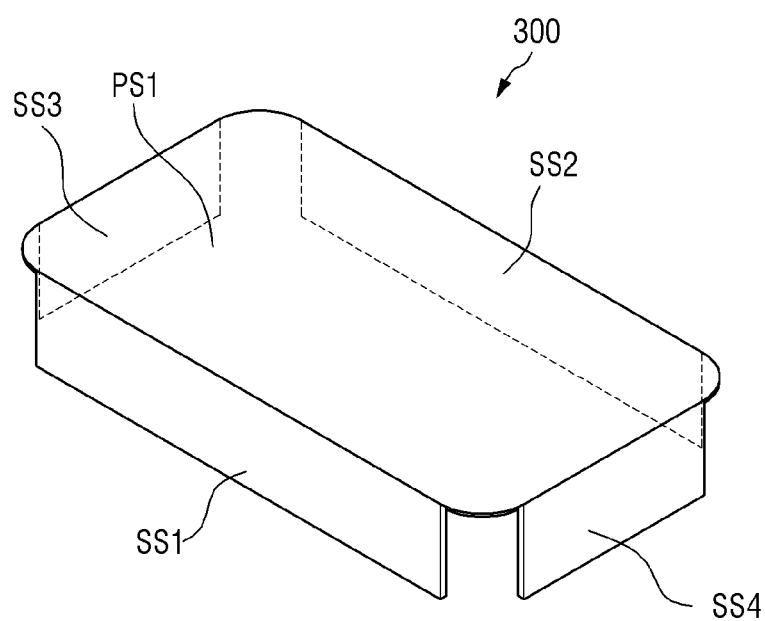
FIGS. 54 through 60 are a perspective view, a plan view, a bottom view, a front view, a rear view, a left side view, and a right side view of the display panel of FIG. 53.
Figure 55:
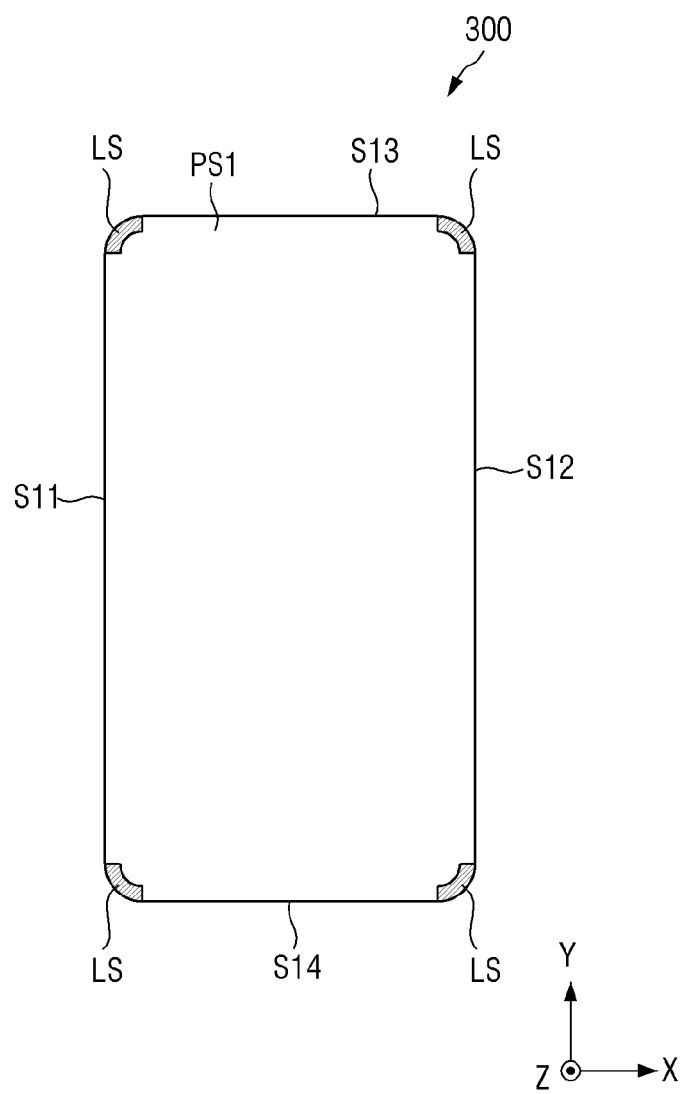
Figure 56:
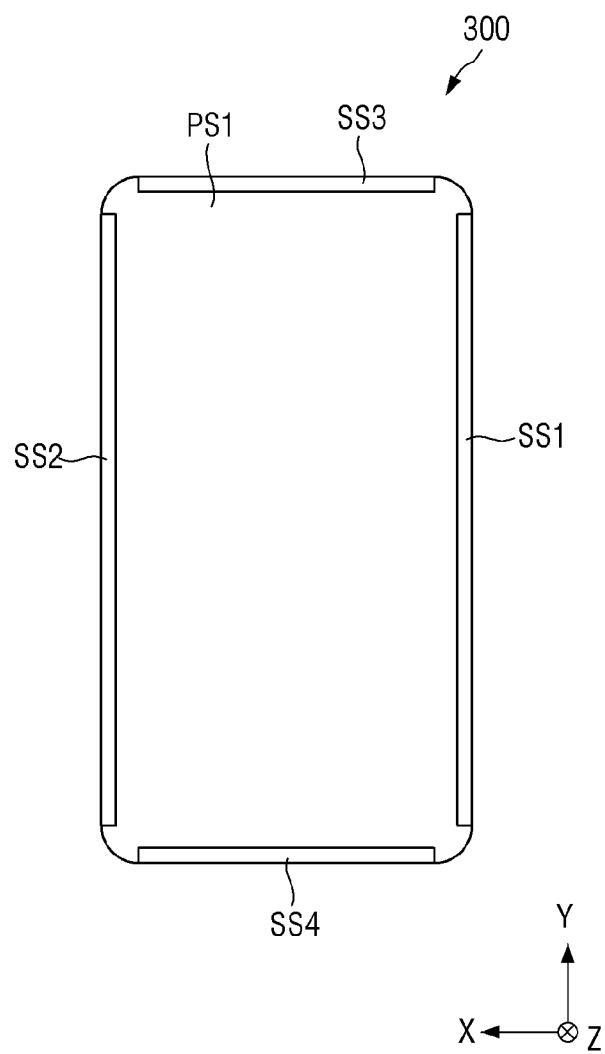
Figure 57:
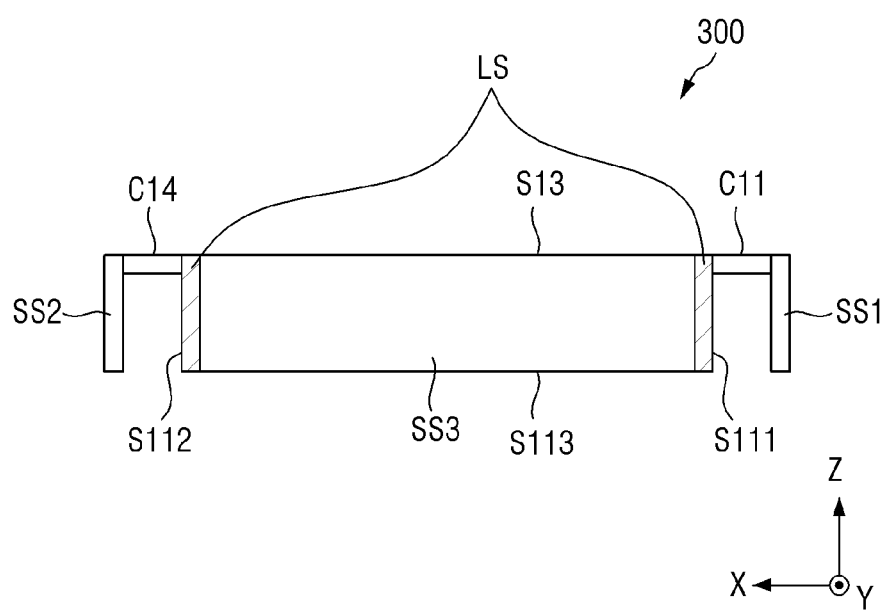
Figure 58:
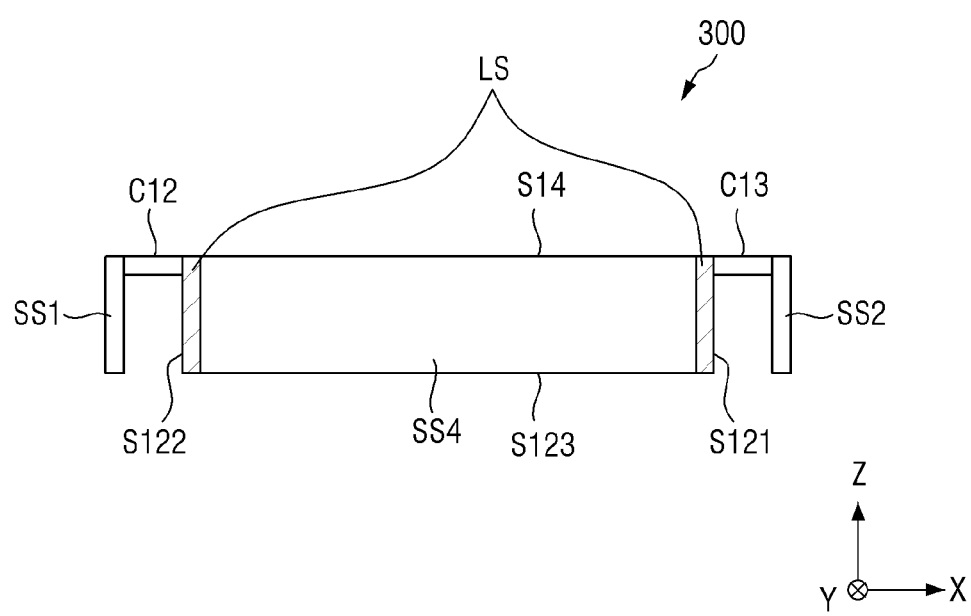
Figure 59:
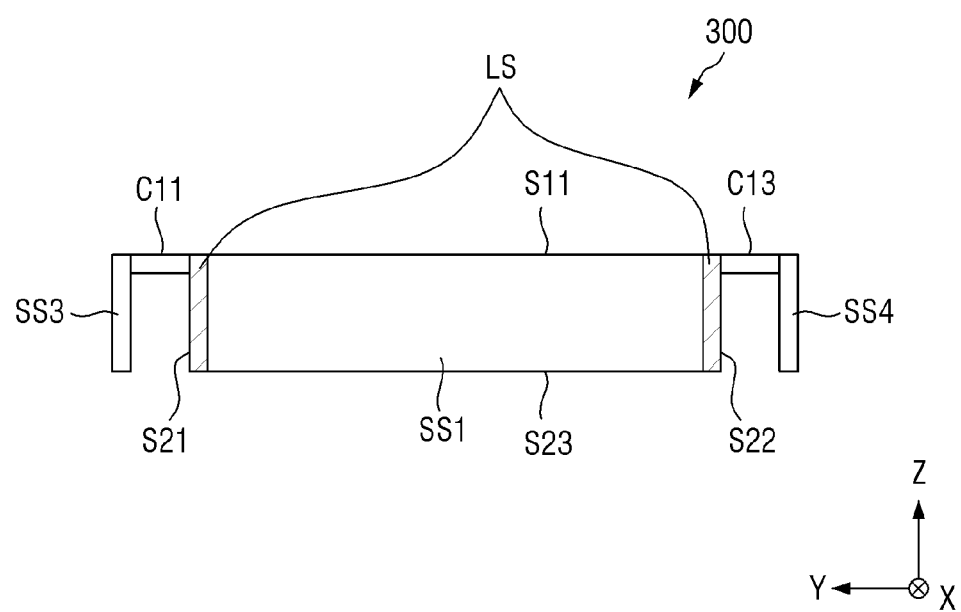

Referring to FIGS. 53 and 54 through 60, the third side surface S53 may extend from a third side S13 of the first flat surface PS1. The third side surface SS3 may be an upper side surface of the display panel 300 as illustrated in FIGS. 54 and 59. The third side surface SS3 may include a first side S111, a second side S112 and a third side S113 and may share the third side S13 of the first flat surface PS1 as one side with the first flat surface PS1. The first side Sill and the second side S112 of the third side surface SS3 may be parallel to each other and may be shorter than the third side S113 of the third side surface SS3. Although the first side Sill and the second side S112 of the third side surface SS3 have the same length in FIG. 53, they may also have different lengths. The third side surface SS3 may overlap an upper side surface DSS3 of a cover window 100.

Figure 60:
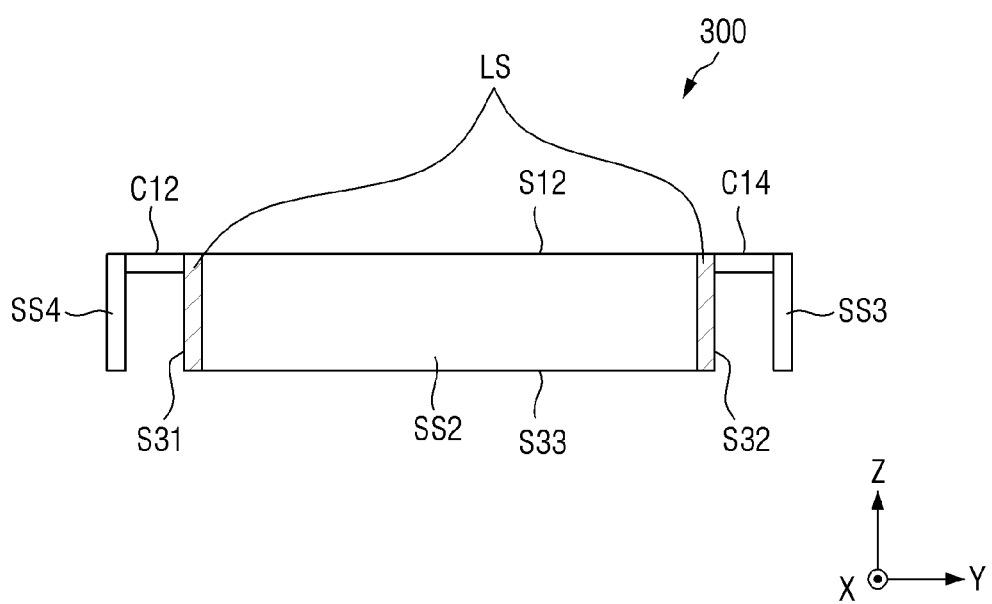

The fourth side surface S54 may extend from a fourth side S14 of the first flat surface PS1. The fourth side surface SS4 may be a lower side surface of the display panel 300 as illustrated in FIGS. 54 and 60. The fourth side surface SS4 may include a first side S121, a second side S122 and a third side S123 and may share the fourth side S14 of the first flat surface PS1 as one side with the first flat surface PST. The first side S121 and the second side S122 of the fourth side surface SS4 may be parallel to each other and may be shorter than the third side S123 of the fourth side surface SS4. Although the first side S121 and the second side S122 of the fourth side surface SS4 have the same length in FIG. 53, they may also have different lengths. The fourth side surface SS4 may overlap a lower side surface DSS4 of the cover window 100.

The first flat surface PS1 may further include a first corner C11, a second corner C12, a third corner C13, and a fourth corner C14. The first corner C11 may be disposed between a first side S11 and the third side S13 of the first flat surface PS1. The second corner C12 may be disposed between a second side S12 and the fourth side S14 of the first flat surface PS1. The third corner C13 may be disposed between the first side S11 and the fourth side S14 of the first flat surface PS1. The fourth corner C14 may be disposed between the second surface S12 and the third surface S13 of the first flat surface PST. The first corner C11, the second corner C12, the third corner C13, and the fourth corner C14 may have substantially the same curvature. In an alternative embodiment, at least two of the first corner C11, the second corner C12, the third corner C13, and the fourth corner C14 may have different curvatures.

A first side S21 of a first side surface SS1 and the first side Sill of the third side surface SS3 may not contact each other, and a gap may be defined between the first side S21 of the first side surface SS1 and the first side Sill of the third side surface SS3. A second side S22 of the first side surface SS1 and the second side S122 of the fourth side surface SS4 may not contact each other, and a gap may be defined between the second side S22 of the first side surface SST and the second side S122 of the fourth side surface SS4. A first side S31 of a second side surface SS2 and the first side S121 of the fourth side surface S54 may not contact each other, and a gap may be defined between the first side S31 of the second side surface SS2 and the first side S121 of the fourth side surface SS4. A second side S32 of the second side surface SS2 and the second side S112 of the third side surface SS3 may not contact each other, and a gap may be defined between the second side S32 of the second side surface SS2 and the second side S112 of the third side surface SS3.

A scan driver 330 may be disposed adjacent to the second side S22 of the first side surface SS1, the third corner C13 of the first flat surface PS1, the second side S122, the third side S123 and the first side S121 of the fourth side surface SS4, the second corner C12 of the first flat surface PS1, and the first side S31 of the second side surface SS2.

The light blocking part LS of the cover window 100 may overlap the scan driver 330 so that the scan driver 330 is not visible from the outside. In addition, the light blocking part LS of the cover window 100 may overlap wirings disposed in a non-display area of the display panel 300 so that the wirings are not visible from the outside. To this end, as illustrated in FIGS. 55, 57, 58, 59 and 60, the light blocking part LS of the cover window 100 may be disposed adjacent to the second side S22 of the first side surface SS1, the third corner C13 of the first flat surface PS1, the second side S122, the third side S123 and the first side S121 of the fourth side surface SS4, the second corner C12 of the first flat surface PS1, and the first side S31 of the second side surface SS2. In addition, the light blocking part LS of the cover window 100 may be disposed adjacent to the first side S21 of the first side surface SS1, the first corner C11 of the first flat surface PS1, the first side Sill and the second side S112 of the third side surface SS3, the fourth corner C14 of the first flat surface PS1, and the second side S32 of the second side surface SS2. In this case, the light blocking part LS of the cover window 100 may have a width of about 3 millimeters (mm) at maximum.

In an alternative embodiment, the scan driver 330 may be disposed adjacent to the third side S123 of the fourth side surface SS4. In this case, the light blocking part LS of the cover window 100 may be disposed adjacent to the first corner C11, the second corner C12, the third corner C13 and the fourth corner C14 of the first flat surface PS1 and the third side S123 of the fourth side surface SS4. In this case, the light blocking part LS of the cover window 100 may have a width of about 1 mm at maximum.

It should be noted that the light blocking part LS of the cover window 100 is illustrated only in FIGS. 55 and 57 through 60 and is not illustrated in FIGS. 53 and 54 for ease of description.

According to the embodiment illustrated in FIGS. 53 and 54 through 60, the display panel 300 may include the first flat surface PS1, the first side surface SST, the second side surface SS2, the third side surface SS3, and the fourth side surface SS4. Therefore, the display panel 300 has pixels disposed not only on the first flat surface PS1 but also on the first side surface SS1, the second side surface SS2, the third side surface SS3 and the fourth side surface SS4. Accordingly, an image may be also displayed on the first side surface SS1, the second side surface SS2, the third side surface SS3, and the fourth side surface SS4. That is, the display panel 300 may display an image on all surfaces excluding side surfaces of the first corner C11, the second corner C12, the third corner C13, and the fourth corner C14.

Figure 61:
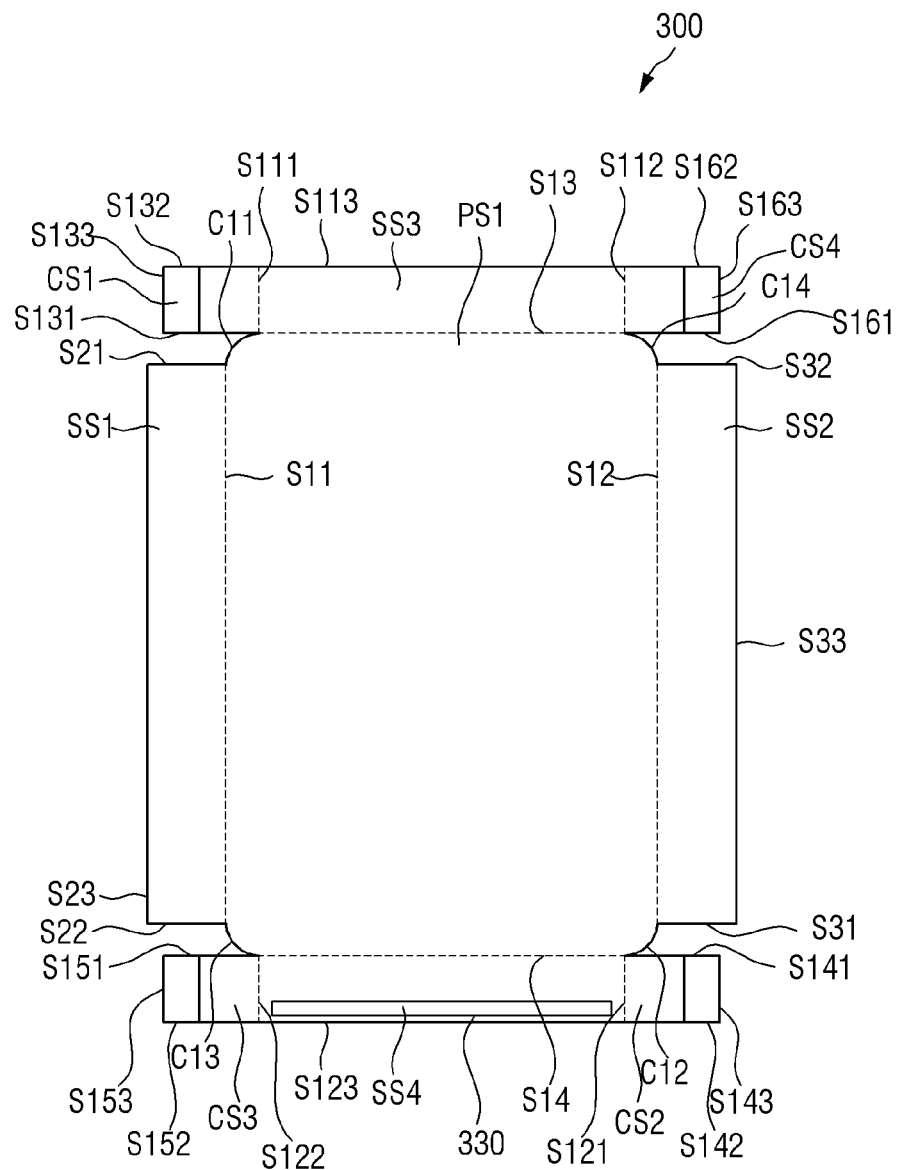
FIG. 61 is a development drawing of an embodiment of a display panel.

FIG. 61 is a development drawing of another embodiment of a display panel. FIGS. 62 through 68 are a perspective view, a plan view, a bottom view, a front view, a rear view, a left side view, and a right side view of the display panel of FIG. 61.

The embodiment illustrated in FIGS. 61 and 62 through 68 is different from the embodiment illustrated in FIGS. 53 and 54 through 60 in that the display panel 300 includes a first corner surface CS1 and a fourth corner surface CS4 protruding from a third side surface SS3 and includes a second corner surface CS2 and a third corner surface CS3 protruding from a fourth side surface SS4. Therefore, in FIGS. 61 and 2 through 68, the description already provided in the embodiment illustrated in FIGS. 53 and 54 through 60 will not be repeated.

Referring to FIGS. 61 and 62 through 68, the first corner surface CST may extend from a first side S111 of the third side surface SS3. The first corner surface CS1 may be a first corner side surface of the display panel 300 which corresponds to a first corner C11. The first corner surface CS1 may include a first side S131, a second side S132 and a third side S133 and may share the first side S111 of the third side surface SS3 as one side with the third side surface SS3. The first side S131 and the second side S132 of the first corner surface CS1 may be parallel to each other and may be shorter than the third side S133. Although the first side S131 and the second side S132 of the first corner surface CS1 have the same length in FIG. 61, they may also have different lengths. The first corner surface CS1 may overlap a first corner surface DC1 of a cover window 100.

The first side S131 of the first corner surface CS1 may face the first corner C11. In this case, the first side S131 of the first corner surface CS1 may contact the first corner C11, or a fine gap may be defined between the first side S131 of the first corner surface CS1 and the first corner C11. The third side S133 of the first corner surface CS1 may face a first side S21 of a first side surface SS1. In this case, the third side S133 of the first corner surface CS1 may contact the first side S21 of the first side surface SS1, or a fine gap may be defined between the third side S133 of the first corner surface CS1 and the first side S21 of the first side surface SS1.

The second corner surface CS2 may extend from a first side S121 of the fourth side surface SS4. The second corner surface CS2 may be a second corner side surface of the display panel 300 which corresponds to a second corner C12. The second corner surface CS2 may include a first side S141, a second side S142 and a third side S143 and may share the first side S121 of the fourth side surface SS4 as one side with the fourth side surface SS4. The first side S141 and the second side S142 of the second corner surface CS2 may be parallel to each other and may be shorter than the third side S143. Although the first side S141 and the second side S142 of the second corner surface CS2 have the same length in FIG. 61, they may also have different lengths. The second corner surface CS2 may overlap a fourth corner surface DC4 of the cover window 100.

The first side S141 of the second corner surface CS2 may face the second corner C12. In this case, the first side S141 of the second corner surface CS2 may contact the second corner C12, or a fine gap may be defined between the first side S141 of the second corner surface CS2 and the second corner C12, The third side S143 of the second corner surface CS2 may face a first side S31 of a second side surface S52.

The third corner surface CS3 may extend from a second side S122 of the fourth side surface SS4. The third corner surface CS3 may be a third corner side surface of the display panel 300 which corresponds to a third corner C13. The third corner surface CS3 may include a first side S151, a second side S152 and a third side S153 and may share the second side S122 of the fourth side surface SS4 as one side with the fourth side surface SS4. The first side S151 and the second side S152 of the third corner surface CS3 may be parallel to each other and may be shorter than the third side S153. Although the first side S151 and the second side S152 of the third corner surface CS3 have the same length in FIG. 61, they may also have different lengths. The third corner surface CS3 may overlap a second corner surface DC2 of the cover window 100, The first side S151 of the third corner surface CS3 may face the third corner C13. The third side S153 of the third corner surface CS3 may face a second side S22 of the first side surface SS1.

The fourth corner surface CS4 may extend from a second side S112 of the third side surface SS3. The fourth corner surface CS4 may be a fourth corner side surface of the display panel 300 which corresponds to a fourth corner C14. The fourth corner surface CS4 may include a first side S161, a second side S162 and a third side S163 and may share the second side S112 of the third side surface SS3 as one side with the third side surface SS3. The first side S161 and the second side S162 of the fourth corner surface CS4 may be parallel to each other and may be shorter than the third side S163. Although the first side S161 and the second side S162 of the fourth corner surface CS4 have the same length in FIG. 61, they may also have different lengths. The fourth corner surface CS4 may overlap a third corner surface DC3 of the cover window 100. The first side S161 of the fourth corner surface CS4 may face the fourth corner C14. The third side S163 of the fourth corner surface CS4 may face a second side S32 of the second side surface SS2.

A scan driver 330 may be disposed adjacent to a third side S123 of the fourth side surface SS4. A light blocking part LS of the cover window 100 may overlap the scan driver 330 so that the scan driver 330 is not visible from the outside. In addition, the light blocking part LS of the cover window 100 may overlap wirings disposed in a non-display area of the display panel 300 so that the wirings are not visible from the outside. To this end, the light blocking part LS of the cover window 100 may be disposed adjacent to the first corner CI the second corner C12, the third corner C13 and the fourth corner C14 of a first flat surface PS1 and the third side S123 of the fourth side surface SS4. In this case, the light blocking part LS of the cover window 100 may have a width of about 1 mm at maximum.

Figure 63A:
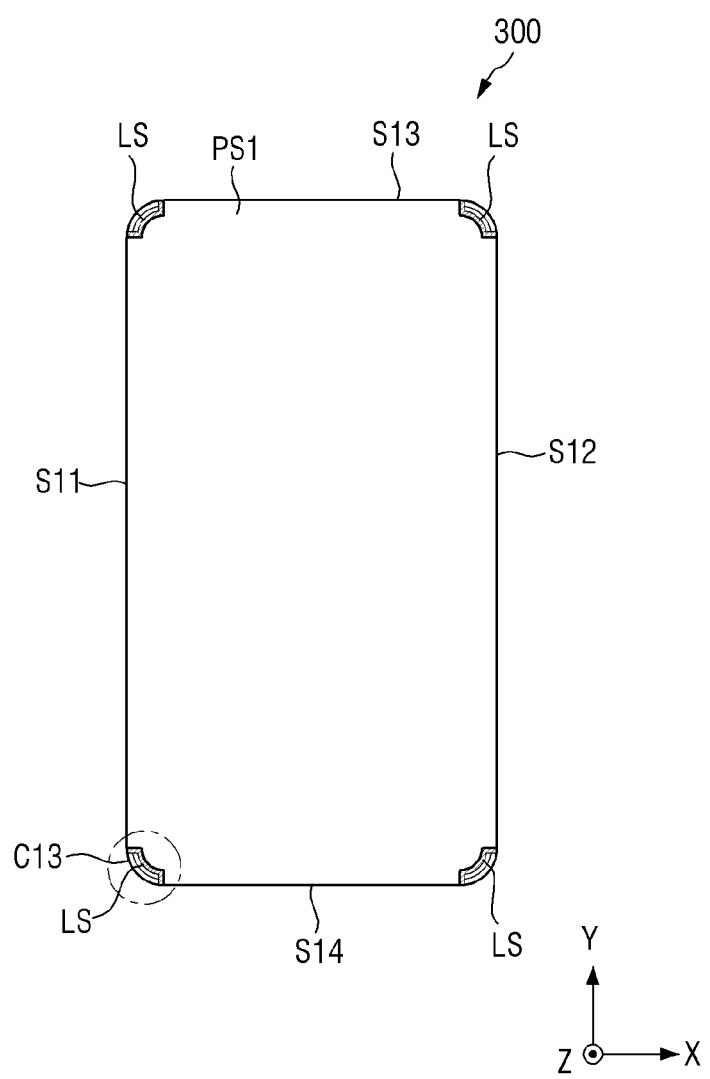
Figure 63B:
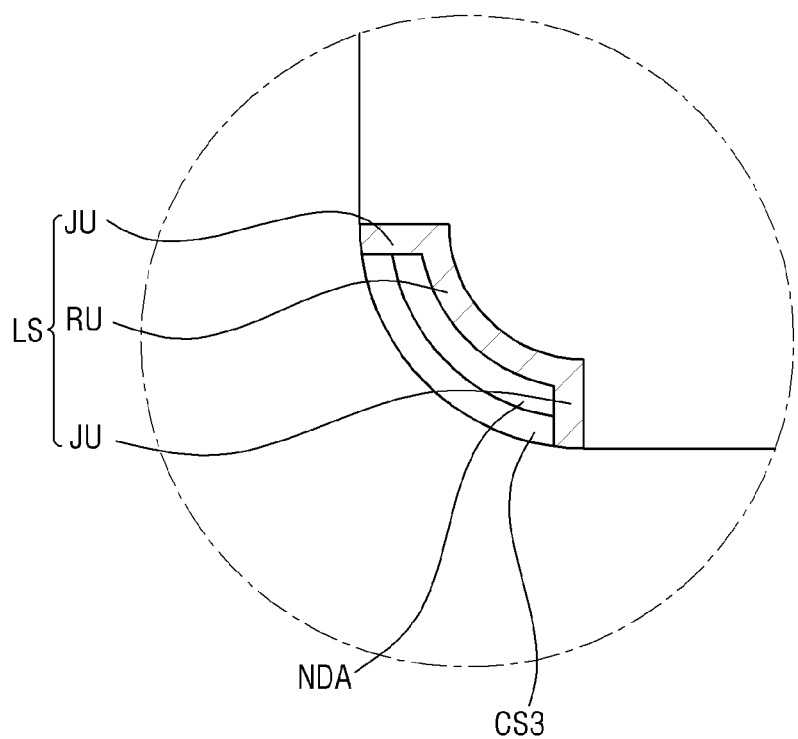
Figure 64:
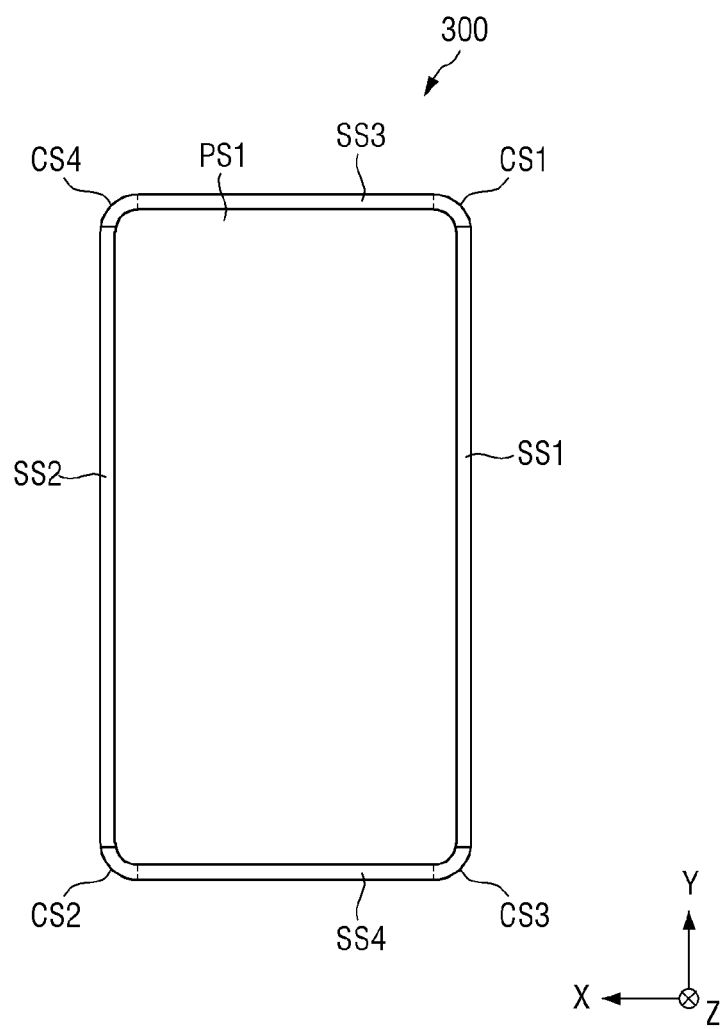
Figure 65:
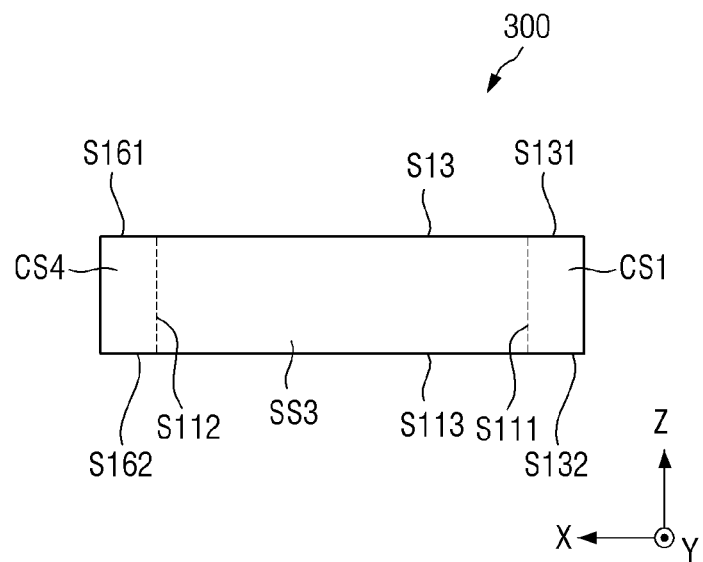

In FIG. 63B, an enlarged plan view of the third corner C13 of FIG. 63A is illustrated. Pixels may be disposed on the third corner surface CS3 to emit light, and the light blocking part LS of the cover window 100 may overlap a non-display area NDA of the third corner C13. A part of the non-display area NDA of the third corner C13 which is adjacent to the third corner surface CS3 may be exposed as illustrated in FIGS. 63A and 63B without being covered by the light blocking part LS of the cover window 100.

The light blocking part LS of the cover window 100 may include a curvature portion RU having a predetermined curvature due to the curvature of the third corner C13 and a joint JU disposed at at least one end of the curvature portion RU. In this case, the curvature portion RU of the light blocking part LS may be wider than the joint JU as illustrated in FIG. 63B.

An enlarged plan view of the first corner C11, an enlarged plan view of the second corner C12, and an enlarged plan view of the fourth corner C14 may be substantially the same as the enlarged plan view of the third corner C13.

Figure 62:
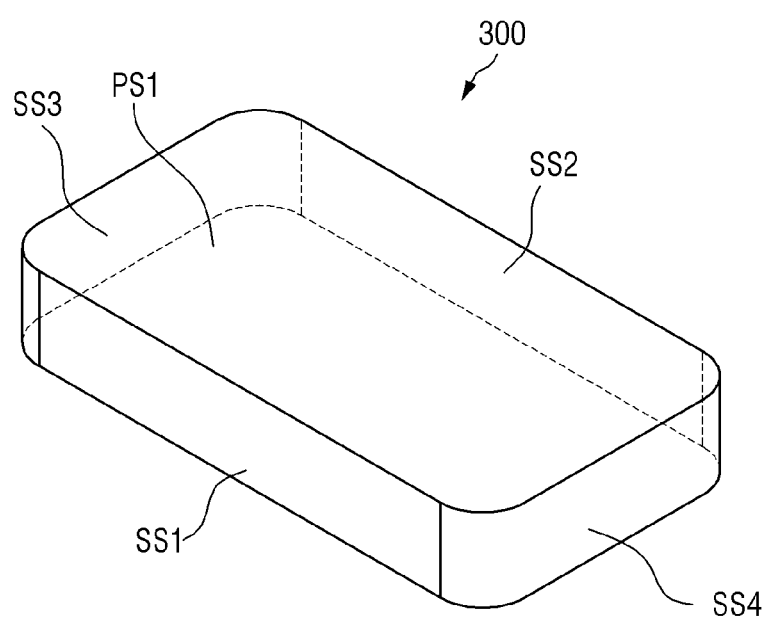
FIGS. 62 through 68 are a perspective view, a plan view, a bottom view, a front view, a rear view, a left side view, and a right side view of the display panel of FIG. 61.
Figure 66:
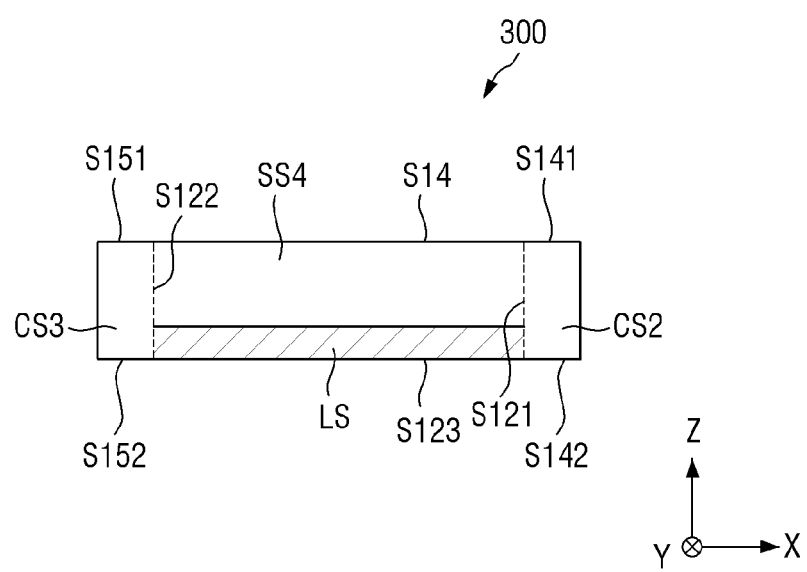
Figure 67:
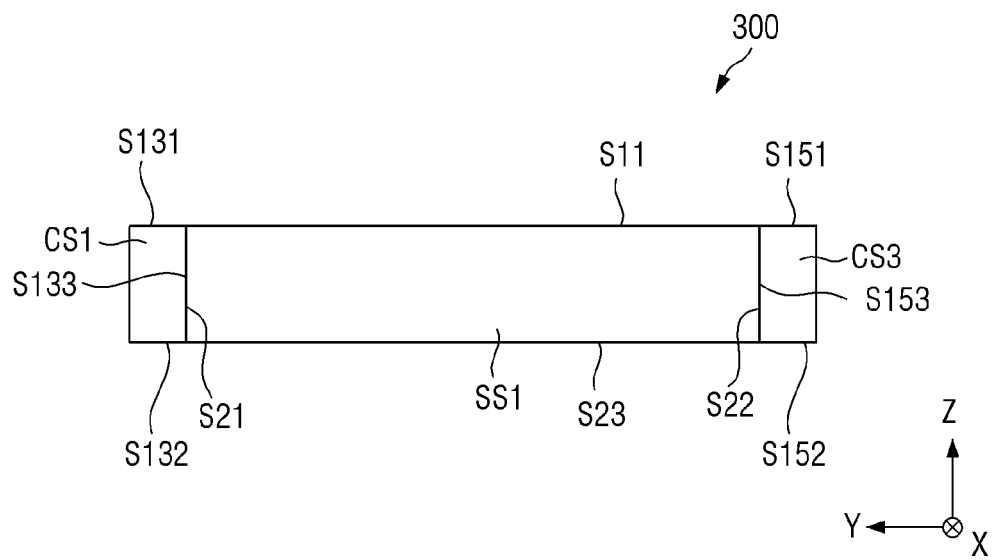
Figure 68:
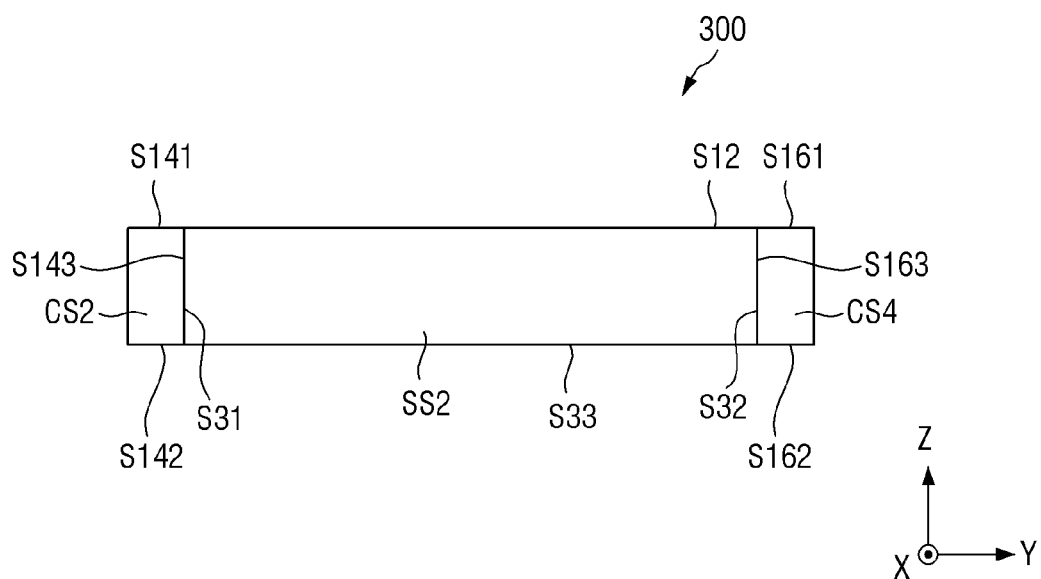

It should be noted that the light blocking part LS of the cover window 100 is illustrated only in FIGS. 63A, 63B and 66 and is not illustrated in FIGS. 61 and 62 for ease of description.

Figure 69:
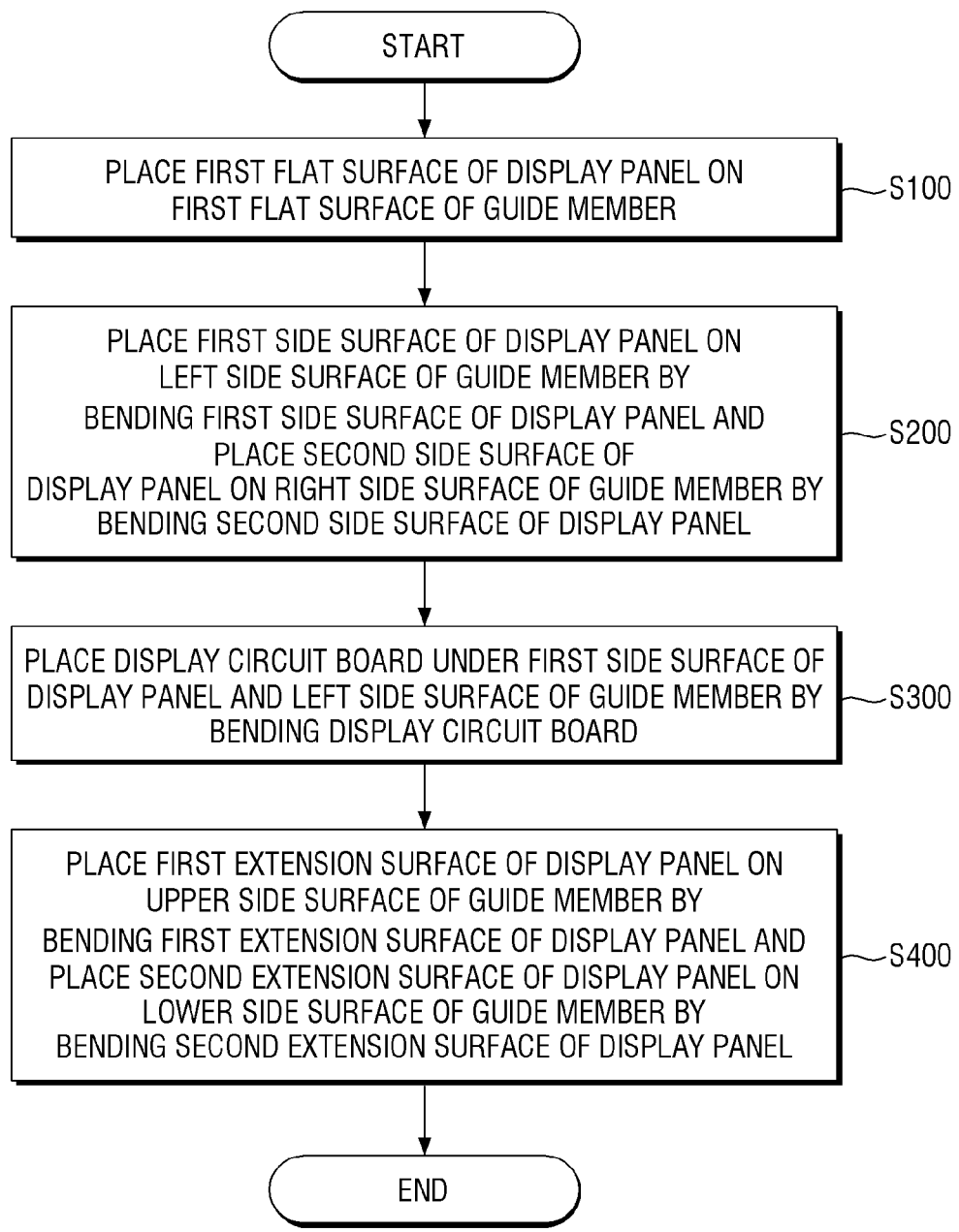
FIG. 69 is a flowchart illustrating an embodiment of a method for manufacturing a display panel.

According to the embodiment illustrated in FIGS. 61 and 62 through 68, the display panel 300 may include the first flat surface PS1, the first through fourth side surfaces SS1 through SS4, and the first through fourth corner surfaces CS1 through CS4. Therefore, the display panel 300 has pixels disposed not only on the first flat surface PS1 but also on the first through fourth side surfaces SS1 through SS4 and the first through fourth corner surfaces CS1 through CS4. Accordingly, an image may be also displayed on the first through fourth side surfaces SS1 through SS4 and the first through fourth corner surfaces CS1 through CS4, That is, the display panel 300 may display an image on all surfaces. FIG. 69 is a flowchart illustrating an embodiment of a method for manufacturing a display panel. FIGS. 70 through 74 are plan views for explaining an embodiment of the method for manufacturing a display panel.

Figure 70:
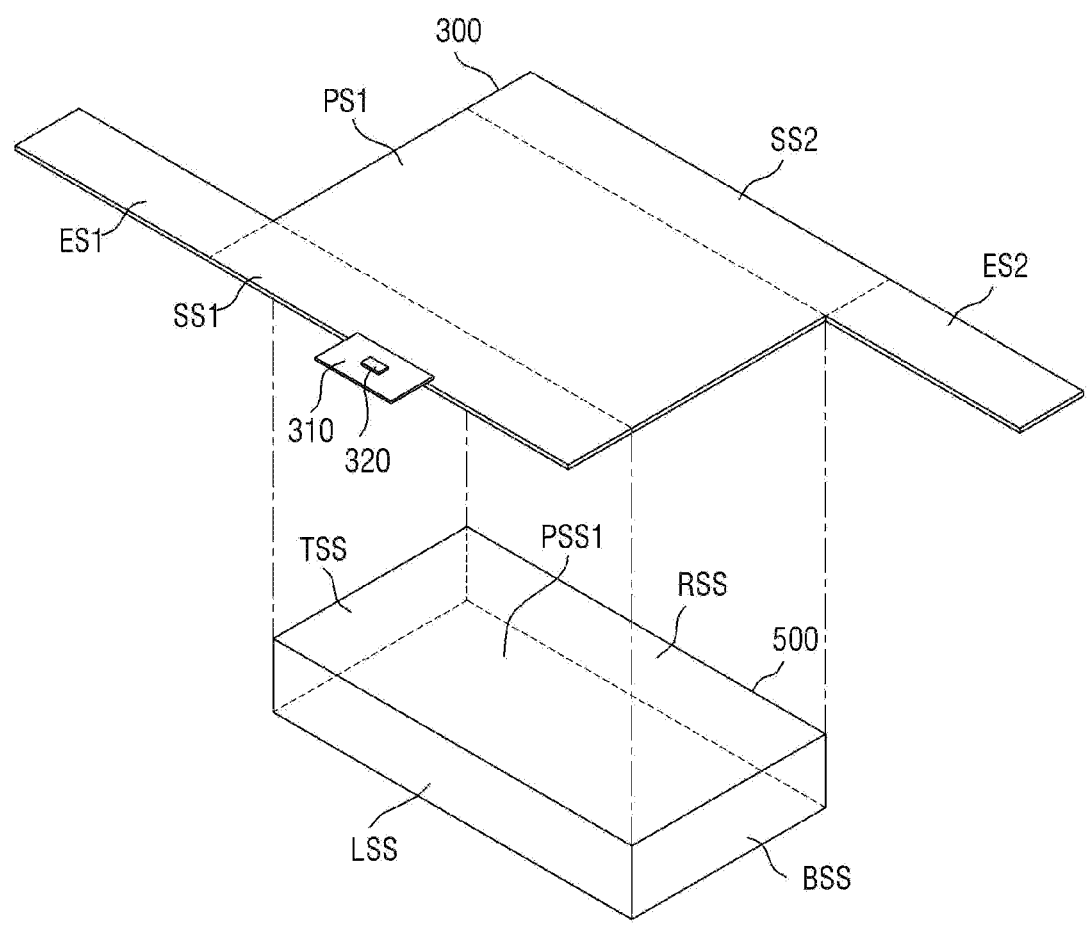
FIGS. 70 through 74 are perspective views for explaining an embodiment of the method for manufacturing a display panel.

Referring to FIGS. 69 and 70 through 74, first, as illustrated in FIG. 70, a display panel 300 is aligned on a guide member 500 such that a first flat surface PS1 of the display panel 300 corresponds to a first flat surface PSS1 of the guide member 500. In the illustrated embodiment, the under-panel member 400 (refer to FIG. 3) may be omitted for convenience.

Figure 71:
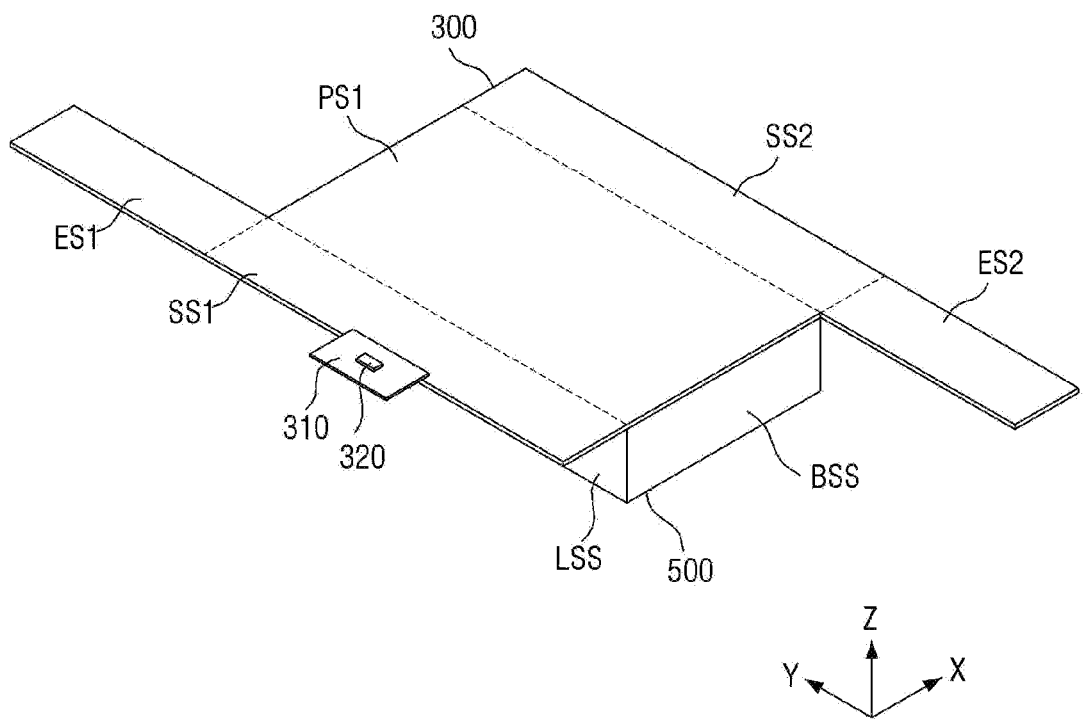

Then, as illustrated in FIG. 71, the first flat surface PS1 of the display panel 300 is placed on the first flat surface PSS1 of the guide member 500. Here, the first flat surface PS1 of the display panel 300 may be attached to the first flat surface PSS1 of the guide member 500 through a fourth adhesive member 940 as illustrated in FIG. 3 (operation S100 of FIG. 69).

Figure 72:
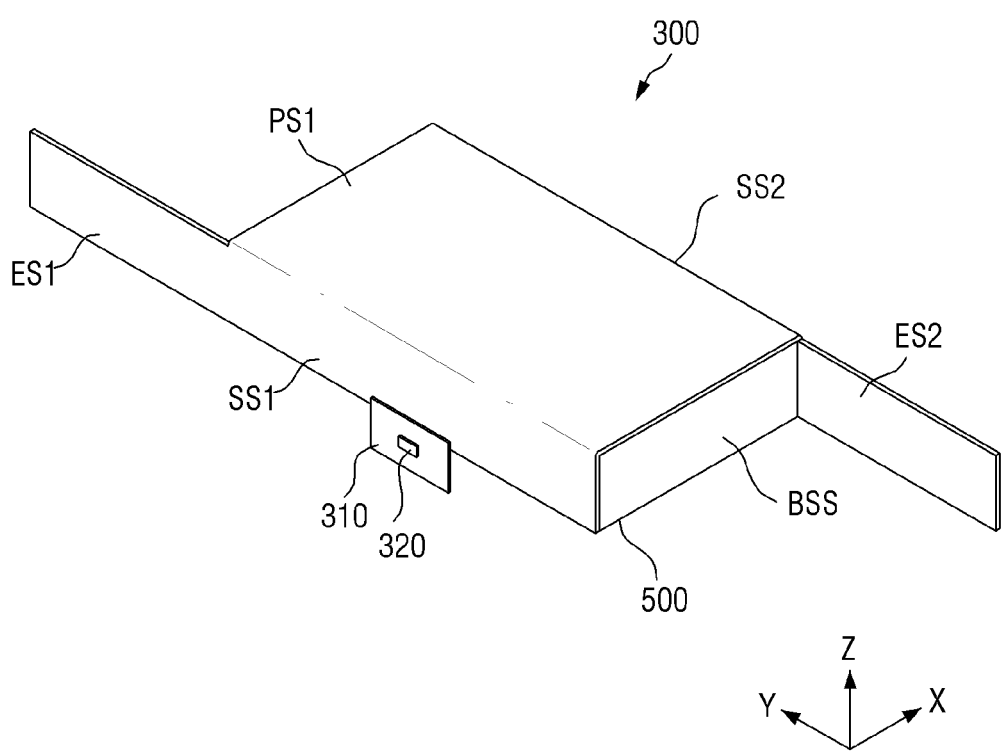

Second, as illustrated in FIG. 72, a first side surface SS1 of the display panel 300 is placed on a left side surface LSS of the guide member 500 by bending the first side surface S51 of the display panel 300 from a first side of the first flat surface PS1 in the third direction (Z-axis direction). Here, the first side surface SS1 of the display panel 300 may be attached to the left side surface LSS of the guide member 500 through the fourth adhesive member 940 as illustrated in FIG. 3.

In addition, a second side surface SS2 of the display panel 300 is placed on a right side surface RSS of the guide member 500 by bending the second side surface SS2 of the display panel 300 from a second side of the first flat surface PS1 in the third direction (Z-axis direction). Here, the second side surface SS2 of the display panel 300 may be attached to the right side surface RSS of the guide member 500 through the fourth adhesive member 940 as illustrated in FIG. 3 (operation S200 of FIG. 69).

Figure 73:
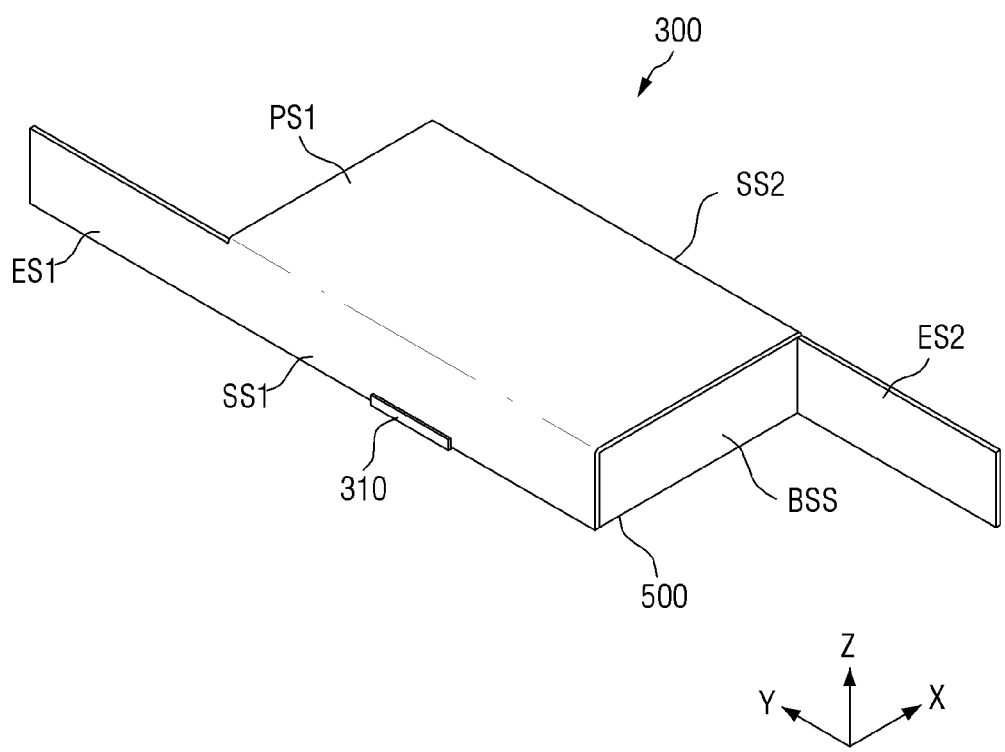

Third, as illustrated in FIG. 73, a display circuit board 310 attached to an edge of the first side surface SS1 of the display panel 300 is bent in the first direction (X-axis direction). In this case, the display circuit board 310 may be disposed under the first side surface SS1 of the display panel 300 and the left side surface LSS of the guide member 500 (operation S300 of FIG. 69).

Figure 74:
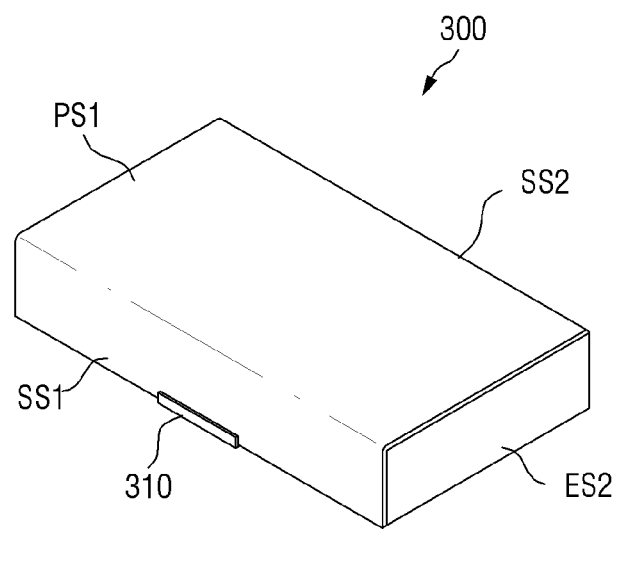

Fourth, as illustrated in FIG. 74, a first extension surface ES1 of the display panel 300 is placed on an upper side surface TSS of the guide member 500 by bending the first extension surface ES1 of the display panel 300 from a first side of the first side surface SS1 in the first direction (X-axis direction). Here, the first extension surface ES1 of the display panel 300 may be attached to the upper side surface TSS of the guide member 500 through the fourth adhesive member 940 as illustrated in FIG. 3.

In addition, a second extension surface ES2 of the display panel 300 is placed on a lower side surface BSS of the guide member 500 by bending the second extension surface ES2 of the display panel 300 from a first side of the second side surface S52 in the first direction (X-axis direction). Here, the second extension surface ES2 of the display panel 300 may be attached to the lower side surface BSS of the guide member 500 through the fourth adhesive member 940 as illustrated in FIG. 3 (operation S400 of FIG. 69).

According to the embodiment illustrated in FIGS. 69 and 70 through 74, the first side surface S51, the second side surface SS2, the first extension surface ES1, and the second extension surface ES2 of the display panel 300 may be easily bent using the guide member 500.

Although the embodiments of the invention have been described with reference to the accompanying drawings, those of ordinary skill in the art to which the invention pertains may be implemented in other specific forms without changing the technical spirit or essential features of the invention. You will be able to understand. Therefore, it should be understood that the embodiments described above are illustrative and non-limiting in all respects.

The invention claimed is:
1. A display panel comprising:
a first flat surface;
a first side surface extending from a first side of the first flat surface;
a second side surface extending from a second side of the first flat surface;
a first extension surface extending from a first side of the first side surface; and
a second extension surface extending from a first side of the second side surface,
wherein a first side of the first extension surface faces a third side of the first flat surface, and a first side of the second extension surface faces a fourth side of the first flat surface.

2. The display panel of claim 1, wherein the first extension surface comprises a second side parallel to the first side of the first extension surface and a third side connecting the first side and the second side of the first extension surface, and the second extension surface comprises a second side parallel to the first side of the second extension surface and a third side connecting the first side and the second side of the second extension surface.

3. The display panel of claim 2, wherein the third side of the first extension surface faces a second side of the second side surface parallel to the first side of the second side surface, and the third side of the second extension surface faces a second side of the first side surface parallel to the first side of the first side surface.

4. The display panel of claim 2, wherein a length of the third side of the first extension surface is smaller than a length of the first side of the first side surface.

5. The display panel of claim 4, wherein a gap is defined between the first side of the first extension surface and the third side of the first flat surface.

6. The display panel of claim 2, wherein a length of the third side of the second extension surface is smaller than a length of the first side of the second side surface.

7. The display panel of claim 6, wherein a gap is defined between the first side of the second extension surface and the fourth side of the first flat surface.

8. The display panel of claim 2, wherein the first flat surface comprises a first corner disposed between the first side and the third side of the first flat surface and a second corner disposed between the second side and the fourth side of the first flat surface.

9. The display panel of claim 8, wherein a compound curvature portion is formed between the first side and the third side of the first flat surface.

10. The display panel of claim 9, wherein the compound curvature portion comprises:
a first curvature portion in contact with the third side of the first flat surface and having a first curvature; and
a second curvature portion disposed between the first side of the first flat surface and the first curvature portion and having a second curvature.

11. The display panel of claim 2, further comprising:
a first edge surface disposed between the first flat surface and the first side surface; and
a second edge surface disposed between the first flat surface and the second side surface.

12. The display panel of claim 11, wherein a length of the third side of the first extension surface is identical to that of the first side of the first side surface, and a length of the third side of the second extension surface is identical to that of the first side of the second side surface.

13. The display panel of claim 1, wherein a hole is defined in any one of the first flat surface, the first side surface, the second side surface, the first extension surface, and the second extension surface.

14. The display panel of claim 1, wherein the first side surface comprises a second side parallel to the first side of the first side surface and a third side parallel to the first side of the first flat surface, and further comprising display pads disposed adjacent to the third side of the first side surface.

15. The display panel of claim 14, further comprising:
data lines and a scan control line connected to the display pads; and
a scan driver connected to the scan control line and disposed adjacent to the fourth side of the first flat surface and the second side of the first side surface.

16. The display panel of claim 15, wherein the data lines comprise:
first data lines disposed on the first flat surface, the first side surface, and the second side surface;
second data lines disposed on the first side surface and the first extension surface; and
third data lines disposed on the first flat surface, the first side surface, the second side surface, and the second extension surface.

17. The display panel of claim 15, further comprising a plurality of scan lines connected to the scan driver, wherein the plurality of scan lines comprises:
first scan lines disposed on the first flat surface;
second scan lines disposed on the first side surface and the first extension surface; and
third scan lines disposed on the second side surface and the second extension surface.

18. The display panel of claim 1, comprising pixels disposed on the first flat surface, the first side surface, the second side surface, the first extension surface, and the second extension surface.

19. The display panel of claim 18, wherein a number of pixels per inch of the first flat surface is greater than a number of pixels per inch of the first extension surface and a number of pixels per inch of the second extension surface.

20. The display panel of claim 18, wherein a number of pixels per inch of the first flat surface is equal to a number of pixels per inch of the first side surface and a number of pixels per inch of the second side surface.

21. The display panel of claim 2, further comprising:
a third extension surface extending from the second side of the first side surface parallel to the first side of the first side surface and including a first side corresponding to the second side of the first side surface; and
a fourth extension surface extending from the second side of the second side surface parallel to the first side of the second side surface and including a first side corresponding to the second side of the second side surface.

22. The display panel of claim 21, wherein the third extension surface further comprises a second side parallel to the first side of the third extension surface and a third side connecting the first side and the second side of the first extension surface, and the fourth extension surface further comprises a second side parallel to the first side of the fourth extension surface and a third side connecting the first side and the second side of the fourth extension surface.

23. The display panel of claim 22, wherein the third side of the third extension surface faces the third side of the second extension surface, and the third side of the fourth extension surface faces the third side of the first extension surface.

24. The display panel of claim 23, wherein a length of the third side of the third extension surface is the same as the length of the third side of the second extension surface, and a length of the third side of the fourth extension surface is the same as the length of the third side of the first extension surface.

25. The display panel of claim 22, wherein a sum of a length of the first side of the second extension surface and a length of the first side of the third extension surface is the same as a length of the fourth side of the first flat surface.

26. The display panel of claim 22, wherein a sum of a length of the first side of the first extension surface and a length of the first side of the fourth extension surface is the same as a length of the third side of the first flat surface.

27. A display device comprising:
a display panel comprising a first flat surface, a first side surface extending from a first side of the first flat surface, a second side surface extending from a second side of the first flat surface, a first extension surface extending from a first side of the first side surface, and a second extension surface extending from a first side of the second side surface; and
a guide member disposed under the first flat surface, the first side surface, the second side surface, the first extension surface, and the second extension surface of the display panel,
wherein a first side of the first extension surface faces a third side of the first flat surface, and a first side of the second extension surface faces a fourth side of the first flat surface.

28. The display device of claim 27, further comprising a cover window disposed on the first flat surface, the first side surface, the second side surface, the first extension surface, and the second extension surface of the display panel.

29. The display device of claim 28, wherein the first extension surface comprises a second side parallel to the first side of the first extension surface and a third side connecting the first side and the second side of the first extension surface, and the third side of the first extension surface faces a second side of the second side surface parallel to the first side of the second side surface.

30. The display device of claim 29, wherein the cover window comprises a light blocking layer overlapping an area in which the third side of the first extension surface faces the first side of the second side surface.

31. The display device of claim 27, further comprising a touch sensing device disposed on the first flat surface, the first side surface, the second side surface, the first extension surface, and the second extension surface of the display panel.

32. A display panel comprising:
   a first flat surface;
   a first side surface extending from a first side of the first flat surface;
   a second side surface extending from a second side of the first flat surface;
   a third side surface extending from a third side of the first flat surface;
   a fourth side surface extending from a fourth side of the first flat surface; and
   a first corner surface extending from a first side of the third side surface,
   wherein a first side of the first corner surface faces a first corner defined in the first flat surface and disposed between the first side and the third side of the first flat surface, and
   wherein the first side surface is spaced apart from the third side surface with the first corner therebetween when the first side surface, third side surface and the first flat surface are coplanar.

33. The display panel of claim 32, wherein the first corner surface comprises a second side parallel to the first side of the first corner surface and a third side connecting the first side and the second side of the first corner surface, and the third side of the first corner surface faces a first side of the first side surface.

34. A method for manufacturing a display device, the method comprising:
   placing a first flat surface of a display panel on a first flat surface of a guide member;
   placing a first side surface of the display panel on a first side surface of the guide member by bending the first side surface of the display panel from a first side of the first flat surface of the display panel;
   placing a second side surface of the display panel on a second side surface of the guide member by bending the second side surface of the display panel from a second side of the first flat surface;
   placing a display circuit board under the first side surface of the display panel and the first side surface of the guide member by bending the display circuit board;
   placing a first extension part of the display panel on a third side surface of the guide member by bending the first extension part of the display panel from a first side of the first side surface; and
   placing a second extension part of the display panel on a fourth side surface of the guide member by bending the second extension part of the display panel from a first side of the second side surface.

* * * * *